United States Patent
Danjo

(10) Patent No.: US 8,669,895 B2
(45) Date of Patent: Mar. 11, 2014

(54) COMPARISON CIRCUIT AND ANALOG-TO-DIGITAL CONVERSION DEVICE

(75) Inventor: Takumi Danjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 121 days.

(21) Appl. No.: 13/364,307

(22) Filed: Feb. 1, 2012

(65) Prior Publication Data

US 2012/0127007 A1 May 24, 2012

Related U.S. Application Data

(62) Division of application No. 12/731,055, filed on Mar. 24, 2010, now Pat. No. 8,130,130.

(30) Foreign Application Priority Data

Mar. 25, 2009 (JP) .................................. 2009-074286
Jun. 24, 2009 (JP) .................................. 2009-149496

(51) Int. Cl.
*H03M 1/34* (2006.01)

(52) U.S. Cl.
USPC .......................................... 341/158; 341/155

(58) Field of Classification Search
USPC ........................... 341/158, 155, 118, 120, 164
See application file for complete search history.

(56) References Cited

U.S. PATENT DOCUMENTS

| | | | |
|---|---|---|---|
| 6,072,345 A | 6/2000 | Ooishi | |
| 6,191,977 B1 | 2/2001 | Lee | |
| RE37,593 E | 3/2002 | Etoh et al. | |
| 6,366,113 B1 | 4/2002 | Song | |
| 6,414,529 B1 | 7/2002 | Hirairi | |
| 6,944,078 B2 | 9/2005 | Takemura et al. | |
| 8,471,749 B2 * | 6/2013 | Kabir et al. ................... | 341/155 |
| 2006/0039218 A1 | 2/2006 | Takemura et al. | |
| 2007/0211547 A1 | 9/2007 | Takemura et al. | |
| 2008/0122820 A1 | 5/2008 | Umeda et al. | |

FOREIGN PATENT DOCUMENTS

| | | |
|---|---|---|
| JP | 2001-223754 A | 8/2001 |
| JP | 2002-111448 A | 4/2002 |
| JP | 2002-111451 A | 4/2002 |

OTHER PUBLICATIONS

Japanese Office Action mailed Jun. 11, 2013 for corresponding Japanese Application No. 2009-149496, with Partial English-language Translation.

Craninckx, Jan et al.,"A 65fJ/Conversion-Step 0-to-50MS/s 0-to-0.7mW 9b Charge-Sharing SAR ADC in 90nm Digital CMOS",IEEE International Solid-State Circuits Conference, Session 13/13.5, vol. XL Feb. 2007, 246-247 & 600.

Figueiredo, Pedro M. et al.,"A 90nm CMOS 1.2V 6b 1GS/s Two-Step Subranging ADC",IEEE International Solid-state Circuits Conference, Session 31/31.2 Feb. 2006.

USPTO, (JEANGLAUDE) Restriction Requirement, Apr. 19, 2011, in parent U.S. Appl. No. 12/731,055 [now allowed].

(Continued)

*Primary Examiner* — Joseph Lauture
(74) *Attorney, Agent, or Firm* — Fujitsu Patent Center

(57) ABSTRACT

Various embodiments of an analog-to-digital (A/D) device are described herein, with the A/D device using at least a comparison unit, a comparative operation control circuit, a delay circuit, and a successive operation control circuit arranged so as, it may, among other things, mitigate conversion errors that may be due to differences in properties of circuit elements therein. And the A/D device may be implemented in, among other things, a signal processing device.

10 Claims, 26 Drawing Sheets

(56) References Cited

OTHER PUBLICATIONS

USPTO, (JEANGLAUDE) Ex Parte Quayle Action, Jul. 29, 2011, in parent U.S. Appl. No. 12/731,055 [now allowed].

USPTO, (JEANGLAUDE) Notice of Allowance and Notice of Allowability, Nov. 3, 2011, in parent U.S. Appl. No. 12/731,055 [now allowed].

* cited by examiner

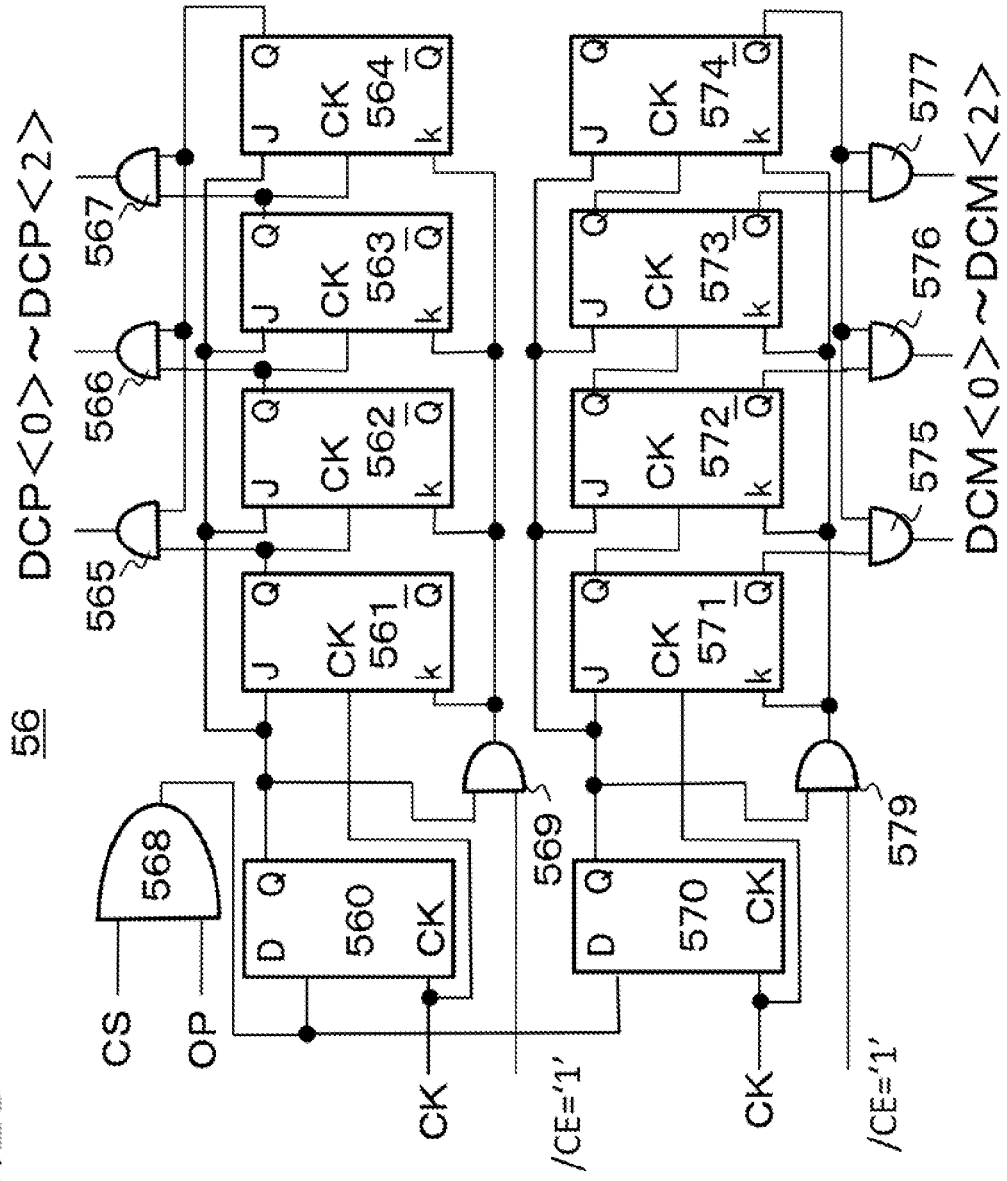

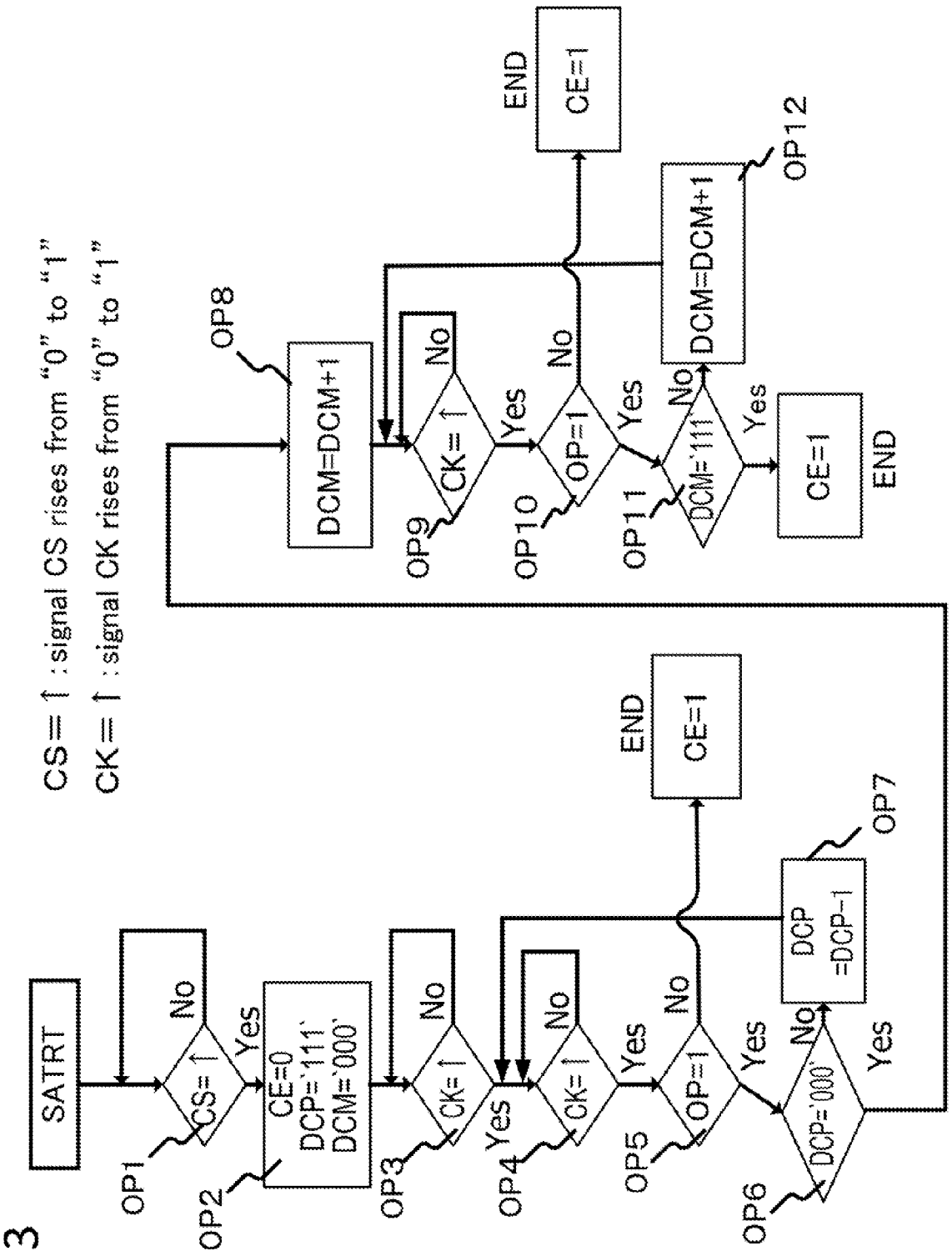

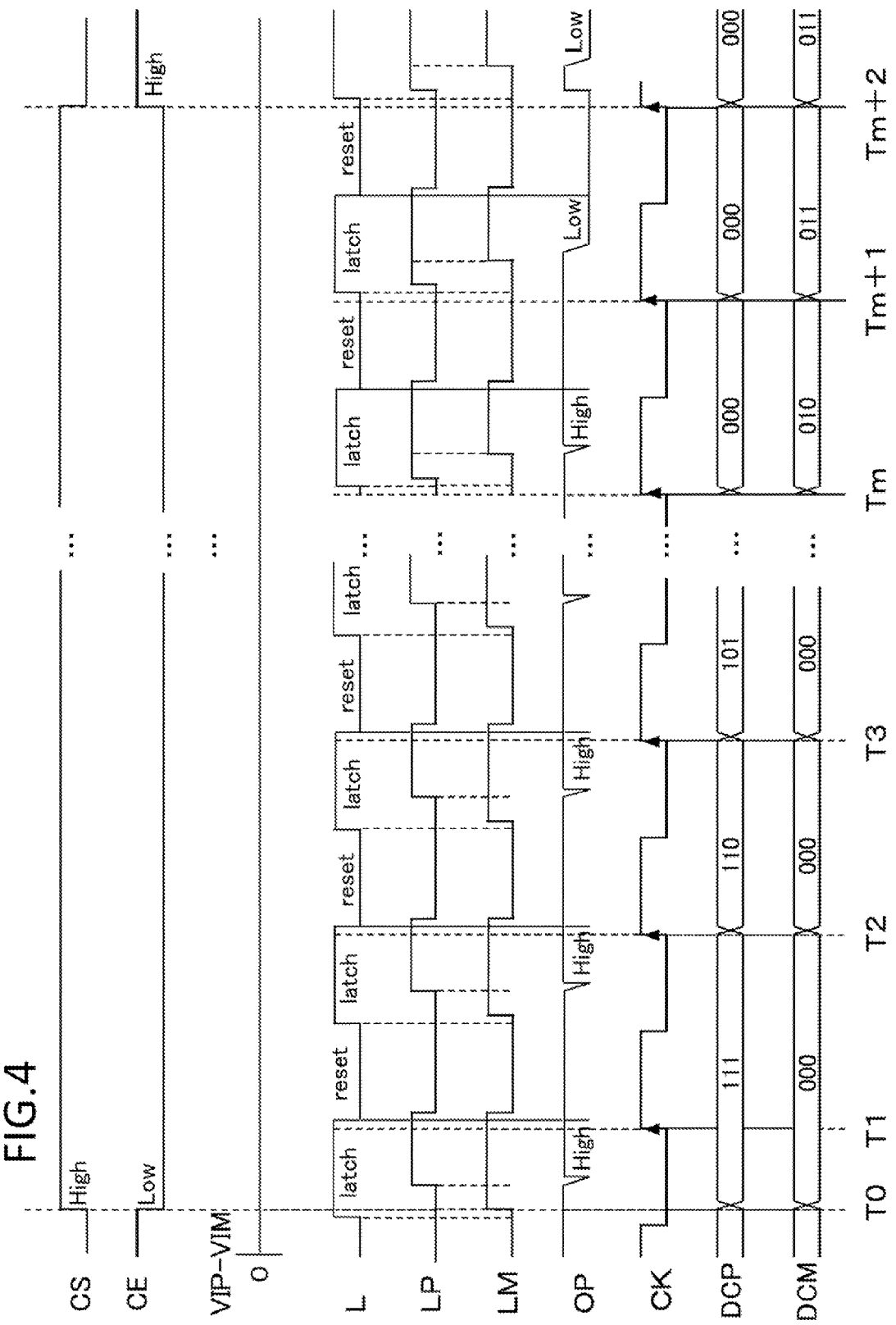

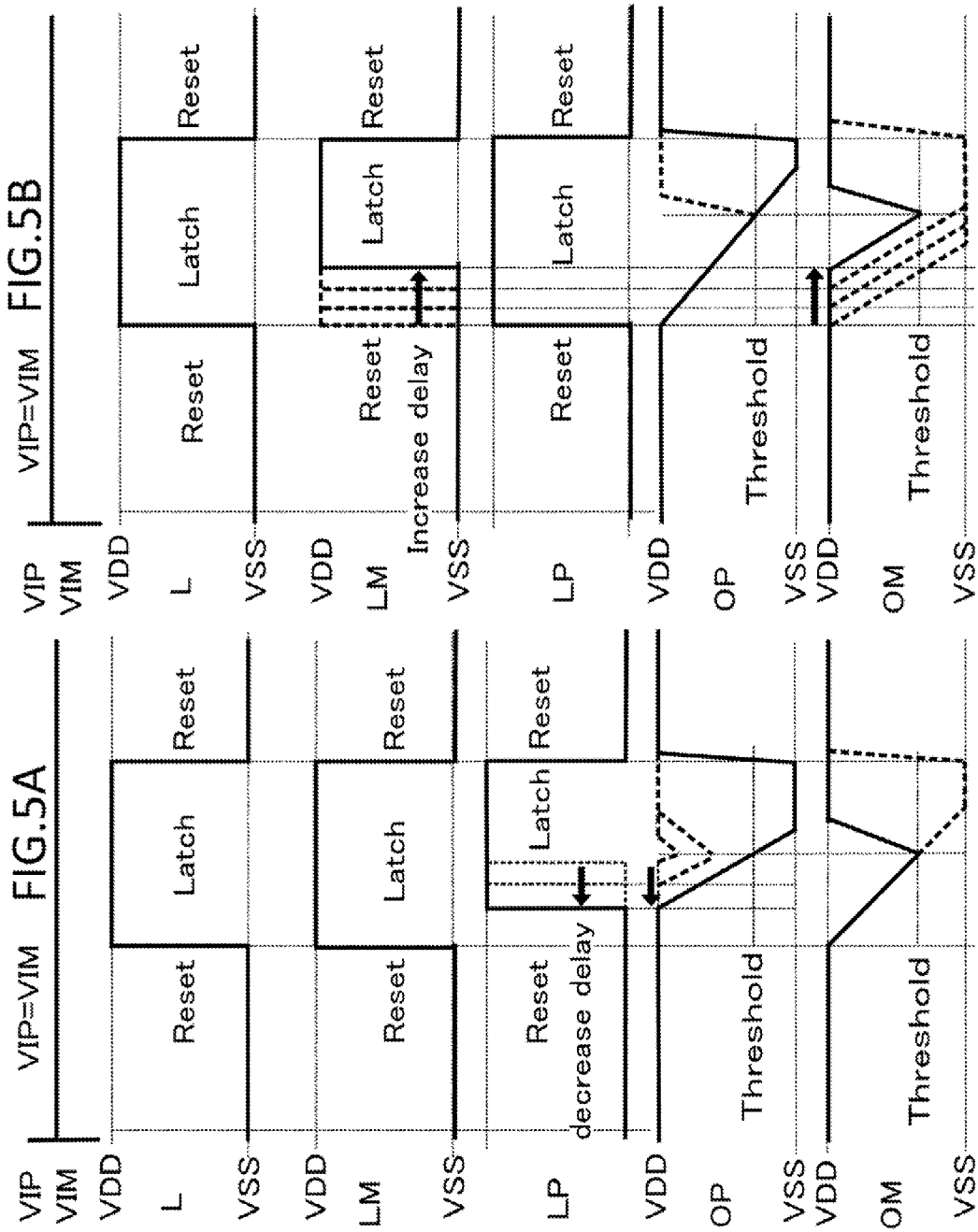

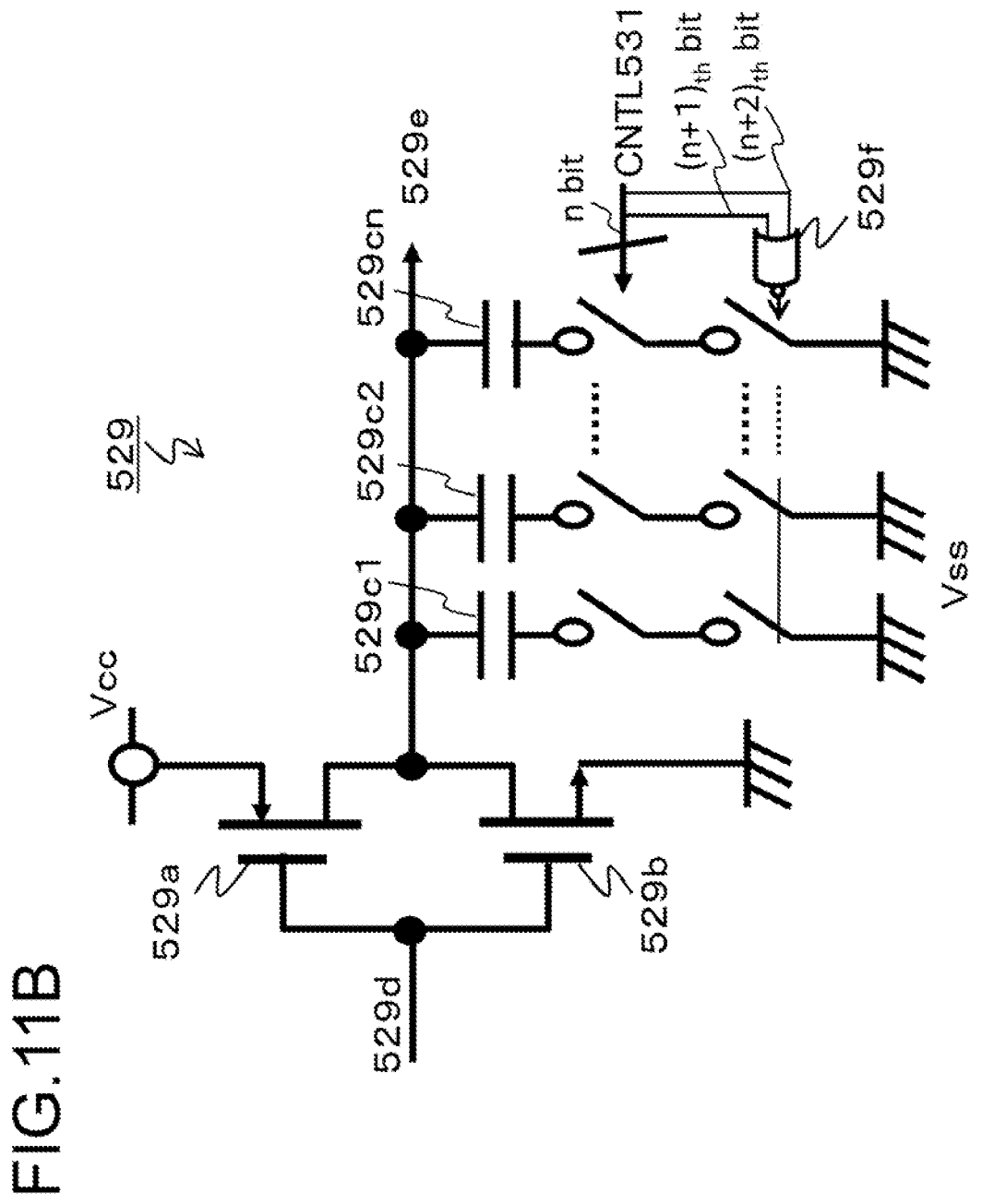

FIG. 16A

| CNTL-signal | td | ΔVi | Dout-signal |
|---|---|---|---|
| 11110 | 0.42 | | 1111 |
| 01110 | 0.4 | 0.8 | 0111 |
| 10110 | 0.38 | 0.7 | 1011 |
| 00110 | 0.36 | 0.6 | |
| 11010 | 0.34 | 0.5 | 0011 |
| 01010 | 0.32 | | |
| 10010 | 0.30 | 0.4 | 1101 |
| 00010 | 0.28 | | |
| 11100 | 0.26 | 0.3 | 0101 |
| 01100 | 0.24 | | |
| 10100 | 0.22 | 0.2 | 1001 |
| 00100 | 0.20 | | |
| 11000 | 0.18 | 0.1 | 0001 |
| 01000 | 0.16 | | |
| 10000 | 0.14 | | |
| 00000 | 0.12 | | |

| CNTL-signal | td | ΔVi | Dout-signal |
|---|---|---|---|
| 00001 | -0.12 | | 1110 |
| 10001 | -0.14 | | |
| 01001 | -0.16 | -0.1 | 0110 |
| 11001 | -0.18 | | |
| 00101 | -0.20 | -0.2 | 1010 |
| 10101 | -0.22 | | |
| 01101 | -0.24 | -0.3 | 0010 |
| 11101 | -0.26 | | |
| 00011 | -0.28 | | 1100 |
| 10011 | -0.30 | -0.4 | |
| 01011 | -0.32 | | 0100 |
| 11011 | -0.34 | -0.5 | |
| 00111 | -0.36 | -0.6 | 1000 |
| 10111 | -0.38 | -0.7 | |
| 01111 | -0.40 | | 0000 |
| 11111 | -0.42 | -0.8 | |

FIG. 16B

| ΔVi | td | CNTL-signal | Dout-signal |
|---|---|---|---|
| 0.8 | 0.38 | 10110 | 1111 |
| 0.7 | 0.36 | 00110 | 0111 |
| 0.6 | 0.34 | 11010 | 1011 |
| 0.5 | 0.30 | 10010 | 0011 |
| 0.4 | 0.26 | 11100 | 1101 |
| 0.3 | 0.22 | 01100 | 0101 |
| 0.2 | 0.18 | 00100 | 1001 |
| 0.1 | | | 0001 |

| ΔVi | td | CNTL-signal | Dout-signal |
|---|---|---|---|
| -0.1 | -0.20 | 00101 | 1110 |
| -0.2 | -0.24 | 01101 | 0110 |
| -0.3 | -0.26 | 11101 | 1010 |
| -0.4 | -0.30 | 10011 | 0010 |
| -0.5 | -0.34 | 11011 | 1100 |
| -0.6 | -0.36 | 00111 | 0100 |
| -0.7 | -0.38 | 10111 | 1000 |
| -0.8 | | | 0000 |

COMPARISON CIRCUIT AND ANALOG-TO-DIGITAL CONVERSION DEVICE

CROSS-REFERENCE TO RELATED APPLICATIONS

This application is based upon and claims the benefit of priority from the prior Japanese Patent Application NO. 2009-074286 filed on Mar. 25, 2009, and the prior Japanese Patent Application NO. 2009-149496 filed on Jun. 24, 2009, the entire contents of which are incorporated herein by reference.

FIELD

The embodiments discussed herein are related to a comparison circuit, an analog-to-digital conversion device using the comparison circuit thereof, and a signal processing device using the analog-to-digital conversion device thereof.

BACKGROUND

Voltage-comparative-type comparators frequently used for a control circuit and the like generally include two MOS transistors of which the gates receive one of differential input signals, two current routes of which the currents are controlled by the MOS transistors thereof according to the voltage of the differential input signal, and a latch unit configured to amplify and hold potential difference between the current routes.

Accordingly, in the event of executing comparison between the voltages of the differential input signals with the above comparator according to the difference of properties of the above MOS transistors, or the amplification and holding property of the latch unit, error occurs. As a result thereof, conversion error occurs in an analog-to-digital converter configured of this voltage-comparative-type comparator.

Related art is discussed in P. M. Figueiredo, P. Cardoso, A. Lopes, C. Fachada, N. Hamanishi, K. Tanabe, and J. Vital, "A 90 nm CMOS 1.2V 6 b 1 GS/s Two-Step Subranging ADC," *IEEE International Solid-State Circuits Conference*, Session 31/31.2, February 2006, and J. Craninckx and G. Van der Plas, "A 65 fJ/Conversion-Step 0-to-50 MS/s 0-to-0.7 mW 9 b Charge-Sharing SAR ADC in 90 nm Digital CMOS," *IEEE International Solid-State Circuits Conference*, Session 13/13.5, vol. XL, pp. 246-247, 600, February 2007.

SUMMARY

According to one aspect of the embodiments includes: an input circuit made up of a first transistor configured to receive a first signal at a gate electrode, and a second transistor configured to receive a second signal at a gate electrode; a first current route of which the current is controlled by the first transistor according to the voltage of the first signal; a second current route of which the current is controlled by the second transistor according to the voltage of the second signal; a latch circuit configured to amplify potential difference between a first node within the first current route and a second node within the second current route; a comparative operation control circuit including a first switch configured to execute supply of high potential or supply of ground potential to the drain of the first transistor, or supply of high potential or blocking of supply of ground potential to the drain, a second switch configured to execute supply of high potential or supply of ground potential to the drain of the second transistor, or supply of high potential or blocking of supply of ground potential to the drain, and a third switch configured to execute supply or blocking of supply of ground potential to the first current route and the second current route; and a comparative operation setting circuit configured to independently control the supply or blocking of supply of the first switch, the second switch, and the third switch.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIGS. 2A, 2B, 2C, and 2D are circuit diagrams illustrating a delay circuit and a logic circuit.

FIG. 3 illustrates a flowchart relating to the operation of the logic circuit for controlling the delay circuit.

FIG. 4 illustrates a timing chart for describing the operation of the lock circuit.

FIGS. 5A and 5B are diagrams representing change in the signal potentials of signals when delaying the leading-edge point-of-time of a signal.

FIGS. 11A and 11B illustrate examples of inverters of a delay circuit.

FIGS. 16A and 16B are tables for describing a method for deriving relationship between a binary numeral represented by a signal, and a binary numeral represented by a digital signal to be output by analog-to-digital conversion by the ADC in the case that there is no linearity with correlation as to difference between the potentials of signals.

DESCRIPTION OF EMBODIMENTS

The present invention encompasses modifications, obtained by adding design modifications to the embodiments described below, which one skilled in the art can conceive, and modifications obtained by executing recombination of components in the embodiments. Also, the present invention also encompasses modifications wherein the components are replaced with other components which yield the same operations, effects, or the like, and the present invention is not restricted to the following embodiments.

First Embodiment

Figure 1:
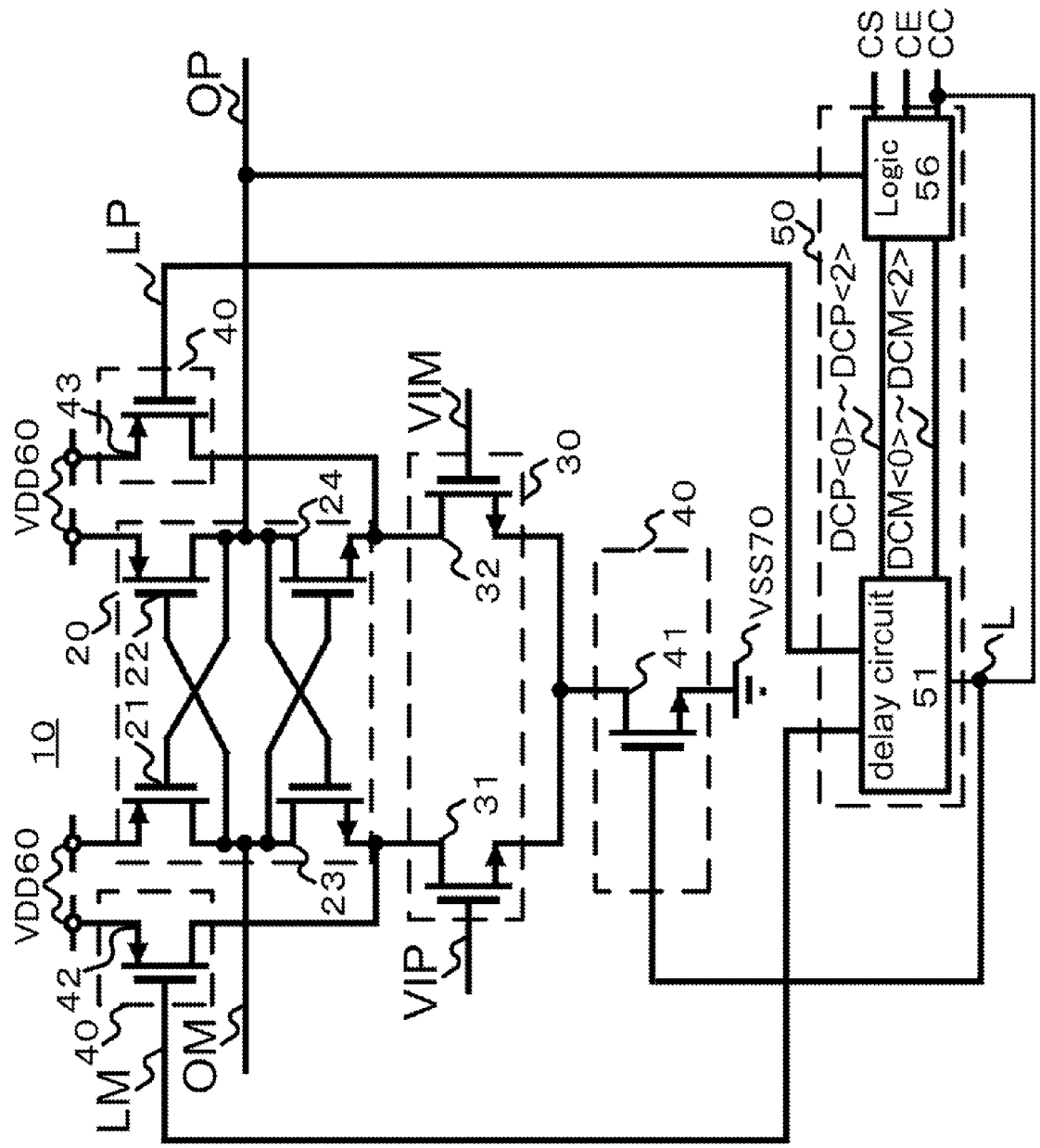
FIG. 1 is a circuit diagram illustrating a comparison circuit according to a first embodiment.

FIG. 1 is a circuit diagram illustrating a comparison circuit 10 according to the first embodiment. The comparison circuit 10 includes a latch unit 20, an input unit 30, a comparative operation control circuit 40, and a comparative operation setting circuit 50.

The comparative operation setting circuit 40 includes P-type MOS transistors 42 and 43, and an N-type MOS transistor 41.

The N-type MOS transistor 41 has a drain to be connected to the sources of N-type MOS transistors 31 and 32 of the input unit 30, a source to be connected to ground VSS 70, and a gate for receiving a signal L. The N-type MOS transistor 41 supplies the ground potential from the ground VSS 70 to the input unit 30 when the logic of the signal L is "H", and blocks supply of ground potential form the ground VSS 70 to the input unit 30 when the logic of the signal L is "L". The N-type MOS transistor 41 serves as a switch for connecting or blocking the input unit 30 and the ground VSS 70.

The P-type MOS transistor 42 has a source to be connected to a high-potential VDD power source 60, a drain to be connected to the source of an N-type MOS transistor 23 of the latch unit, and a gate for receiving a signal LM.

The P-type MOS transistor 42 blocks supply of high potential VDD from the high-potential VDD power source 60 to the latch unit 20 and the input unit 30 when the logic of the signal LM is "H", and supplies the high-potential VDD from the high-potential VDD power source 60 to the latch unit 20 and the input unit 30 when the logic of the signal LM is "L". The P-type MOS transistor 42 serves as a switch for connecting or blocking the latch unit 20 and the input unit 30, and the high-potential VDD power source 60.

The P-type MOS transistor 43 has a source to be connected to the high-potential VDD power source 60, a drain to be connected to the source of an N-type MOS transistor 24 of the latch unit, and a gate for receiving a signal LP.

The P-type MOS transistor 43 blocks supply of high potential VDD from the high-potential VDD power source 60 to the latch unit 20 and the input unit 30 when the logic of the signal LP is "H", and supplies the high-potential VDD from the high-potential VDD power source 60 to the latch unit 20 and the input unit 30 when the logic of the signal LM is "L". The P-type MOS transistor 43 serves as a switch for connecting or blocking the latch unit 20 and the input unit 30, and the high-potential VDD power source 60.

The input unit 30 includes N-type MOS transistors 31 and 32. The N-type MOS transistor 31 has a drain to be connected to the source of the N-type MOS transistor 23 of the latch unit, a source to be connected to the drain of the N-type MOS transistor 41 of the comparative operation control circuit 40, and a gate for receiving an input signal VIP. The on resistance value of the N-type MOS transistor 31 varies according to the potential of the input signal VIP. The N-type MOS transistor 32 has a drain to be connected to the source of an N-type MOS transistor 24 of the latch unit, a source to be connected to the drain of the N-type MOS transistor 41 of the comparative operation control circuit 40, and a gate for receiving a signal VIM. The on resistance value of the N-type MOS transistor 32 varies according to the potential of the signal VIM.

As a result thereof, signals obtained by inverting the logics of the input signals VIP and VIM occur on the drains of the N-type MOS transistors 31 and 32, respectively.

The latch unit 20 includes P-type MOS transistors 21 and 22, and the N-type MOS transistors 23 and 24.

The P-type MOS transistor 21 has a drain to be connected to the drain of the N-type MOS transistor 23, a gate to be connected to the drain of the P-type MOS transistor 22, and a source to be connected to the high-potential VDD power source 60.

The P-type MOS transistor 22 has a drain to be connected to the drain of the N-type MOS transistor 24, a gate to be connected to the drain of the P-type MOS transistor 23, and a source to be connected to the high-potential VDD power source 60.

The N-type MOS transistor 23 has a drain to be connected to the drain of the P-type MOS transistor 21, a gate to be connected to the drain of the N-type MOS transistor 24, and a source to be connected to the drain of the N-type MOS transistor 31 of the input unit 30. As a result thereof, a signal obtained by inverting the logic of the input signal VIP appears on the drain of the N-type MOS transistor 23.

The N-type MOS transistor 24 has a drain to be connected to the drain of the P-type MOS transistor 22, a gate to be connected to the drain of the N-type MOS transistor 23, and a source to be connected to the drain of the N-type MOS transistor 32 of the input unit 30. As a result thereof, a signal obtained by inverting the logic of the input signal VIM appears on the drain of the N-type MOS transistor 24.

Output signals OM and OP are output from the latch unit 20. The output signal OM is connected to a node A between the drain of the P-type MOS transistor 21 and the drain of the N-type MOS transistor 23. The output signal OP is connected to a node B between the drain of the P-type MOS transistor 22 and the drain of the N-type MOS transistor 24.

The gate of the P-type MOS transistor 21 and the drain of the P-type MOS transistor 22 of the latch unit 20 are connected to the node B, and the gate of the P-type MOS transistor 22 and the drain of the P-type MOS transistor 21 are connected to the node A. That is to say, the P-type MOS transistor 21 and the P-type MOS transistor 22 are connected crosswise to the nodes A and B, and accordingly, the P-type MOS transistor 21 and the P-type MOS transistor 22 amplify potential difference between the node A and node B.

The gate of the N-type MOS transistor 23 and the drain of the N-type MOS transistor 24 of the latch unit 20 are connected to the node B, and the gate of the N-type MOS transistor 24 and the drain of the N-type MOS transistor 23 are connected to the node A. That is to say, the N-type MOS transistor 23 and the N-type MOS transistor 24 are connected crosswise to the nodes A and B, and accordingly, the N-type MOS transistor 23 and the N-type MOS transistor 24 amplify potential difference between the node A and node B.

Thus, the P-type MOS transistor 21 and N-type MOS transistor 23 of the latch unit 20, and N-type MOS transistor 31 are connected serially between the high-potential VDD power source 60 and the drain of the N-type MOS transistor 41, and make up a first current route including the node A. The P-type MOS transistor 22 and N-type MOS transistor 24 of the latch unit 20, and N-type MOS transistor 32 are connected serially between the high-potential VDD power source 60 and the drain of the N-type MOS transistor 41, and make up a second current route including the node B.

Therefore, when the signals L, LM, and LP are "H", supply of the high-potential VDD to the latch unit 20 and the input unit 30 is blocked by the P-type MOS transistors 42 and 43, and ground potential is supplied to the input unit 30 by the N-type MOD transistor 41. In the above case, the potentials of the nodes A and B start to decrease from the high-potential VDD. The on resistance of the N-type MOS transistor 31 varies according to the potential of the input signal VIP, and the on resistance of the N-type MOS transistor 32 varies according to the potential of the input signal VIM, and accordingly, the current amount flowing to each current route varies. Thus, the rates of decrease at the nodes A and B vary. Of the potentials of the nodes A and B, one first reaching the threshold of the latch unit 20 becomes "L". If we say that the potential of the node A first reaches the threshold of the latch unit 20, the P-type MOS transistor 22 is turned on, and the potential of the node B increases, and the logic thereof becomes "H". Conversely, the P-type MOS transistor 21 is turned off, and the potential of the node A decreases, and the logic thereof becomes "L".

Note that, when the signals L, LM, and LP are "L", the high-potential VDD is supplied to the latch unit 20 and the input unit 30 by the P-type MOS transistors 42 and 43, and supply of the ground potential to the input unit 20 is blocked by the N-type MOS transistor 41.

As a result thereof, the potential difference between the nodes A and B is 0, or almost eliminated.

The comparative operation setting circuit 50 includes a delay circuit 51, and a logic circuit 56 for controlling the delay circuit 51.

FIGS. 2A, 2B, 2C, and 2D are circuit diagrams illustrating the delay circuit 51 and the logic circuit 56.

Figure 2A:
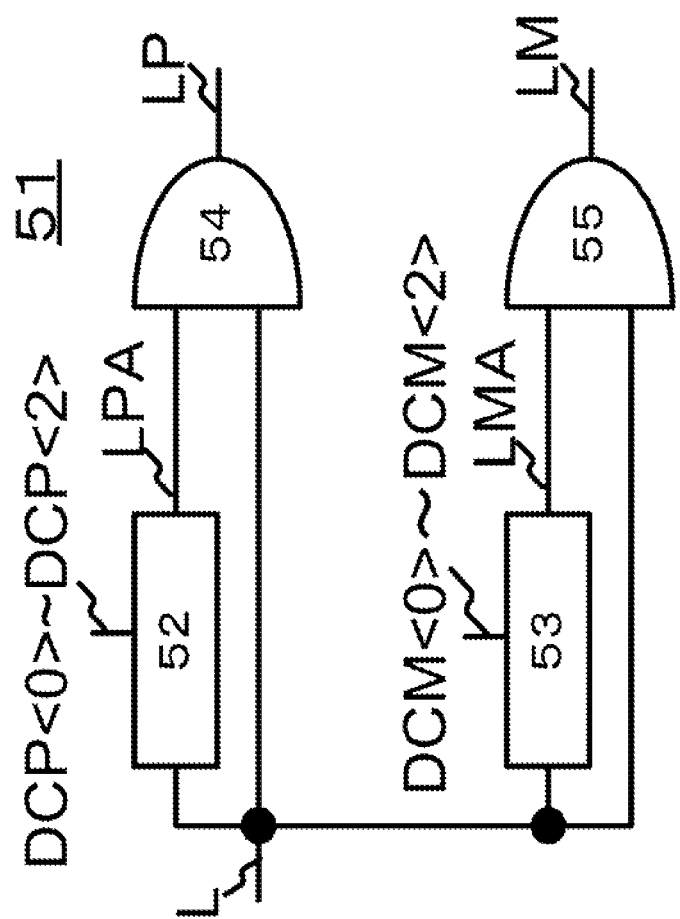

FIG. 2A is a circuit diagram illustrating the delay circuit 51. The delay circuit 51 includes a delay circuit 52, a delay circuit 53, and AND circuits 54 and 55.

The delay circuit 52 receives the signal L, and outputs a signal LPA illustrating change in potential wherein the delay corresponding to a binary numeral DCP represented by digital signals DCP<0> through DCP<2> is added to change in the potential of the signal L. Note that the binary numeral DCP represented by the digital signals DCP<0> through DCP<2> advances, such as shown later, from (111) to (000), and when changing from the digital signal DCM<0> to the digital signal DCM<2>, maintains (000).

The delay circuit 53 receives the signal L, and outputs a signal LMA illustrating change in potential wherein the delay corresponding to the binary numeral DCM represented by the digital signals DCM<0> through DCM<2> is added to change in the potential of the signal L. Note that the binary numeral DCM represented by the digital signals DCM<0> through DCM<2> advances, such as shown later, from (000) to (111), and when changing from the digital signal DCM<0> to the digital signal DCM<2>, maintains (111).

The AND circuit 54 outputs a signal LP having the logical AND between the logic of a signal LPA and the logic of the signal L. The AND circuit 55 outputs a signal LM having the logical AND between the logic of a signal LMA and the logic of the signal L. Accordingly, the signal LP is changed from the logic "L" to logic "H" generally at the same time as the signal LPA being changed from the logic "L" to logic "H". On the other hand, the signal LP is changed from the logic "H" to logic "L" generally at the same time as the signal L being changed from the logic "H" to logic "L". The signal LM is changed from the logic "L" to logic "H" generally at the same time as the signal LMA being changed from the logic "L" to logic "H". On the other hand, the signal LM is changed from the logic "H" to logic "L" generally at the same time as the signal L being changed from the logic "H" to logic "L".

Thus, upon a switch made up of the N-type MOS transistor 41 being turned on by the signal L, a switch made up of the P-type MOS transistor 42 is turned on with delay according to the binary numeral DCM represented by the digital signals DCM<0> through DCM<2>, a switch made up of the P-type MOS transistor 43 is turned on with delay according to the binary numeral DCP represented by the digital signals DCP<0> through DCP<2>.

Figure 2B:
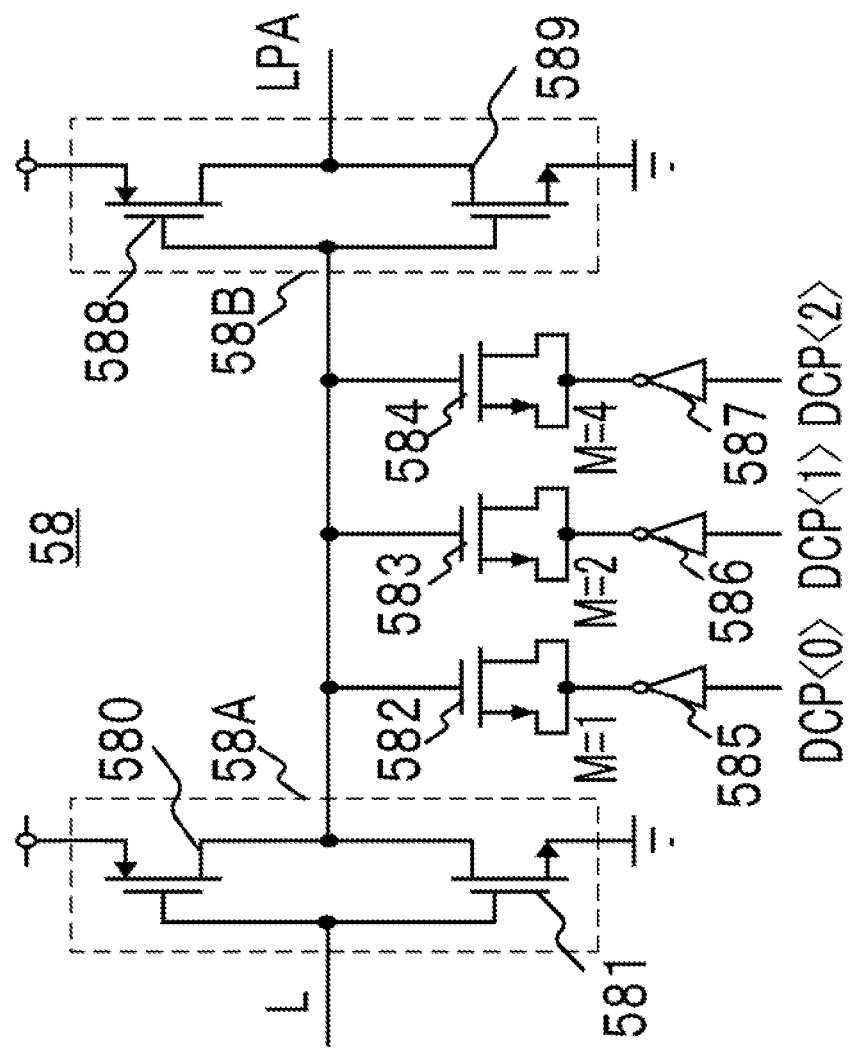

FIG. 2B is a circuit diagram illustrating a first example 58 of the delay circuits 52 and 53. The first example 58 of the delay circuits 52 and 53 includes a P-type MOS transistor 580 and an N-type MOS transistor 581 which make up an inverter 58A, a P-type MOS transistor 588 and an N-type MOS transistor 589 which make up an inverter 58B, inverters 585, 586, and 587, and capacitances 582, 583, and 584 made up of a gate electrode-insulating film-substrate electrode-type transistor, i.e., a so-called MOS-type transistor. The inverter 58A outputs a signal obtained by inverting the logic of the signal L to the inverter 58B. The inverter 58B receives the inverted signal of the signal L, and outputs the signal LPA having further inverted logic thereof (the signal LPA at the time of the first example 58 corresponding to the delay circuit 52, and the signal LMA when the first example corresponding to the delay circuit 53). The capacitances 582, 583, and 584 are connected to a signal line which connects the inverter 58A and the inverter 58B by the gate electrode. When the potential of the substrate electrode is high, and the threshold voltage of the MOS-type transistor is equal to or greater than the ground voltage, the capacitances 582, 583, and 584 have great capacitance according to the thickness of the insulating film, but when the potential of the substrate electrode is low, and the threshold voltage of the MOS-type transistor is less than the ground voltage, have small capacitance. In the event that the electrostatic capacitances of the capacitances 582, 583, and 584 are compared with those at the time of having the same threshold voltage, if we say that the capacitance 582 is 1, the capacitance 583 is the ratio of 2, and the capacitance 584 is the ratio of 4. The outputs of the inverters 585, 586, and 587 are connected to the substrate electrodes of the capacitances 582, 583, and 584, respectively. The inputs of the inverters 585, 586, and 587 are connected to the digital DCP<0> through DCP<2>, respectively (note that, when the first example 58 corresponds to the delay circuit 53, these are connected to the DCM<0> through DCM<2>). Accordingly, the signal from the inverter 58A to the inverter 58B is delayed according to the binary numeral represented by the digital signals DCP<0> through DCP<2>.

Figure 2C:
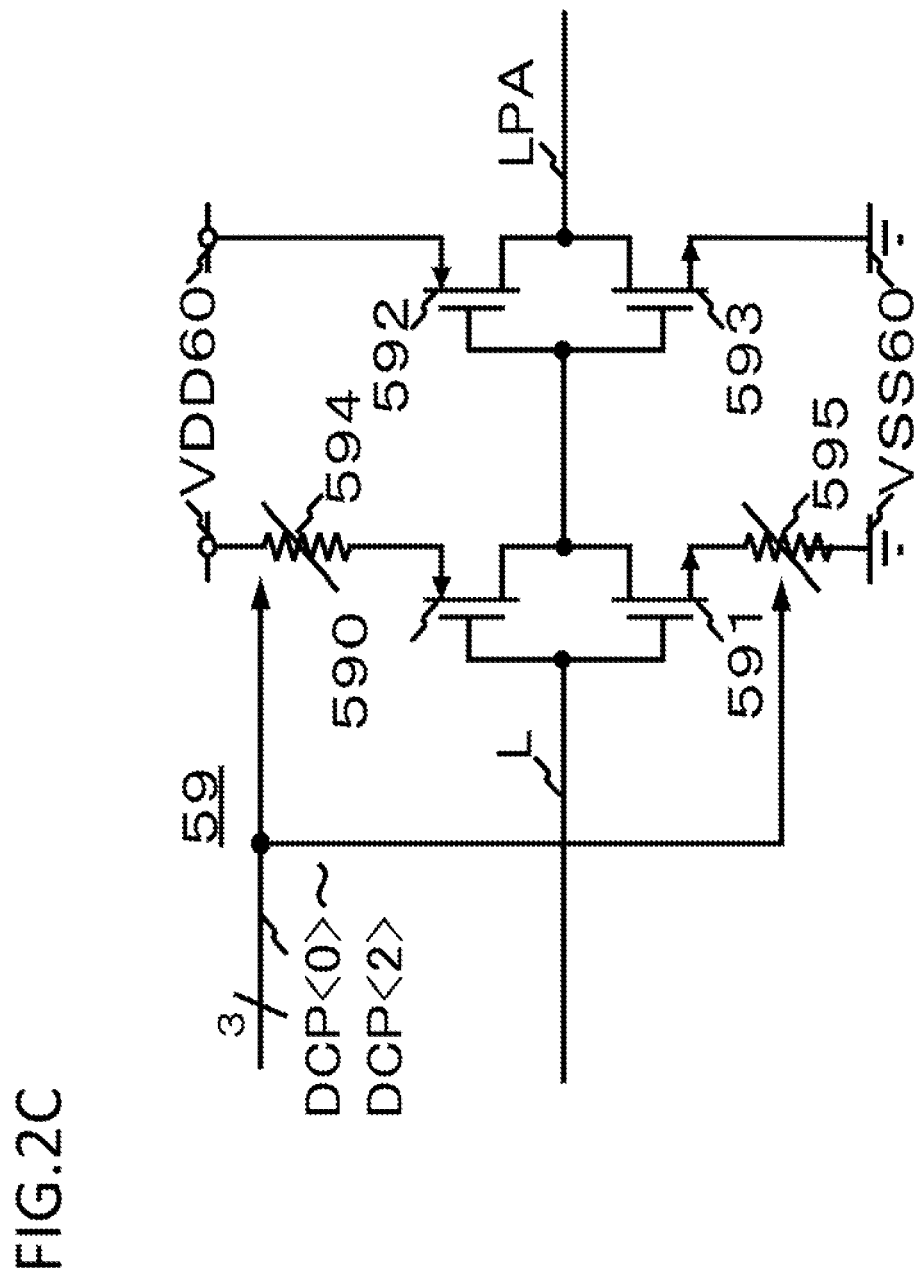

FIG. 2C is a circuit diagram illustrating a second example 59 of the delay circuits 52 and 53. The second example 59 of the delay circuits 52 and 53 includes a P-type MOS transistor 590 and an N-type MOS transistor 591 which make up an inverter 59A, a P-type MOS transistor 592 and an N-type MOS transistor 593 which make up an inverter 59B, a variable resistor 594 connected to the P-type MOS transistor 590 and the high-potential VDD power source 60 and serially connected to the P-type MOS transistor 590, and a variable resistor 595 connected to the N-type MOS transistor 591 and the ground power source and serially connected to the N-type MOS transistor 591. The inverter 59A receives the signal L, and outputs an inverted signal thereof to the inverter 59B. The inverter 59B further inverts the signal from the inverter 59A to take this as the signal LPA (the signal LMA when the second example 59 represents the delay circuit 53). With the variable resistors 594 and 595, the resistance varies according to the binary numeral DCP represented by the digital signals DCP<0> through DCP<2>, and become the maximum resistance when the binary numeral DCP is (111) (when the second example 59 represents the delay circuit 53, the resistance varies according to the binary numeral DCM represented by the digital signals DCM<0> through DCM<2>). Accordingly, the potential supplied to the inverter 59A increases or decreases according to the variable resistors 594 and 595, and accordingly, the signal to be output from the inverter 59A is output with delay according the potential thereof from the input signal.

FIG. 2D is a circuit diagram illustrating a specific example of the logic circuit 56 for controlling the delay circuit 51. The logic circuit 56 includes a DFF 560, DFF 570, JKFF 561, JKFF 562, JKFF 563, JKFF 564, JKFF 571, JKFF 572, JKFF 573, JKFF 574, AND 565, 566, 567, 568, 569, 575, 576, 577, and 579.

Note that JKFF means a JK flip-flop. Specifically, when J="H" and K="H", signals to be output from terminals Q and /Q are logically inverted each time clock enters a clock terminal CK. Also, when J="L" and K="L", the logics of the signals to be output from the terminals Q and /Q are unchanged. Further, when J="L" and K="H", the terminal Q outputs "H", and the terminal /Q outputs "L", and when J="H" and K="L", the terminal Q outputs "L", and the terminal /Q outputs "H". Note that according to the definitions of the terminals /Q and Q, the logics of the output signals of the terminals Q and /Q when J="L" and K="H", and the logics of the output signals of the terminals Q and /Q when J="H" and K="L" counterchange. In this case, let us say that the signals DCP<0> through DCP<2>, and DCM<0> through DCM<2> counterchange.

The logic circuit 56 receives signals CS, CD, CK, and OP, and outputs the signals DCP<0> through DCP<2>, and DCM<0> through DCM<2>.

The AND 568 receives input of the signals CS and OP, and outputs a signal having a logic obtained by logical AND of both signals to terminals D of the DFF 560 and 570. Accordingly, when the signal CS rises from logic "L" to logic "H", the signal OP has originally logic "H", the AND 568 outputs the signal of logic "H". Subsequently, when the signal OP becomes logic "L", the AND 568 outputs the signal of logic "L".

The DFF 560 receives a clock signal CK from the terminal CK, latches the logic of the input signal from the terminal D at the leading edge of the clock signal CK, and outputs the latched signal from the terminal Q.

The AND 569 receives the signal from the terminal Q of the DFF 560, and the signal /CE, and outputs a signal having a logic obtained by logical AND of both signals to the JKFF 561, JKFF 562, JKFF 563, and JKFF 564. Here, the signal /CE is a signal having the inverted logic of the signal CE. Accordingly, when the signal from the terminal Q of the DFF 560 is logic "H", the output signal of the AND 569 has the same logic as the logic of the signal /CE. On the other hand, when the signal from the terminal Q of the DFF 560 is logic "L", the signal of logic "L" is output to terminals k of the JKFF 561, JKFF 562, JKFF 563, and JKFF 564.

The JKFF 561 receives the latched signal from the terminal Q of the DFF 560 by a terminal J, receives the output of the AND 569 by the terminal k, and receives the clock signal CK by the terminal CK. The JKFF 562 receives the latched signal from the terminal Q of the DFF 560 by the terminal J, receives the output of the AND 569 by the terminal k, and receives the output signal from the terminal Q of the JKFF 561 by the terminal CK. The JKFF 563 receives the latched signal from the terminal Q of the DFF 560 by the terminal J, receives the output of the AND 569 by the terminal k, and receives the output signal from the terminal Q of the JKFF 562 by the terminal CK. The JKFF 564 receives the latched signal from the terminal Q of the DFF 560 by the terminal J, receives the output of the AND 569 by the terminal k, and receives the output signal from the terminal Q of the JKFF 563 by the terminal CK. The AND 565 receives the signal from the terminal Q of the JKFF 561, and the signal from the terminal Q of the JKFF 564, and output a signal obtained by logical AND thereof as the digital signal DCP<0>. The AND 566 receives the signal from the terminal Q of the JKFF 562, and the signal from the terminal Q of the JKFF 564, and output a signal obtained by logical AND thereof as the digital signal DCP<1>. The AND 567 receives the signal from the terminal Q of the JKFF 563, and the signal from the terminal Q of the JKFF 564, and output a signal obtained by logical AND thereof as the digital signal DCP<2>.

The DFF 570 receives the clock signal CK from the terminal CK, latches the logic of the input signal from the terminal D at the leading edge of the clock signal CK, and outputs the latched signal from the terminal Q.

The AND 579 receives the signal from the terminal Q of the DFF 570, and the signal /CE, and outputs a signal having a logic obtained by logical AND of both signals to the JKFF 571, JKFF 572, JKFF 573, and JKFF 574. Accordingly, when the signal from the terminal Q of the DFF 570 is logic "H", the output signal of the AND 579 has the same logic value as the logic of the signal /CE. On the other hand, when the signal from the terminal Q of the DFF 570 is logic "H", the signal of logic "L" is output to the terminals k of the JKFF 571, JKFF 572, JKFF 573, and JKFF 574.

The JKFF 571 receives the latched signal from the terminal Q of the DFF 570 by the terminal J, receives the output of the AND 579 by the terminal k, and receives the clock signal CK by the terminal CK. The JKFF 572 receives the latched signal from the terminal Q of the DFF 570 by the terminal J, receives the output of the AND 579 by the terminal k, and receives the output signal from the terminal Q of the JKFF 571 by the terminal CK. The JKFF 573 receives the latched signal from the terminal Q of the DFF 570 by the terminal J, receives the output of the AND 579 by the terminal k, and receives the output signal from the terminal Q of the JKFF 572 by the terminal CK. The JKFF 574 receives the latched signal from the terminal Q of the DFF 570 by the terminal J, receives the output of the AND 579 by the terminal k, and receives the output signal from the terminal Q of the JKFF 573 by the terminal CK. The AND 575 receives the signal from the terminal Q of the JKFF 571, and the signal from the terminal Q of the JKFF 574, and outputs a signal obtained by logical AND thereof as the digital signal DCM<0>. The AND 576 receives the signal from the terminal Q of the JKFF 572, and the signal from the terminal Q of the JKFF 574, and outputs a signal obtained by logical AND thereof as the digital signal DCM<1>. The AND 577 receives the signal from the terminal Q of the JKFF 573, and the signal from the terminal Q of the JKFF 574, and outputs a signal obtained by logical AND thereof as the digital signal DCM<2>.

Thus, when the signal CS and the signal OP are logic "H", the AND 568 outputs the signal of logic "H" to the terminal D of the DFF 560. When receiving logic "H" at the terminal D, upon the clock signal CK being input, the DFF 560 outputs the signal of logic "H" by the terminal Q. As a result thereof, the combination of digital signals to be output from the terminal Q of each of the JKFF 561, 562, and 563 is counted down from (1, 1, 1) to (0, 0, 0). While the combination of the above digital signals is counted down from (1, 1, 1) to (0, 0, 0), the signal of logic "H" is output from the terminal Q of the JKFF 564, and accordingly, the signal logic of "H" is input to one of the inputs of the AND 565, 566, and 567, and accordingly, the combination from the digital signals DCP<0> through DCP<2> is counted from (1, 1, 1) to (0, 0, 0). Upon the countdown ending and reaching (0, 0, 0), the signal of logic "L" is output from the terminal Q of the JKFF 564, and accordingly, regardless of the logic of the signal output from the terminal Q of each of the JKFF 561, 562, and 563, the combination from the digital signals DCP<0> to DCP<2> is also held in (0, 0, 0).

Note that during the above countdown upon the logic of the signal OP becoming logic "L", the logic of the signal from the terminal Q of the DFF 570 becomes logic "L", and accordingly, the countdown of the combination from the digital signals DCP<0> to DCP<2> is ended, and the values thereof are maintained.

On the other hand, the combination of the digital signals output from the terminal of each of the JKFF 571, 572, and 573 is counted up from (0, 0, 0) to (1, 1, 1). However, while the combination from the digital signals DCP<0> to DCP<2> is counted down from (1, 1, 1) toward (0, 0, 0), the signal of logic "L" is output from the terminal Q of the JKFF 574, and accordingly, the signal logic "L" is input to one of the inputs of the AND 575, 576, and 577, the combination from the digital signals DCP<0> to DCP<2> is held in (0, 0, 0). However, upon the countdown ending, and the combination from the digital signals DCP<0> to DCP<2> reaching (0, 0, 0), the signal of logic "H" is output from the terminal Q of the JKFF 574, and accordingly, the combination from the digital signals DCM<0> to DCM<2> is also counted from (0, 0, 0) toward (1, 1, 1) according to the logic of the signal to be output from the terminal Q of each of the JKFF 571, 572, and 573.

Note that during the above count-up upon the logic of the signal OP becoming logic "L", the logic of the terminal Q of the DFF 570 becomes logic "L", and accordingly, the count-up of the combination from the digital signals DCM<0> to DCM<2> ends, and the values thereof are maintained.

FIG. 3 illustrates a flowchart relating to the operation of the logic circuit 56 for controlling the delay circuit 51. A specific example of the logic circuit 56 is illustrated in FIG. 2D, but it goes without saying that as long as a circuit which operates in accordance with the flowchart in FIG. 3, this circuit may be configured in any wise.

With operation OP1, determination is made whether or not the logic of the signal CS rises to "1" (logic "H"). When the logic of the signal CS rises to "1", the logic circuit 56 starts its operation, and accordingly, executes the next operation OP2. When the logic of the signal CS is "0" (logic "L"), the logic circuit 56 maintains an idle state.

With operation OP2, upon the logic of the signal CE being set to "0", i.e., the logic of the signal /CE being set to "1", so that the binary numeral DCP represented by the digital signals DCP<0> to DCP<2> becoming (111), the logic circuit 56 outputs these digital signals. Also, so that the binary numeral DCM represented by the digital signals DCM<0> to DCM<2> becoming (000), the logic circuit 56 outputs these digital signals.

With operation OP3, after the logic of the signal CS rises to "1", determination is made whether or not the logic of the clock signal CK rises to "1". In the case that the logic of the clock signal CK is "1", the logic circuit 56 maintains its state.

With operation OP4, the logic circuit 56 determines whether or not the clock signal CK rises from "0" to "1". In the case that the clock signal CK does not rise from "0" to "1", the logic circuit 56 maintains its state. In the case that the clock signal CK rises from "0" to "1", the logic circuit 56 proceeds to the next operation OP5.

With operation OP5, the logic circuit 56 determines whether or not the logic of the signal OP is "1". In the case that the logic of the signal OP is "0", the logic circuit 56 externally outputs a signal indicating that the logic of the signal OP is "0", and receives the signal CE of which the logic is "1". In the case that the logic of the signal OP is "1", the logic circuit 56 proceeds to the next operation OP6.

With operation OP6, the logic circuit 56 determines whether or not the binary numeral DCP represented by the digital signals DCP<0> to DCP<2> is (000). When the binary numeral DCP represented by the digital signals DCP<0> to DCP<2> is (000), the logic circuit 56 proceeds to the next operation OP8. When the binary numeral DCP represented by the digital signals DCP<0> to DCP<2> is not (000), the logic circuit 56 proceeds to the next operation OP7.

With operation OP7, the logic circuit 56 executes operation wherein 1 is subtracted from the binary numeral DCP represented by the digital signals DCP<0> to DCP<2>. That is to say, the logic circuit 56 executes the countdown operation of the binary numeral represented by the digital signals DCP<0> to DCP<2>. Subsequently, the logic circuit 56 proceeds to operation OP4.

With operation OP8, the logic circuit 56 adds 1 to the binary numeral DCM represented by the digital signals DCM<0> to DCM<2>, i.e., counts up this binary numeral.

With operation OP9, the logic circuit 56 determines whether or not the clock signal CK rises from "0" to "1". In the case that the clock signal CK does not rise from "0" to "1", the logic circuit 56 maintains its state. In the case that the clock signal CK rises from "0" to "1", the logic circuit 56 proceeds to the next operation OP10.

With operation OP10, the logic circuit 56 determines whether or not the logic of the signal OP is "1". In the case that the logic of the signal OP is "0", the logic circuit 56 externally outputs a signal indicating that the logic of the signal OP is "0", and receives the signal CE of which the logic is "1". In the case that the logic of the signal OP is "1", the logic circuit 56 proceeds to the next operation OP11.

With operation OP11, the logic circuit 56 determines whether or not the binary numeral DCM represented by the digital signals DCM<0> to DCM<2> is (111). In the case that the binary numeral DCM is (111), the logic circuit 56 externally outputs a signal indicating that the logic of the signal OP is "0", and receives the signal CE of which the logic is "1". In the case that the binary DCM is not (111), the logic circuit 56 proceeds to operation OP12.

With operation OP12, the logic circuit 56 adds 1 to the binary numeral DCM represented by the digital signals DCM<0> to DCM<2>, i.e., counts up this binary numeral.

FIG. 4 illustrates a timing chart for describing the operation of the logic circuit 56.

The logic of the signal CS changes from logic "L" to logic "H" at point-in-time T0, and maintains logic "H" even at point-in-time Tm+2.

The signal CE changes from logic "H" to logic "L" at point-in-time T0, and changes from logic "L" to logic "H" at point-in-time Tm+2.

(VIP−VIM) indicates the voltage difference between the signals VIP and VIM, (VIP−VIM) is 0 while the logic of the signal CS is "L".

The clock signal CK is a signal which repeats the periods of logic "H" and logic "L", and the periods of logic "H" and logic "L" have generally the same length.

The signal L is synchronized with the reversed phase of the clock signal CK, and also the periods of logic "H" and logic "L" are generally the same as with the clock signal CK.

The binary numeral DCP is made up of the logic combination of the digital signals DCP<0> through DCP<2>, and is (111) at point-in-time T0, and is counted down toward (000) from point-in-time T1.

The binary numeral DCM is made up of the logic combination of the digital signals DCM<0> through DCM<2>, and is (000) at point-in-time T0, and is counted up toward (111) when the binary numeral DCM reaches (000).

The signal LP is a signal synchronized with the signal L, wherein the leading-edge point-in-time from logic "L" to logic "H" is delayed according to the binary numeral DCP as compared to the signal L. The degree of delay thereof is the maximum when the binary numeral DCP is (111), and is the minimum when the binary numeral DCP is (000).

The signal LM is a signal synchronized with the signal L, wherein the leading-edge point-in-time from logic "L" to logic "H" is delayed according to the binary numeral DCM as compared to the signal L. The degree of delay thereof is the maximum when the binary numeral DCM is (000), and is the minimum when the binary numeral DCM is (111).

The signal OP is a signal indicating the comparison result of the potential of the signal VIP and the potential of the signal VIM when both of the signals LP and LM are logic "H". At point-in-time Tm+2, the logic of the signal OP is logic "L". As a result thereof, the count-up of the binary numeral DCM ends, and the values thereof are maintained.

FIGS. 5A and 5B are diagrams representing change in the signal potentials of the signals OP and OM when the leading-edge point-in-time of the signal LP or signal LM is delayed.

FIG. 5A is a diagram representing change in the signal potentials of the signals OP and OM when the leading-edge period of the signal LM is fixed, and the leading-edge delay amount of the signal LP decreases. (VIP−VIM) indicates the voltage difference between the signals VIP and VIM, and (VIP−VIM) is 0. The signal L is synchronized with the reversed phase of the clock signal CK, and also the period of logic "H", and the period of logic "L" are generally the same as with the clock signal CK.

The logic leading-edge delay amount of the signal LP varies according to the magnitude of the binary numeral DCP made up of the digital signals DCP<0> through DCP<2> as to the logic leading edge of the signal L. The signal OP is the output signal to be output from the latch unit 20 of the comparison circuit 10.

Now, let us say that the logic leading edge of the signal LP is delayed such as the waveform of the signal LP shown by a dotted line, and the signals L and LM simultaneously logically rise.

In this case, the potential of the node A deteriorates toward a potential lower than the potential of the high-potential VDD power source 60 by an amount corresponding to the multiplying of the potential of the high-potential VDD power source 60 by the result obtained by dividing the on resistance of the P-type MOS transistor 21 by the resistance of the whole first current route, but the deterioration of the potential of the node B to be connected to the signal OP is little such as the signal OP shown by a dotted line. This is because high-potential VDD is applied to the node B by the P-type MOS transistor 22 until the logic of the signal LP rises.

Accordingly, with the comparison circuit 10, the potential of the node A is lower than the potential of the node B. As a result thereof, upon the logic of the signal LP rising, the potential difference between the nodes A and B is expanded by the operation of the latch unit 20, and the potential of the signal OM becomes equal to or smaller than a predetermined threshold from the potential VDD of the high-potential VDD power source 60. As a result thereof, the logic of the signal OM is determined to be "L", and the logic of the signal OP is determined to be "H".

Next, upon the binary numeral DCP represented by the digital signals DCP<0> through DCP<2> being counted down such as the waveform of the signal LP shown by a solid line, the delay amount of the logic leading edge of the signal LP decreases.

Thus, the logic of the signal LP rises at a stage wherein the deterioration of the potential of the node A is small.

Now, VIP is equal to VIM, and accordingly, if we say that the properties of the on resistances of the N-type MOS transistors 31 and 32 of the input unit 30 are equal as to gate voltage, the similar properties of the P-type MOS transistors 21 and 22 of the latch unit 20 are equal, and further the similar properties of the N-type MOS transistors 23 and 24 of the latch unit 20 are equal, the potential difference between the nodes A and B is amplified as is due to the deterioration of the potential of the node A.

However, in any of a case where the properties as to the gate voltage are arranged so that the on resistance of the N-type MOS transistor 31 of the input unit 30 is higher than the on resistance of the N-type MOS transistor 32, a case where the properties are arranged so that the on resistance of the P-type MOS transistor 21 of the latch unit 20 is lower than the on resistance of the P-type MOS transistor 22, further a case where the properties are arranged so that the on resistance of the N-type MOS transistor 23 of the latch unit 20 is higher than the on resistance of the N-type MOS transistor 24, upon the logic of the signal LP rising, even if the potential of the node A deteriorates, the potentials of the nodes A and B may be inverted. In this case, upon the potential of the node B to be connected to the signal OP first deteriorating less than a threshold such as the signal OP shown by a solid line, the signal OP is determined to be logic "L", and the logic of the signal OM is determined to be "H".

However, the delay amount of the logic leading edge of the signal LP is kept great, whereby the potential of the node A, and the potential of the node B can be prevented from being inverted. In this case, the logic of the signal OM is determined to be "L", and the logic of the signal OP is determined to be "H".

FIG. 5B is a diagram representing change in the signal potentials of the signals OP and OM when the leading-edge period of the signal LP is fixed, and the leading-edge delay amount of the signal LM increases. (VIP−VIM) indicates the voltage difference between the signals VIP and VIM, and (VIP−VIM) is 0. The signal L is synchronized with the reversed phase of the clock signal CK, and also the period of logic "H", and the period of logic "L" are generally the same as with the clock signal CK.

The logic leading-edge delay amount of the signal LM varies according to the magnitude of the binary numeral DCM made up of the digital signals DCM<0> through DCM<2> as to the logic leading edge of the signal L. The signal OM is the output signal to be output from the latch unit 20 of the comparison circuit 10.

First, let us say that that the logic leading edge of the signal LM is not delayed so much such as the waveform of the signal LM shown by a dotted line, and the signals L and LP simultaneously logically rise.

In this case, the potential of the node B deteriorates toward a potential lower than the potential of the high-potential VDD power source 60 by an amount corresponding to multiplying of the potential of the high-potential VDD power source 60 by the result obtained by dividing the on resistance of the P-type MOS transistor 22 by the resistance of the whole second current route, and the deterioration of the potential of the node A to be connected to the signal OM occurs such as the signal OM shown by a dotted line.

Now, VIP is equal to VIM, and accordingly, if we say that the properties of the on resistances of the N-type MOS transistors 31 and 32 of the input unit 30 are equal as to gate voltage, the similar properties of the P-type MOS transistors 21 and 22 of the latch unit 20 are equal, and further the similar properties of the N-type MOS transistors 23 and 24 of the latch unit 20 are equal, the potential difference between the nodes A and B is amplified as is due to the deterioration of the potential of the node B.

However, in any case of a case where the properties as to the gate voltage are arranged so that the on resistance of the N-type MOS transistor 31 of the input unit 30 is lower than the on resistance of the N-type MOS transistor 32, a case where the properties are arranged so that the on resistance of the P-type MOS transistor 21 of the latch unit 20 is higher than the on resistance of the P-type MOS transistor 22, and further a case where the properties are arranged so that the on resistance of the N-type MOS transistor 23 of the latch unit 20 is lower than the on resistance of the N-type MOS transistor 24, upon the logic of the signal LM rising, even if the potential of the node B deteriorates, the potentials of the nodes A and B may be inverted such as the signal OM indicated with a dotted line. In this case, the signal OP is determined to be logic "L" such as the signal OM shown by a dotted line, and the logic of the signal OM is determined to be "H" such as the signal OP shown by a dotted line.

However, upon the logic leading-edge delay amount of the signal LM increasing such as the signal LM shown by a solid line, the deterioration of the potential of the node B to be connected to the signal OP shown by a solid line becomes great, whereby the potential of the node A, and the potential of the node B is prevented from being inverted. As a result thereof, according to the latch unit 30, the logic of the signal OM becomes logic "H", and the logic of the signal OP becomes logic "L".

Thus, in any case of a case where the properties as to the gate voltage between the on resistance of the N-type MOS transistor 31 of the input unit 30 and the on resistance of the N-type MOS transistor 32 differ, a case where the similar properties of the on resistance of the P-type MOS transistor 21 of the latch unit 20, and the on resistance of the P-type MOS transistor 22 differ, and further a case where the similar properties of the on resistance of the N-type MOS transistor 23 of the latch unit 20, and the on resistance of the N-type MOS transistor 24 differ, the logic leading-edge delay amount of the signal LM or signal LP is adjusted, whereby the comparison circuit 10 can be caused to execute the same operation as in the case that the on resistance properties of each MOS resistor, and the transistor corresponding thereto are matched. As a result thereof, with the comparison circuit 10, in the event of executing comparison between the voltage of the signal VIP and the voltage of the signal VIM, error can be prevented from occurring due to the difference of the properties of the MOS transistors making up the comparison circuit 10, or the amplification and held properties of the latch unit 20.

Thus, the comparison circuit 10 according to the first embodiment is a comparison circuit including an input unit 30 made up of a first MOS transistor (N-type MOS transistor 31) configured to receive a first signal at the gate electrode, and a second MOS transistor configured to receive a second signal at the gate; a latch circuit 20 configured to amplify potential difference between a first current route where the current is controlled by the first MOS transistor according to the voltage of the first signal, and a second current route where the current is controlled by the second MOS transistor according to the voltage of the second signal; a comparative operation control unit including a first switch configured to execute supply or blocking of supply of high-potential VDD to the drain of the first MOS transistor by a third current route different from the first current route, and a second switch configured to execute supply or blocking of supply of the high-potential VDD to the drain of the second MOS transistor by a fourth current route different from the second current route, and a third switch configured to execute supply or blocking of supply of a low potential to the first current route and second current route; and a comparative operation setting unit configured to set the period of supply or blocking of supply of the first switch, second switch, and third switch.

The comparative operation setting unit (comparative operation setting unit 50) includes a delay circuit configured to determine a period between a blocking period of supply of high-potential VDD by the first switch, and a blocking period of supply of high-potential VDD by the second switch, and a setting circuit configured to execute setting of a period.

Thus, with the comparison circuit 10 according to the first embodiment, timing of supply or blocking of supply of high-potential VDD to the third current route or the fourth current route by the first switch and the second switch, whereby the potentials of the first current route and the second current route before comparison can be controlled.

As a result thereof, the potentials of the first current route and the second current route before comparison are controlled, whereby comparison error along with difference of the properties relating to the gate voltage of the on resistances of the first MOS transistor and the second MOS transistor which receive the input signals VIP and VIM can be controlled.

Second Embodiment

Figure 6:
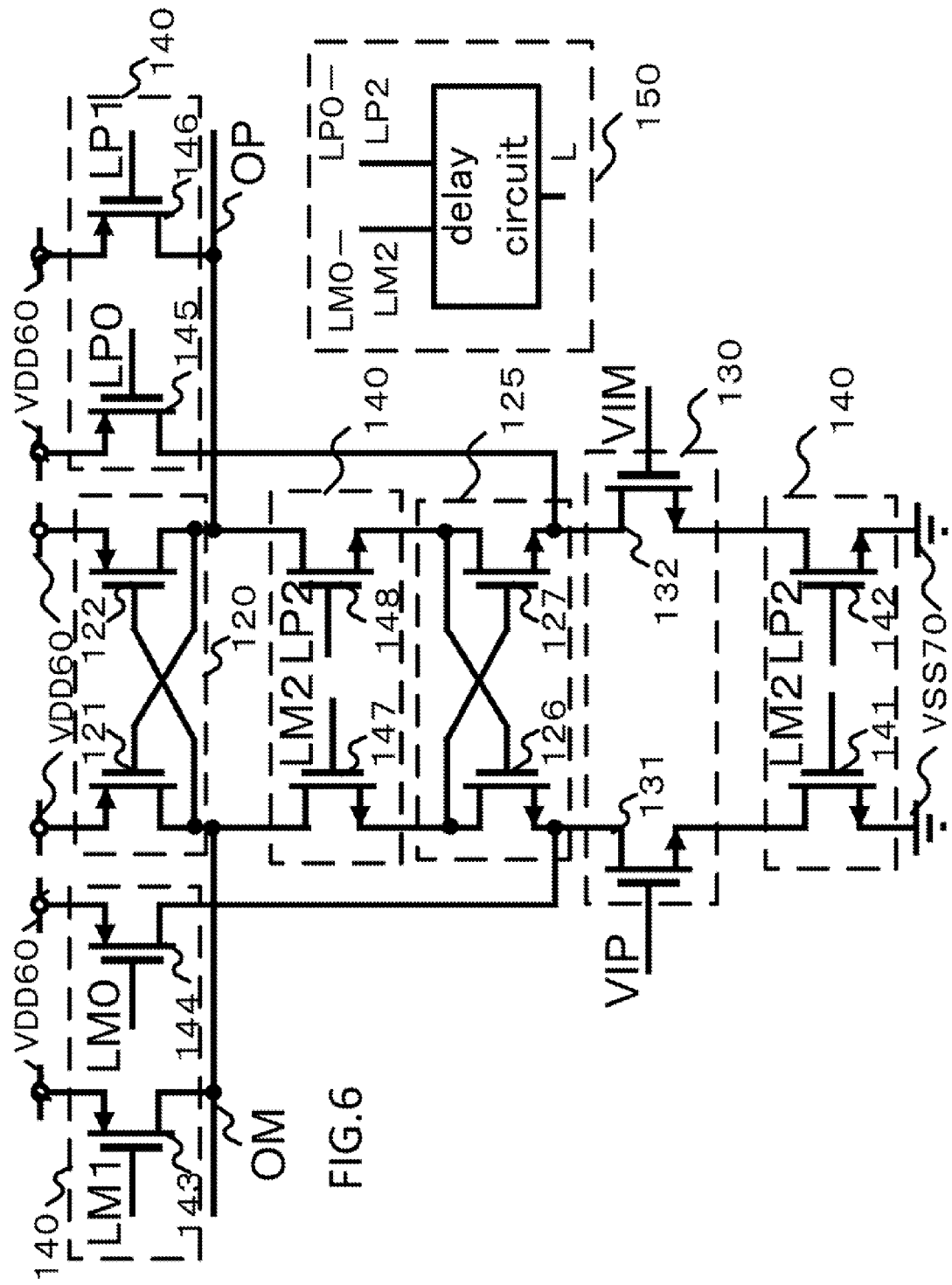
FIG. 6 is a circuit diagram illustrating a comparison circuit according to a second embodiment.

FIG. 6 is a circuit diagram illustrating a comparison circuit 100 according to the second embodiment. The comparison circuit 100 includes a P-type MOS transistor latch unit 120, an input 130, an N-type MOS transistor latch unit 125, a comparative operation control circuit 140, and a comparative operation setting circuit 150.

The comparative operation control unit 140 includes P-type MOS transistors 143, 144, 145, and 146, and N-type MOS transistors 141, 142, 147, and 148.

The N-type MOS transistor 141 has a drain to be connected to the source of an N-type MOS transistor 131 of the input 130, a source to be connected to the ground VSS 70, and a gate for receiving a signal LM2.

The N-type MOS transistor 142 has a drain to be connected to the source of an N-type MOS transistor 132 of the input 130, a source to be connected to the ground VSS 70, and a gate for receiving a signal LP2.

The N-type MOS transistor 141 supplies the ground potential from the ground VSS 70 to the input unit 130 when the logic of the signal LM2 is "H", and blocks supply of the ground potential from the ground VSS 70 to the input unit 130 when the logic is "H". The N-type MOS transistor 141 serves as a switch for connecting or blocking between the input unit 130 and the ground VSS 70.

The N-type MOS transistor 142 supplies the ground potential from the ground VSS 70 to the input unit 130 when the logic of the signal LP2 is "H", and blocks supply of the ground potential from the ground VSS 70 to the input unit 130 when the logic is "L". The N-type MOS transistor 142 serves as a switch for connecting or blocking between the input unit 130 and the ground VSS 70.

The P-type MOS transistor 143 has a source to be connected to the high-potential VDD power source 60, a drain to be connected to the drain of the P-type MOS transistor 121 of the P-type MOS transistor latch unit 120, and a gate for receiving a signal LM1.

The P-type MOS transistor 143 blocks supply of the high-potential VDD from the high-potential VDD power source 60 to the P-type MOS transistor latch unit 120 when the logic of the signal LM1 is "H", and supplies the high-potential VDD from the high-potential VDD power source 60 to the P-type MOS transistor latch unit 120 when the logic is "L". The P-type MOS transistor 143 serves as a switch for connecting or blocking between the P-type MOS transistor latch unit 120 and the high-potential VDD power source 60.

The P-type MOS transistor 144 has a source to be connected to the high-potential VDD power source 60, a drain to be connected to the drain of the N-type MOS transistor 126 of the N-type MOS transistor latch unit 125, and a gate for receiving a signal LM0.

The P-type MOS transistor 144 blocks supply of the high-potential VDD from the high-potential VDD power source 60 to the N-type MOS transistor latch unit 125 when the logic of the signal LM0 is "H", and supplies the high-potential VDD from the high-potential VDD power source 60 to the N-type MOS transistor latch unit 125 when the logic is "L". The P-type MOS transistor 144 serves as a switch for connecting or blocking between the N-type MOS transistor latch unit 125 and the high-potential VDD power source 60.

The P-type MOS transistor 145 has a source to be connected to the high-potential VDD power source 60, a drain to be connected to the drain of the N-type MOS transistor 127 of the N-type MOS transistor latch unit 125, and a gate for receiving a signal LP0.

The P-type MOS transistor 145 supplies the high-potential VDD from the high-potential VDD power source 60 to the N-type MOS transistor latch unit 125 when the logic of the signal LM0 is "H", and blocks supply of the high-potential VDD from the high-potential VDD power source 60 to the N-type MOS transistor latch unit 125 when the logic is "L". The P-type MOS transistor 145 serves as a switch for connecting or blocking between the N-type MOS transistor latch unit 125 and the high-potential VDD power source 60.

The P-type MOS transistor 146 has a source to be connected to the high-potential VDD power source 60, a drain to be connected to the drain of the P-type MOS transistor 122 of the P-type MOS transistor latch unit 120, and a gate for receiving a signal LP1.

The P-type MOS transistor 146 blocks supply of the high-potential VDD from the high-potential VDD power source 60 to the P-type MOS transistor latch unit 120 when the logic of the signal LP1 is "H", and supplies the high-potential VDD from the high-potential VDD power source 60 to the P-type MOS transistor latch unit 120 when the logic is "L". The P-type MOS transistor 146 serves as a switch for connecting or blocking between the P-type MOS transistor latch unit 120 and the high-potential VDD power source 60.

The N-type MOS transistor 147 has a drain to be connected to the drain of the P-type MOS transistor 121 of the P-type MOS transistor latch unit 120, a source to be connected to the drain of the N-type MOS transistor 126 of the N-type MOS transistor latch unit 125, and a gate for receiving a signal LM2.

The N-type MOS transistor 148 has a drain to be connected to the drain of the P-type MOS transistor 122 of the P-type MOS transistor latch unit 120, a source to be connected to the drain of the N-type MOS transistor 127 of the N-type MOS transistor latch unit 125, and a gate for receiving a signal LP2.

The input unit 130 includes the N-type MOS transistors 131 and 132. The N-type MOS transistor 131 has a drain to be connected to the source of the N-type MOS transistor 126 of the N-type MOS transistor latch unit 125, a source to be connected to the drain of the N-type MOS transistor 141 of the comparative operation control circuit 140, and a gate for receiving the input signal VIP. The on resistance value of the N-type MOS transistor 131 varies depending on the potential of the input signal VIP.

The N-type MOS transistor 132 has a drain to be connected to the source of the N-type MOS transistor 127 of the N-type MOS transistor latch unit 125, a source to be connected to the drain of the N-type MOS transistor 142 of the comparative operation control circuit 140, and a gate for receiving the signal VIM. The on resistance value of the N-type MOS transistor 132 varies depending on the potential of the signal VIM.

The P-type MOS transistor latch unit 120 includes the P-type MOS transistors 121 and 122. The N-type MOS transistor latch unit 125 includes the N-type MOS transistors 126 and 127.

The P-type MOS transistor 121 has a drain to be connected to the drain of the N-type MOS transistor 147, a gate to be connected to the drain of the P-type MOS transistor 122, and a source to be connected to the high-potential VDD power source 60.

The P-type MOS transistor 122 has a drain to be connected to the drain of the N-type MOS transistor 148, a gate to be connected to the drain of the P-type MOS transistor 121, and a source to be connected to the high-potential VDD power source 60.

The N-type MOS transistor 126 has a drain to be connected to the source of the N-type MOS transistor 147, a gate to be connected to the drain of the N-type MOS transistor 127, and a source to be connected to the drain of the N-type MOS transistor 131 of the input unit 130.

The N-type MOS transistor 127 has a drain to be connected to the source of the N-type MOS transistor 148, a gate to be connected to the drain of the N-type MOS transistor 126, and a source to be connected to the drain of the N-type MOS transistor 132 of the input unit 130.

The output signals OM and OP are output from the P-type MOS transistor latch unit 120. The output signal OM is connected to the node A between the drain of the P-type MOS transistor 121 and the drain of the N-type MOS transistor 147. The output signal OP is connected to the node B between the drain of the P-type MOS transistor 122 and the drain of the N-type MOS transistor 148.

The gate of the P-type MOS transistor 121 of the P-type MOS transistor latch unit 120 and the drain of the P-type MOS transistor 122 are connected to the node B, and the gate of the P-type MOS transistor 122 and the drain of the P-type MOS transistor 121 are connected to the node A. That is to say, the P-type MOS transistor 121 and the P-type MOS transistor 122 are connected crosswise to the nodes A and B, and accordingly, the P-type MOS transistor 121 and the P-type MOS transistor 122 amplify potential difference between the nodes A and B.

The gate of the N-type MOS transistor 126 and the drain of the N-type MOS transistor 127 of the N-type MOS transistor latch unit 125 are connected to the drain (node D) of the N-type MOS Transistor 148, and the gate of the N-type MOS transistor 127 and the drain of the N-type MOS transistor 126 are connected to the drain (node C) of the N-type MOS transistor 147. That is to say, the N-type MOS transistor 126 and the N-type MOS transistor 127 are connected crosswise to the nodes C and D, and accordingly, the N-type MOS transistor 126 and the N-type MOS transistor 127 amplify potential difference between the nodes C and D.

Thus, the P-type MOS transistor 121 of the P-type MOS transistor latch unit 120, the N-type MOS transistor 147, the N-type MOS transistor 126, the N-type MOS transistor 131, and the N-type MOS transistor 141 are serially connected between the high-potential VDD power source 60 and the ground VSS 70, and make up a first current route including the nodes A and C. The P-type MOS transistor 122 of the P-type MOS transistor latch unit 120, the N-type MOS transistor 148, the N-type MOS transistor 127, the N-type MOS transistor 132, and the N-type MOS transistor 142 are serially connected between the high-potential VDD power source 60 and the ground VSS 70, and make up a second current route including the nodes B and D.

Therefore, when the signals LM0, LM1, LM2, LP0, LP1, and LP2 are "H", supply of the high-potential VDD to the P-type MOS transistor latch unit 120 and the N-type MOS transistor latch unit 125 is blocked by the P-type MOS transistors 143, 144, 145, and 146, and the ground potential VSS is supplied to the input unit 130, the P-type MOS transistor latch unit 120, and the N-type MOS transistor latch unit 125 by the N-type MOS transistors 141 and 142.

In the above case, the on resistance of the N-type MOS transistor 131 varies according to the potential of the input signal VIP, and accordingly, upon the potential of the input signal VIP decreasing, the potentials of the nodes A and C increase, and the on resistance of the N-type MOS transistor 132 varies according to the potential of the input signal VIM, and accordingly, upon the potential of the input signal VIM increasing contrary to the input signal VIP, the potentials of the nodes B and D decrease. On the other hand, conversely, upon the potential of the input signal VIP increasing, the potentials of the nodes A and C decrease, and upon the potential of the input signal VIM decreasing, the potentials of the nodes B and D increase.

Note that, when the signals LM0, LM1, LM2, LP0, LP1, and LP2 are "L", the high-potential VDD is supplied to the P-type MOS transistor latch unit 120, and the N-type MOS transistor latch unit 125, and the input unit 130 by the P-type MOS transistors 143, 144, 145, and 146, and the supply of the ground potential to the input unit 130 is blocked by the N-type MOS transistors 141 and 142.

As a result thereof, potential difference between the nodes A and B is 0, or almost eliminated.

The comparative operation setting circuit 150 is made up of a circuit similar to the comparative operation setting circuit 50 according to the first embodiment for driving the signals LM0 and LP0, a circuit similar to the comparative operation setting circuit 50 for driving the signals LM1 and LP1, and a circuit similar to the comparative operation setting circuit 50 for driving the signals LM2 and LP2. Also, the circuits similar to the comparative operation setting circuit 50 include a delay circuit 151, and a logic circuit 156 for controlling the delay circuit 151. The delay circuit 151 and the logic circuit 156 are the same circuits as the delay circuit 51 and the logic circuit 56 according to the first embodiment. Now, it goes without saying that delay between the signals LM0 and LP0, delay between the signals LM1 and LP1, and delay between the signals LM2 and LP2 may be set to the same delay amount, or may be set separately. It is further needless to say that an arrangement may be made where just one of the delays is set.

Thus, the comparison circuit 100 according to the second embodiment includes an input unit (130) made up of a first MOS transistor (N-type MOS transistor 131) for receiving a first signal (signal VIP) at the gate electrode, and a second MOS transistor (N-type MOS transistor 132) for receiving a second signal (signal VIM) at the gate electrode; a latch circuit (P-type MOS transistor latch circuit 120, N-type MOS transistor latch circuit 125) for amplifying potential difference between a node within a first current route where an electric current is controlled by the first MOS transistor according to the voltage of the first signal, and a node within a second current route where an electric current is controlled by the second MOS transistor according to the voltage of the second signal; a comparative operation setting unit (comparative operation setting circuit 150) including a first switch (P-type MOS transistor 144) for executing supply or blocking of supply of the high-potential VDD to the drain of the first MOS transistor by a third current route different from the first current route, a second switch (P-type MOS transistor 145) for executing supply or blocking of supply of the high-potential VDD to the drain of the second MOS transistor by a fourth current route different from the second current route, and a third switch (N-type MOS transistors 141 and 147) and a fourth switch (N-type MOS transistors 142 and 148) which execute supply or blocking of supply of a low potential to the first current route and the second current route; a fifth switch (P-type MOS transistor 143) to be connected to the latch circuit; a sixth switch (P-type MOS transistor 146) to be connected to the latch circuit; and a comparative operation control unit (comparative operation control circuit 140) for controlling supply or blocking of the first through sixth switches.

Thus, supply or blocking of any of the first through sixth switches is controlled, whereby the potentials of the first current route and the second current route before start of comparison can also be controlled at the comparison circuit 100 according to the second embodiment.

As a result thereof, the potentials of the first current route and the second current route before start of comparison are controlled, whereby comparison error along with different properties relating to the gate voltages of on resistances of the first and second MOS transistors which receive input signals VIP and VIM can be controlled. Note that it goes without saying that comparison error can be controlled by controlling any of the first through sixth switches.

Further, with the comparison circuit 100 according to the second embodiment, the latch circuit unit is made up of the N-type MOS transistor latch circuit 120 and the P-type MOS transistor latch circuit 125, and accordingly, control of supply or blocking of supply of the high-potential VDD to the latch circuits is ensured by providing the fifth switch (P-type MOS transistor 143) and the sixth switch (P-type MOS transistor 146) to be connected to the latch circuits.

Third Embodiment

Figure 7:
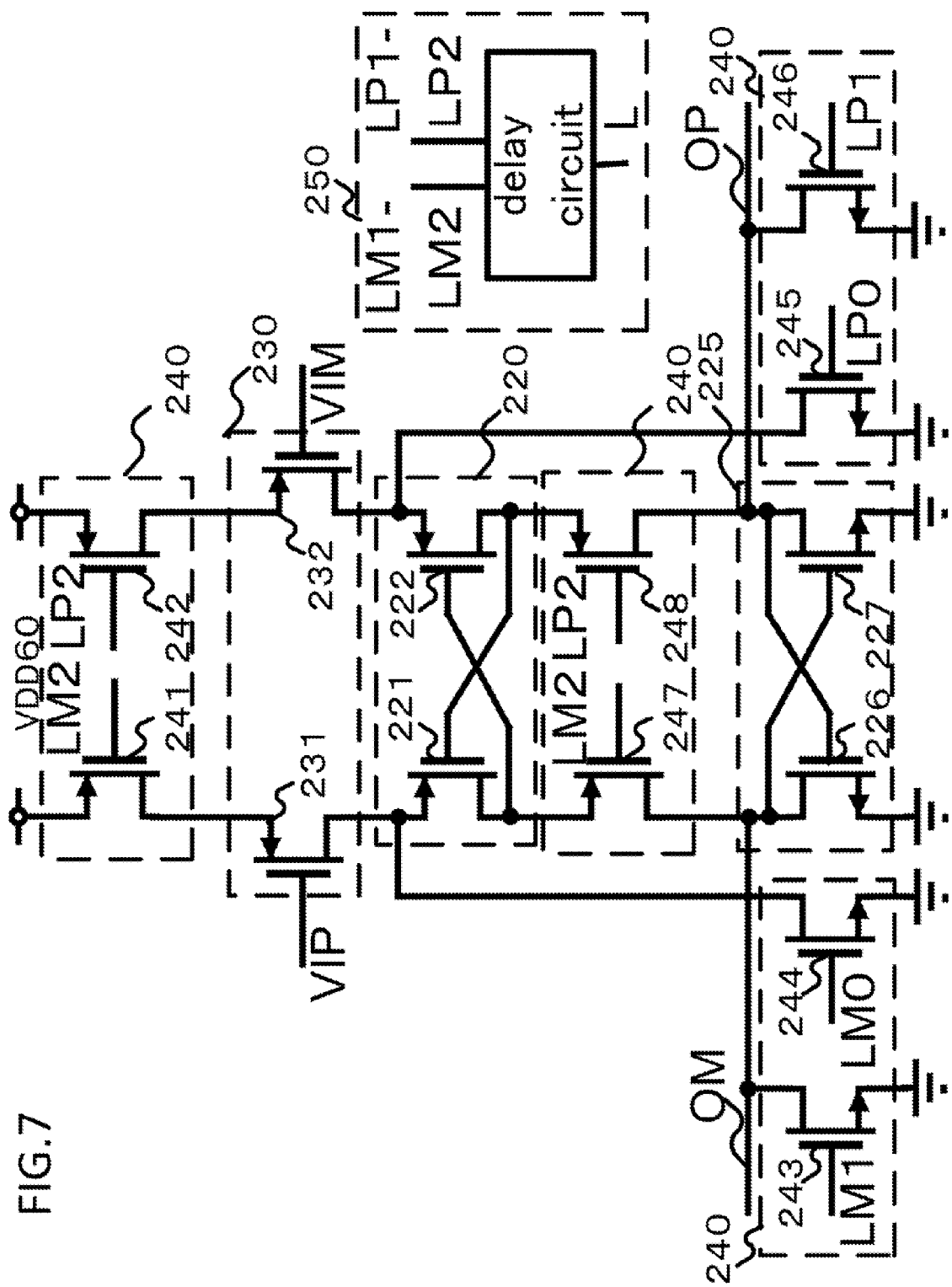
FIG. 7 is a circuit diagram illustrating a comparison circuit according to a third embodiment.

FIG. 7 is a circuit diagram illustrating a comparison circuit 200 according to the third embodiment. The comparison circuit 200 includes a P-type MOS transistor latch unit 220, an input unit 230, an N-type MOS transistor latch unit 225, a comparative operation control circuit 240, and a comparative operation setting circuit 250.

The comparative operation control circuit 240 includes N-type MOS transistors 243, 244, 245, and 246, and P-type MOS transistors 241, 242, 247, and 248.

The P-type MOS transistor 241 has a drain to be connected to the source of a P-type MOS transistor 231 of the input unit 230, a source to be connected to the high-potential VDD power source 60, and a gate for receiving a signal LM2.

The P-type MOS transistor 242 has a drain to be connected to the source of a P-type MOS transistor 232 of the input unit 230, a source to be connected to the high-potential VDD power source 60, and a gate for receiving a signal LP2.

The P-type MOS transistor 241 supplies the high-potential VDD from the high-potential VDD power source 60 to the input unit 230 when the logic of the signal LM2 is "L", and blocks supply of the high-potential VDD from the high-potential VDD power source 60 to the input unit 230 when the logic is "H". The P-type MOS transistor 241 serves as a switch for connecting or blocking between the input unit 230 and the high-potential VDD power source 60.

The P-type MOS transistor 242 supplies the high-potential VDD from the high-potential VDD power source 60 to the input unit 230 when the logic of the signal LP2 is "L", and blocks supply of the high-potential VDD from the high-potential VDD power source 60 to the input unit 230 when the logic is "H". The P-type MOS transistor 242 serves as a switch for connecting or blocking between the input unit 230 and the high-potential VDD power source 60.

The N-type MOS transistor 243 has a source to be connected to a ground VSS power source 70, a drain to be connected to the drain of an N-type MOS transistor 226 of the N-type MOS transistor latch unit 225, and a gate for receiving the signal LM1.

The N-type MOS transistor 243 supplies the high-potential VDD from the high-potential VDD power source 60 to the N-type MOS transistor latch unit 225 when the logic of the signal LM1 is "H", and blocks supply of the high-potential VDD from the high-potential VDD power source 60 to the N-type MOS transistor latch unit 225 when the logic is "L". The N-type MOS transistor 243 serves as a switch for connecting or blocking between the N-type MOS transistor latch unit 225 and the high-potential VDD power source 60.

The N-type MOS transistor 244 has a source to be connected to the ground VSS power source 70, a drain to be connected to the source of a P-type MOS transistor 221 of the P-type MOS transistor latch unit 220, and a gate for receiving the signal LM0.

The N-type MOS transistor 244 supplies the ground VSS potential from the ground VSS power source 70 to the P-type MOS transistor latch unit 220 when the logic of the signal LM0 is "H", and blocks supply of the ground VSS potential from the ground VSS power source 70 to the P-type MOS transistor latch unit 220 when the logic is "L". The N-type MOS transistor 244 serves as a switch for connecting or blocking between the P-type MOS transistor latch unit 220 and the ground VSS power source 70.

The N-type MOS transistor 245 has a source to be connected to the ground VSS power source 70, a drain to be connected to the source of a P-type MOS transistor 222 of the P-type MOS transistor latch unit 220, and a gate for receiving the signal LP0.

The N-type MOS transistor 245 supplies the ground VSS potential from the ground VSS power source 70 to the P-type MOS transistor latch unit 220 when the logic of the signal LP0 is "H", and blocks supply of the ground VSS potential from the ground VSS power source 70 to the P-type MOS transistor latch unit 220 when the logic is "L". The N-type MOS transistor 245 serves as a switch for connecting or blocking between the P-type MOS transistor latch unit 220 and the ground VSS power source 70.

The N-type MOS transistor 246 has a source to be connected to the ground VSS power source 70, a drain to be connected to the drain of an N-type MOS transistor 227 of the N-type MOS transistor latch unit 225, and a gate for receiving the signal LP1.

The N-type MOS transistor 246 supplies the ground VSS from the ground VSS power source 70 to the N-type MOS transistor latch unit 225 when the logic of the signal LP1 is "H", and blocks supply of the ground VSS from the ground VSS power source 70 to the N-type MOS transistor latch unit 225 when the logic is "L". The N-type MOS transistor 246 serves as a switch for connecting or blocking between the N-type MOS transistor latch unit 225 and the ground VSS power source 70.

The P-type MOS transistor 247 has a source to be connected to the drain of the P-type MOS transistor 221 of the P-type MOS transistor latch unit 220, a drain to be connected to the drain of the N-type MOS transistor 226 of the N-type MOS transistor latch unit 225, and a gate for receiving the signal LM2.

The P-type MOS transistor 248 has a source to be connected to the drain of the P-type MOS transistor 222 of the P-type MOS transistor latch unit 220, a drain to be connected to the drain of the N-type MOS transistor 227 of the N-type MOS transistor latch unit 225, and a gate for receiving the signal LP2.

The input unit 230 includes the P-type MOS transistors 231 and 232. The P-type MOS transistor 231 has a drain to be connected to the source of the P-type MOS transistor 221 of the P-type MOS transistor latch unit 220, a source to be connected to the drain of the P-type MOS transistor 241 of the comparative operation control circuit 240, and a gate for receiving an input signal VIP. The on resistance value of the P-type MOS transistor 231 varies according to the potential of the input signal VIP.

The P-type MOS transistor 232 has a drain to be connected to the source of the P-type MOS transistor 222 of the P-type MOS transistor latch unit 220, a source to be connected to the drain of the P-type MOS transistor 242 of the comparative operation control circuit 240, and a gate for receiving a signal VIM. The on resistance value of the P-type MOS transistor 232 varies according to the potential of the signal VIM.

The P-type MOS transistor latch unit 220 includes the P-type MOS transistors 221 and 222. The N-type MOS transistor latch unit 225 includes the N-type MOS transistors 226 and 227.

The P-type MOS transistor 221 has a drain to be connected to the source of the P-type MOS transistor 247, a source to be connected to the drain of the P-type MOS transistor 231, and a gate to be connected to the drain of the P-type MOS transistor 222.

The P-type MOS transistor 222 has a drain to be connected to the source of the P-type MOS transistor 248, a source to be connected to the drain of the P-type MOS transistor 232, and a gate to be connected to the drain of the P-type MOS transistor 221.

The N-type MOS transistor 226 has a drain to be connected to the drain of the P-type MOS transistor 247, a gate to be connected to the drain of the N-type MOS transistor 227, and a source to be connected to the ground VSS 70.

The N-type MOS transistor 227 has a drain to be connected to the drain of the P-type MOS transistor 248, a gate to be connected to the drain of the N-type MOS transistor 226, and a source to be connected to the ground VSS 70.

The output signals OM and OP are output from the N-type MOS transistor latch unit 225. The output signal OM is connected to the node A between the drain of the N-type MOS transistor 226 and the drain of the P-type MOS transistor 247. The output signal OP is connected to the node B between the drain of the N-type MOS transistor 227 and the drain of the P-type MOS transistor 248.

The gate of the N-type MOS transistor 226 of the N-type MOS transistor latch unit 225 and the drain of the N-type MOS transistor 227 are connected to the node B, and the gate of the N-type MOS transistor 227 and the drain of the N-type MOS transistor 226 are connected to the node A. That is to say, the N-type MOS transistor 226 and the N-type MOS transistor 227 are connected crosswise to the nodes A and B, and accordingly, the N-type MOS transistor 226 and the N-type MOS transistor 227 amplify potential difference between the nodes A and B.

The gate of the P-type MOS transistor 221 and the drain of the P-type MOS transistor 222 of the P-type MOS transistor latch unit 220 are connected to the source (node D) of the P-type MOS Transistor 248, and the gate of the P-type MOS transistor 222 and the drain of the P-type MOS transistor 221 are connected to the source (node C) of the P-type MOS transistor 247. That is to say, the P-type MOS transistor 226 and the P-type MOS transistor 227 are connected crosswise to the nodes C and D, and accordingly, the P-type MOS transistor 221 and the P-type MOS transistor 222 amplify potential difference between the nodes C and D.

Thus, the P-type MOS transistor 221 of the P-type MOS transistor latch unit 220, the P-type MOS transistor 247, the N-type MOS transistor 226, the P-type MOS transistor 231, and the P-type MOS transistor 241 are serially connected between the high-potential VDD power source 60 and the ground VSS 70, and make up a first current route including the nodes A and C. The P-type MOS transistor 222 of the P-type MOS transistor latch unit 220, the P-type MOS transistor 248, the N-type MOS transistor 227, the P-type MOS transistor 232, and the P-type MOS transistor 242 are serially connected between the high-potential VDD power source 60 and the ground VSS 70, and make up a second current route including the nodes B and D.

Therefore, when the signals LM0, LM1, LM2, LP0, LP1, and LP2 are "L", supply of the ground VSS to the P-type MOS transistor latch unit 220 and the N-type MOS transistor latch unit 225 is blocked by the N-type MOS transistors 243, 244, 245, and 246, and the high-potential VDD is supplied to the input unit 230, the P-type MOS transistor latch unit 220, and the N-type MOS transistor latch unit 225 by the P-type MOS transistors 241 and 242.

In the above case, the on resistance of the P-type MOS transistor 231 varies according to the potential of the input signal VIP, and accordingly, upon the potential of the input signal VIP decreasing, the potentials of the nodes A and C decrease, and the on resistance of the N-type MOS transistor 232 varies according to the potential of the input signal VIM, and accordingly, upon the potential of the input signal VIM increasing contrary to the input signal VIP, the potentials of the nodes B and D increase. On the other hand, conversely, upon the potential of the input signal VIP increasing, the potentials of the nodes A and C increase, and upon the potential of the input signal VIM decreasing, the potentials of the nodes B and D decrease.

Note that, when the signals LM0, LM1, LM2, LP0, LP1, and LP2 are "H", the ground VSS is supplied to the P-type MOS transistor latch unit 220, the N-type MOS transistor latch unit 225, and the input unit 230 by the N-type MOS transistors 243, 244, 245, and 246, and the supply of the high-potential VDD to the input unit 230 is blocked by the P-type MOS transistors 241 and 242.

As a result thereof, potential difference between the nodes A and B is 0, or almost eliminated.

The comparative operation setting circuit 250 is made up of a circuit similar to the comparative operation setting circuit 50 according to the first embodiment for driving the signals LM0 and LP0, a circuit similar to the comparative operation setting circuit 50 for driving the signals LM1 and LP1, and a circuit similar to the comparative operation setting circuit 50 for driving the signals LM2 and LP2. Also, the circuits similar to the comparative operation setting circuit 50 include a delay circuit 251, and a logic circuit 256 for controlling the delay circuit 251. Also, the delay circuit 251 and the logic circuit 256 are the same circuits as the delay circuit 51 and the logic circuit 56. Now, it goes without saying that delay between the signals LM0 and LP0, delay between the signals LM1 and LP1, and delay between the signals LM2 and LP2 may be set to the same delay amount, or may be set separately. It is further needless to say that an arrangement may be made where just one of the delays is set.

Thus, the comparison circuit 200 according to the third embodiment includes an input unit (230) made up of a first MOS transistor (P-type MOS transistor 231) for receiving a first signal (signal VIP) at the gate electrode, and a second MOS transistor (P-type MOS transistor 232) for receiving a second signal (signal VIM) at the gate electrode; a latch circuit (P-type MOS transistor latch circuit 220, N-type MOS transistor latch circuit 225) for amplifying potential difference between a first current route where an electric current is controlled by the first MOS transistor according to the voltage of the first signal, and a second current route where an electric current is controlled by the second MOS transistor according to the voltage of the second signal; a comparative operation setting unit (comparative operation setting circuit 250) including a first switch (N-type MOS transistor 244) for executing supply or blocking of supply of the ground VSS to the drain of the first MOS transistor by a third current route different from the first current route, a second switch (N-type MOS transistor 245) for executing supply or blocking of supply of the ground VSS to the drain of the second MOS transistor by a fourth current route different from the second current route, and a third switch (P-type MOS transistors 241 and 247) and a fourth switch (P-type MOS transistors 242 and 248) which execute supply or blocking of supply of the high-potential VDD to the first current route and the second current route; a fifth switch (N-type MOS transistor 243) to be connected to the latch circuit; a sixth switch (N-type MOS transistor 246) to be connected to the latch circuit; and a comparative operation control unit (comparative operation control circuit 240) for controlling supply or blocking of the first through sixth switches.

Thus, supply or blocking timing of any of the first through sixth switches is controlled, whereby the potentials of the first current route and the second current route before start of comparison can also be controlled.

As a result thereof, the potentials of the first current route and the second current route before start of comparison are controlled, whereby comparison error along with different properties relating to the gate voltages of on resistances of the first and second MOS transistors which receive input signals VIP and VIM can be controlled. Note that it goes without saying that comparison error can be controlled by controlling any of the first through sixth switches.

Further, with the comparison circuit 200 according to the third embodiment, the latch circuit portion is made up of the N-type MOS transistor latch circuit 220 and the P-type MOS transistor latch circuit 225, and accordingly, control of supply or blocking of supply of the ground VSS to the latch circuits is ensured by providing the fifth switch (N-type MOS transistor 243) and the sixth switch (N-type MOS transistor 246) to be connected to the latch circuits.

Fourth Embodiment

Figure 8:
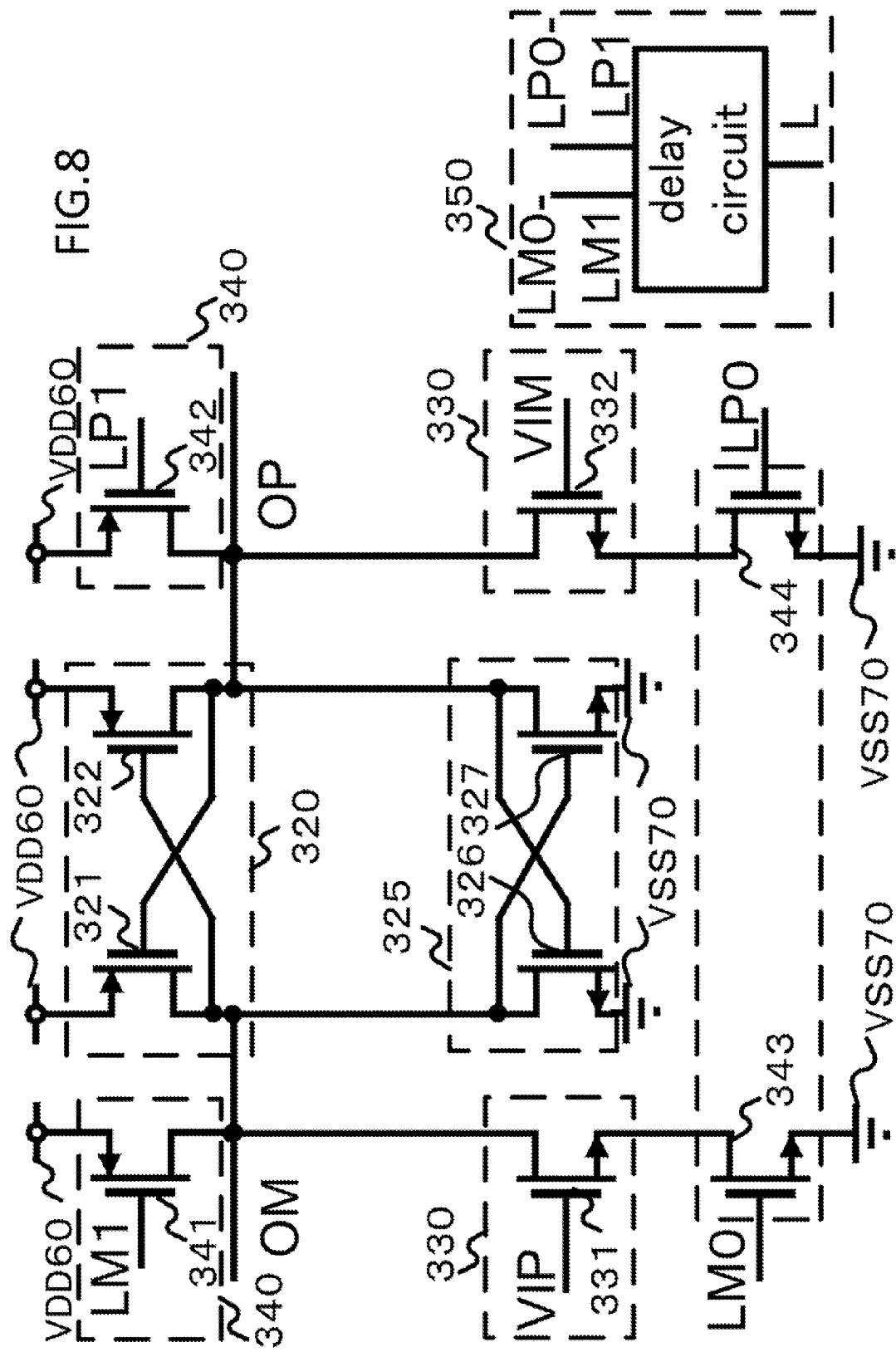
FIG. 8 is a circuit diagram illustrating a comparison circuit according to a fourth embodiment.

FIG. 8 is a circuit diagram illustrating a comparison circuit 300 according to the fourth embodiment. The comparison circuit 300 includes a P-type MOS transistor latch unit 320, an input unit 330, an N-type MOS transistor latch unit 325, a comparative operation control circuit 340, and a comparative operation setting circuit 350.

The comparative operation control circuit 340 includes N-type MOS transistors 343 and 344, and P-type MOS transistors 341 and 342.

The P-type MOS transistor 341 has a drain to be connected to the drain of an N-type MOS transistor 331 of the input unit 330, a source to be connected to the high-potential VDD power source 60, and a gate for receiving a signal LM1.

Note that the drain of the P-type MOS transistor 341, the drain of the N-type MOS transistor 331 of the input unit 330, the drain of the P-type MOS transistor 321 of the P-type MOS transistor latch unit 320, and the drain of the N-type MOS transistor 326 of the N-type MOS transistor latch unit 325 are all connected to the node A within the comparison circuit 300. The comparison circuit 300 outputs an output signal OM from the node A.

The P-type MOS transistor 342 has a drain to be connected to the drain of an N-type MOS transistor 332 of the input unit 330, a source to be connected to the high-potential VDD power source 60, and a gate for receiving a signal LP1.

Note that the drain of the P-type MOS transistor 342, the drain of the N-type MOS transistor 332 of the input unit 330, the drain of the P-type MOS transistor 322 of the P-type MOS transistor latch unit 320, and the drain of the N-type MOS transistor 327 of the N-type MOS transistor latch unit 325 are all connected to the node B within the comparison circuit 300. The comparison circuit 300 outputs an output signal OP from the node B.

The P-type MOS transistor 341 supplies the high-potential VDD from the high-potential VDD power source 60 to the input unit 330 when the logic of the signal LM1 is "L", and blocks supply of the high-potential VDD from the high-potential VDD power source 60 to the input unit 330 when the logic is "H". The P-type MOS transistor 341 serves as a switch for connecting or blocking between the input unit 330 and the high-potential VDD power source 60.

The P-type MOS transistor 342 supplies the high-potential VDD from the high-potential VDD power source 60 to the input unit 330 when the logic of the signal LP1 is "L", and blocks supply of the high-potential VDD from the high-potential VDD power source 60 to the input unit 330 when the logic is "H". The P-type MOS transistor 342 serves as a switch for connecting or blocking between the input unit 330 and the high-potential VDD power source 60.

The N-type MOS transistor 343 has a source to be connected to the ground VSS power source 70, a drain to be connected to the source of the N-type MOS transistor 331 of the input unit 330, and a gate for receiving a signal LM0.

The N-type MOS transistor 343 supplies the ground VSS from the ground VSS power source 70 to the input unit 330 when the logic of the signal LM0 is "H", and blocks supply of the ground VSS from the ground VSS power source 70 to the input unit 330 when the logic is "L". The N-type MOS transistor 343 serves as a switch for connecting or blocking between the input unit 330 and the ground VSS power source 70.

The N-type MOS transistor 344 has a source to be connected to the ground VSS power source 70, a drain to be connected to the source of the N-type MOS transistor 332 of the input unit 330, and a gate for receiving a signal LP0.

The N-type MOS transistor 344 supplies the ground VSS from the ground VSS power source 70 to the input unit 330 when the logic of the signal LP0 is "H", and blocks supply of the ground VSS from the ground VSS power source 70 to the input unit 330 when the logic is "L". The N-type MOS transistor 344 serves as a switch for connecting or blocking between the input unit 330 and the ground VSS power source 70.

The input unit 330 includes the N-type MOS transistors 331 and 332. The N-type MOS transistor 331 has a drain to be connected to the drain of the P-type MOS transistor 321 of the P-type MOS transistor latch unit 320, a source to be connected to the drain of the N-type MOS transistor 343 of the comparative operation control circuit 340, and a gate for receiving an input signal VIP. The on resistance value of the N-type MOS transistor 331 varies according to the potential of the input signal VIP.

The N-type MOS transistor 332 has a drain to be connected to the drain of the P-type MOS transistor 322 of the P-type MOS transistor latch unit 320, a source to be connected to the drain of the N-type MOS transistor 344 of the comparative operation control circuit 340, and a gate for receiving a signal VIM. The on resistance value of the N-type MOS transistor 332 varies according to the potential of the signal VIM.

The P-type MOS transistor latch unit 320 includes the P-type MOS transistors 321 and 322. The N-type MOS transistor latch unit 325 includes the N-type MOS transistors 326 and 327.

The P-type MOS transistor 321 has a drain to be connected to the drain of the N-type MOS transistor 326, a source to be connected to the high-potential VDD power source 60, and a gate to be connected to the drain of the P-type MOS transistor 322.

The P-type MOS transistor 322 has a drain to be connected to the drain of the N-type MOS transistor 327, a source to be connected to the high-potential VDD power source 60, and a gate to be connected to the drain of the P-type MOS transistor 321.

The N-type MOS transistor 326 has a drain to be connected to the drain of the P-type MOS transistor 321, a gate to be connected to the drain of the N-type MOS transistor 327, and a source to be connected to the ground VSS 70.

The N-type MOS transistor 327 has a drain to be connected to the drain of the P-type MOS transistor 322, a gate to be connected to the drain of the N-type MOS transistor 326, and a source to be connected to the ground VSS 70.

The output signals OM and OP are output from the N-type MOS transistor latch unit 325. The output signal OM is connected to the node A between the drain of the N-type MOS transistor 326 and the drain of the P-type MOS transistor 321. The output signal OP is connected to the node B between the drain of the N-type MOS transistor 327 and the drain of the P-type MOS transistor 322.

The gate of the N-type MOS transistor 326 of the N-type MOS transistor latch unit 325 and the drain of the N-type MOS transistor 327 are connected to the node B, and the gate of the N-type MOS transistor 327 and the drain of the N-type MOS transistor 326 are connected to the node A. That is to say, the N-type MOS transistor 326 and the N-type MOS transistor 327 are connected crosswise to the nodes A and B, and accordingly, the N-type MOS transistor 326 and the N-type MOS transistor 327 amplify potential difference between the nodes A and B.

Thus, the P-type MOS transistor 321 of the P-type MOS transistor latch unit 320, the N-type MOS transistor 331, and the N-type MOS transistor 343 are serially connected between the high-potential VDD power source 60 and the ground VSS 70, and make up a first current route including the node A. The P-type MOS transistor 322 of the P-type MOS transistor latch unit 320, the P-type MOS transistor 332, and the N-type MOS transistor 344 are serially connected between the high-potential VDD power source 60 and the ground VSS 70, and make up a second current route including the node B.

Therefore, when the signals LM0, LM1, LP0, and LP1 are "H", supply of the high-potential VDD to the P-type MOS transistor latch unit 320 and the N-type MOS transistor latch unit 325 is blocked by the P-type MOS transistors 341 and 342, and the ground potential VSS is supplied to the input unit 330, and the P-type MOS transistor latch unit 320 by the N-type MOS transistors 343 and 344.

In the above case, the on resistance of the P-type MOS transistor 331 varies according to the potential of the input signal VIP, and accordingly, upon the potential of the input signal VIP decreasing, the potential of the node A increases, and the on resistance of the N-type MOS transistor 332 varies according to the potential of the input signal VIM, and accordingly, upon the potential of the input signal VIM increasing contrary to the input signal VIP, the potential of the node B decreases. On the other hand, conversely, upon the potential of the input signal VIP increasing, the potential of the node A decreases, and upon the potential of the input signal VIM decreasing, the potential of the node B increases.

Note that, when the signals LM0, LM1, LP0, and LP1 are "L", the high-potential VDD is supplied to the P-type MOS transistor latch unit 320, and the N-type MOS transistor latch unit 325, and the input unit 330 by the P-type MOS transistors 341 and 342, and the supply of the ground VSS to the input unit 330 is blocked by the N-type MOS transistors 343 and 344.

As a result thereof, potential difference between the nodes A and B is 0, or almost eliminated.

The comparative operation setting circuit 350 is made up of a circuit similar to the comparative operation setting circuit 50 according to the first embodiment for driving the signals LM0 and LP0, and a circuit similar to the comparative operation setting circuit 50 for driving the signals LM1 and LP1. The circuits similar to the comparative operation setting circuit 50 include a delay circuit 351, and a logic circuit 356 for controlling the delay circuit 351. The delay circuit 351 and the logic circuit 356 are the same circuits as the delay circuit 51 and the logic circuit 56. Now, it goes without saying that delay between the signals LM0 and LP0, and delay between the signals LM1 and LP1 may be set to the same delay amount, or may be set separately. It is further needless to say that an arrangement may be made where just one of the delays is set.

Thus, the comparison circuit 300 according to the fourth embodiment includes an input unit (330) made up of a first MOS transistor (N-type MOS transistor 331) for receiving a first signal (signal VIP) at the gate electrode, and a second MOS transistor (N-type MOS transistor 332) for receiving a second signal (signal VIM) at the gate electrode; a latch circuit (P-type MOS transistor latch circuit 320, N-type MOS transistor latch circuit 325) for amplifying potential difference between a first current route where an electric current is controlled by the first MOS transistor according to the voltage of the first signal, and a second current route where an electric current is controlled by the second MOS transistor according to the voltage of the second signal; a comparative operation setting unit (comparative operation setting circuit 350) including a first switch (P-type MOS transistor 341) for executing supply or blocking of supply of the high-potential VDD to the drain of the first MOS transistor by a third current route different from the first current route, a second switch (P-type MOS transistor 342) for executing supply or blocking of supply of the high-potential VDD to the drain of the second MOS transistor by a fourth current route different from the second current route, and a third switch (N-type MOS transistor 343) and a fourth switch (N-type MOS transistors 344) which execute supply or blocking of supply of the ground VSS to the first current route and the second current route; and a comparative operation control unit (comparative operation control circuit 340) for controlling supply or blocking of the first through fourth switches.

Thus, supply or blocking timing of any of the first through fourth switches is controlled, whereby the potentials of the first current route and the second current route before start of comparison can also be controlled.

As a result thereof, the potentials of the first current route and the second current route before start of comparison are controlled, whereby comparison error along with different properties relating to the gate voltages of on resistances of the first and second MOS transistors which receive input signals VIP and VIM can be controlled. Note that it goes without saying that comparison error can be controlled by controlling any of the first through fourth switches.

Further, the latch circuit portion includes the P-type MOS transistor latch circuit 320 made up of a P-type MOS transistor (P-type MOS transistor 321) making up the first current route, and a P-type MOS transistor (P-type MOS transistor 322) making up the second current route. Note that supply and blocking of supply of the high-potential VDD to the P-type MOS transistor latch unit 320 are executed by the first switch and the second switch. The N-type MOS transistors making up the N-type MOS transistor latch unit are not included in the first current route and the second current route, and accordingly, capacitance parasitizing the first current route and the second current route decreases, and the response speed of the comparison circuit 300 becomes fast.

Fifth Embodiment

Figure 9:
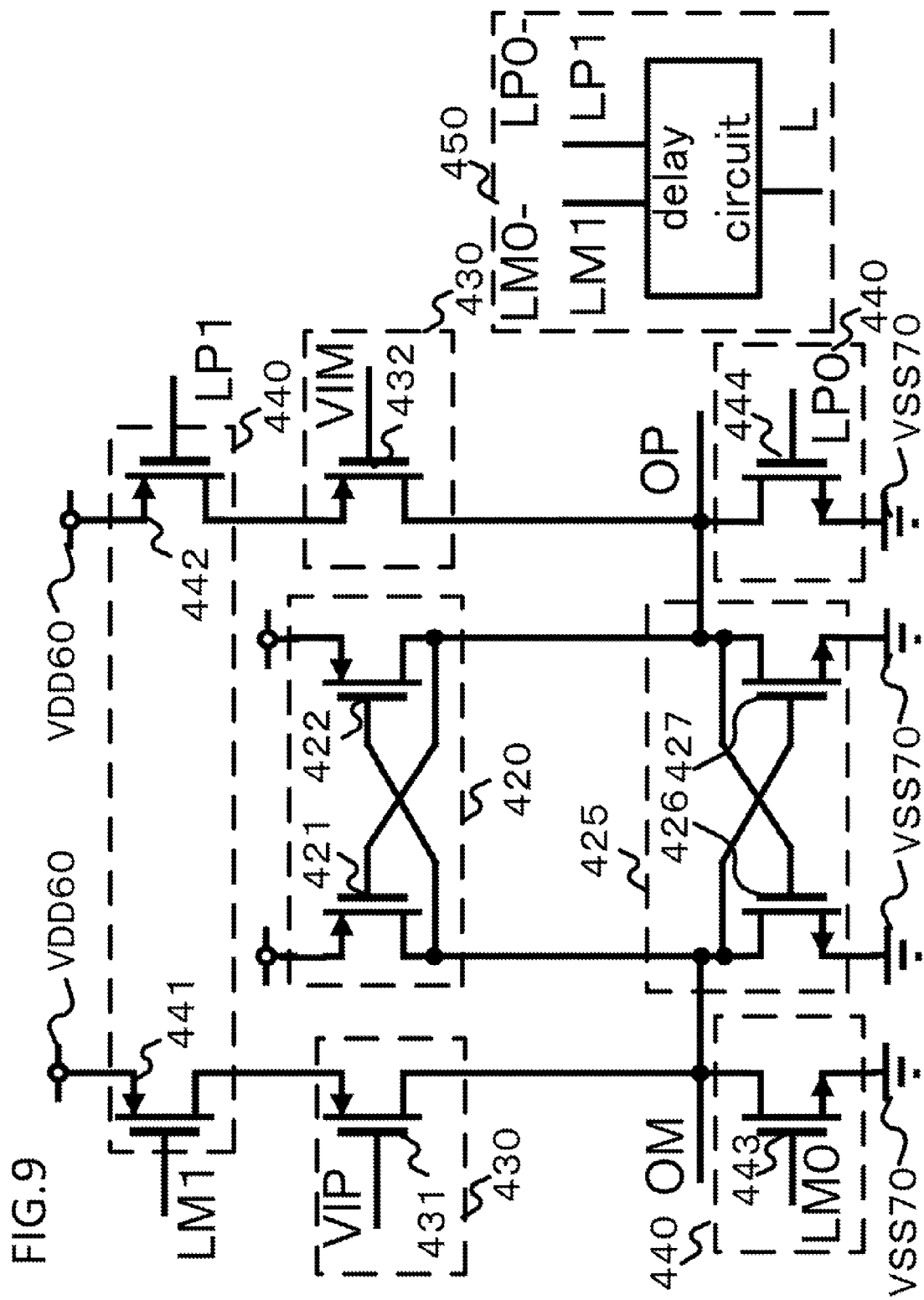
FIG. 9 is a circuit diagram illustrating a comparison circuit according to a fifth embodiment.

FIG. 9 is a circuit diagram illustrating a comparison circuit 400 according to the fifth embodiment. The comparison circuit 400 includes a P-type MOS transistor latch unit 420, an input unit 430, an N-type MOS transistor latch unit 425, a comparative operation control circuit 440, and a comparative operation setting circuit 450.

The comparative operation control circuit 440 includes N-type MOS transistors 443 and 444, and P-type MOS transistors 441 and 442.

The P-type MOS transistor 441 has a drain to be connected to the source of a P-type MOS transistor 431 of the input unit 430, a source to be connected to the high-potential VDD power source 60, and a gate for receiving a signal LM1.

The P-type MOS transistor 442 has a drain to be connected to the source of a P-type MOS transistor 432 of the input unit 430, a source to be connected to the high-potential VDD power source 60, and a gate for receiving a signal LP1.

The P-type MOS transistor 441 supplies the high-potential VDD from the high-potential VDD power source 60 to the input unit 430 when the logic of the signal LM1 is "L", and blocks supply of the high-potential VDD from the high-potential VDD power source 60 to the input unit 430 when the logic is "H". The P-type MOS transistor 441 serves as a switch for connecting or blocking between the input unit 430 and the high-potential VDD power source 60.

The P-type MOS transistor 442 supplies the high-potential VDD from the high-potential VDD power source 60 to the input unit 430 when the logic of the signal LP1 is "L", and blocks supply of the high-potential VDD from the high-potential VDD power source 60 to the input unit 430 when the logic is "H". The P-type MOS transistor 442 serves as a switch for connecting or blocking between the input unit 430 and the high-potential VDD power source 60.

The N-type MOS transistor 443 has a source to be connected to a ground VSS power source 70, a drain to be connected to the drain of the P-type MOS transistor 431 of the input unit 430, and a gate for receiving a signal LM0.

Note that the drain of the N-type MOS transistor 443, the drain of the P-type MOS transistor 431 of the input unit 430, the drain of the P-type MOS transistor 421 of the P-type MOS transistor latch unit 420, and the drain of the N-type MOS transistor 426 of the N-type MOS transistor latch unit 425 are all connected to the node A within the comparison circuit 400. The comparison circuit 400 outputs an output signal OM from the node A.

The N-type MOS transistor 443 supplies the ground VSS from the ground VSS power source 70 to the input unit 430 when the logic of the signal LM0 is "H", and blocks supply of the ground VSS from the ground VSS power source 70 to the input unit 430 when the logic is "L". The N-type MOS transistor 443 serves as a switch for connecting or blocking between the input unit 430 and the ground VSS power source 70.

The N-type MOS transistor 444 has a source to be connected to the ground VSS power source 70, a drain to be connected to the drain of the P-type MOS transistor 432 of the input unit 430, and a gate for receiving a signal LP0.

Note that the drain of the N-type MOS transistor 444, the drain of the N-type MOS transistor 432 of the input unit 430, the drain of the P-type MOS transistor 422 of the P-type MOS transistor latch unit 420, and the drain of the N-type MOS transistor 427 of the N-type MOS transistor latch unit 425 are all connected to the node B within the comparison circuit 400. The comparison circuit 400 outputs an output signal OP from the node B.

The N-type MOS transistor 444 supplies the ground VSS from the ground VSS power source 70 to the input unit 430 when the logic of the signal LP0 is "H", and blocks supply of the ground VSS from the ground VSS power source 70 to the input unit 430 when the logic is "L". The N-type MOS transistor 444 serves as a switch for connecting or blocking between the input unit 430 and the ground VSS power source 70.

The input unit 430 includes the P-type MOS transistors 431 and 432. The P-type MOS transistor 431 has a drain to be connected to the drain of the P-type MOS transistor 421 of the P-type MOS transistor latch unit 420, a source to be connected to the drain of the N-type MOS transistor 443 of the comparative operation control circuit 440, and a gate for receiving an input signal VIP. The on resistance value of the P-type MOS transistor 431 varies according to the potential of the input signal VIP.

The P-type MOS transistor 432 has a drain to be connected to the drain of the P-type MOS transistor 422 of the P-type MOS transistor latch unit 420, a source to be connected to the drain of the N-type MOS transistor 444 of the comparative operation control circuit 440, and a gate for receiving a signal VIM. The on resistance value of the N-type MOS transistor 432 varies according to the potential of the signal VIM.

The P-type MOS transistor latch unit 420 includes the P-type MOS transistors 421 and 422. The N-type MOS transistor latch unit 425 includes the N-type MOS transistors 426 and 427.

The P-type MOS transistor 421 has a drain to be connected to the drain of the N-type MOS transistor 426, a source to be connected to the high-potential VDD power source 60, and a gate to be connected to the drain of the P-type MOS transistor 422.

The P-type MOS transistor 422 has a drain to be connected to the drain of the N-type MOS transistor 427, a source to be connected to the high-potential VDD power source 60, and a gate to be connected to the drain of the P-type MOS transistor 421.

The N-type MOS transistor 426 has a drain to be connected to the drain of the P-type MOS transistor 421, a gate to be connected to the drain of the N-type MOS transistor 427, and a source to be connected to the ground VSS 70.

The N-type MOS transistor 427 has a drain to be connected to the drain of the P-type MOS transistor 422, a gate to be connected to the drain of the N-type MOS transistor 426, and a source to be connected to the ground VSS 70.

The output signals OM and OP are output from the N-type MOS transistor latch unit 425. The output signal OM is connected to the node A between the drain of the N-type MOS transistor 426 and the drain of the P-type MOS transistor 421. The output signal OP is connected to the node B between the drain of the N-type MOS transistor 427 and the drain of the P-type MOS transistor 422.

The gate of the N-type MOS transistor 426 of the N-type MOS transistor latch unit 425 and the drain of the N-type MOS transistor 427 are connected to the node B, and the gate of the N-type MOS transistor 427 and the drain of the N-type MOS transistor 426 are connected to the node A. That is to say, the N-type MOS transistor 426 and the N-type MOS transistor 427 are connected crosswise to the nodes A and B, and accordingly, the N-type MOS transistor 426 and the N-type MOS transistor 427 amplify potential difference between the nodes A and B.

Thus, the N-type MOS transistor 426 of the N-type MOS transistor latch unit 425, the P-type MOS transistor 431, and the P-type MOS transistor 441 are serially connected between the high-potential VDD power source 60 and the ground VSS 70, and make up a first current route including the node A. The N-type MOS transistor 427 of the N-type MOS transistor latch unit 425, the P-type MOS transistor 432, and the P-type MOS transistor 442 are serially connected between the high-potential VDD power source 60 and the ground VSS 70, and make up a second current route including the node B.

Therefore, when the signals LM0, LM1, LP0, and LP1 are "H", supply of the high-potential VDD to the input unit 430 is blocked by the P-type MOS transistors 441 and 442, and the ground VSS is supplied to the input unit 430, the P-type MOS transistor latch unit 420, and the N-type MOS transistor latch unit 425 by the N-type MOS transistors 443 and 444.

As a result thereof, potential difference between the nodes A and B is 0, or almost eliminated.

On the other hand, when the signals LM0, LM1, LP0, and LP1 are "L", the high-potential VDD is supplied to the input unit 430 by the P-type MOS transistors 441 and 442, and the supply of the ground VSS to the P-type MOS transistor latch unit 420, the N-type MOS transistor latch unit 425, and the input unit 430 is blocked by the N-type MOS transistors 443 and 444.

In the above case, the on resistance of the P-type MOS transistor 431 varies according to the potential of the input signal VIP, and accordingly, upon the potential of the input signal VIP decreasing, the potential of the node A increases, and the on resistance of the N-type MOS transistor 432 varies according to the potential of the input signal VIM, and accordingly, upon the potential of the input signal VIM increasing contrary to the input signal VIP, the potential of the node B decreases.

On the other hand, conversely, upon the potential of the input signal VIP increasing, the potential of the node A decreases, and upon the potential of the input signal VIM decreasing, the potential of the node B increases.

The comparative operation setting circuit 450 is made up of a circuit similar to the comparative operation setting circuit 50 according to the first embodiment for driving the signals LM0 and LP0, and a circuit similar to the comparative operation setting circuit 50 for driving the signals LM1 and LP1. The circuits similar to the comparative operation setting circuit 50 include a delay circuit 451, and a logic circuit 456 for controlling the delay circuit 451. The delay circuit 451 and the logic circuit 456 are the same circuits as the delay circuit 51 and the logic circuit 56. Now, it goes without saying that delay between the signals LM0 and LP0, and delay between the signals LM1 and LP1 may be set to the same delay amount, or may be set separately, and further, of the above delays, any one alone may be set.

Thus, the comparison circuit 400 according to the fifth embodiment includes an input unit (430) made up of a first MOS transistor (P-type MOS transistor 431) for receiving a first signal (signal VIP) at the gate electrode, and a second MOS transistor (P-type MOS transistor 432) for receiving a second signal (signal VIM) at the gate electrode; a latch circuit (P-type MOS transistor latch circuit 420, N-type MOS transistor latch circuit 425) for amplifying potential difference between a first current route where an electric current is controlled by the first MOS transistor according to the voltage of the first signal, and a second current route where an electric current is controlled by the second MOS transistor according to the voltage of the second signal; a comparative operation setting unit (comparative operation setting circuit 450) including a first switch (P-type MOS transistor 441) for executing supply or blocking of supply of the high-potential VDD to the drain of the first MOS transistor by a third current route different from the first current route, a second switch (P-type MOS transistor 442) for executing supply or blocking of supply of the high-potential VDD to the drain of the second MOS transistor by a fourth current route different from the second current route, and a third switch (N-type MOS transistor 443) and a fourth switch (N-type MOS transistor 444) which execute supply or blocking of supply of the ground VSS to the first current route and the second current route; and a comparative operation control unit (comparative operation control circuit 440) for controlling supply or blocking of the first through fourth switches.

Thus, supply or blocking timing of any of the first through fourth switches is controlled, whereby the potentials of the first current route and the second current route before start of comparison can also be controlled.

As a result thereof, the potentials of the first current route and the second current route before start of comparison are controlled, whereby comparison error along with different properties relating to the gate voltages of on resistances of the first and second MOS transistors which receive input signals VIP and VIM can be controlled. Note that it goes without saying that comparison error can be controlled by controlling any of the first through fourth switches.

Further, the latch circuit includes the N-type MOS transistor latch unit 425 made up of an N-type MOS transistor (N-type MOS transistor latch circuit 426) making up the first current route, and an N-type MOS transistor (N-type MOS transistor 427) making up the second current route. Note that supply and blocking of supply of the ground VSS to the N-type MOS transistor latch unit 425 is executed by the first and second switches. The P-type MOS transistors making up the P-type MOS transistor latch unit are not included in the first current route and the second current route, and accordingly, capacitance parasitizing the first current route and the second current route decreases, and the response speed of the comparison circuit 400 becomes fast.

Sixth Embodiment

Figure 10:
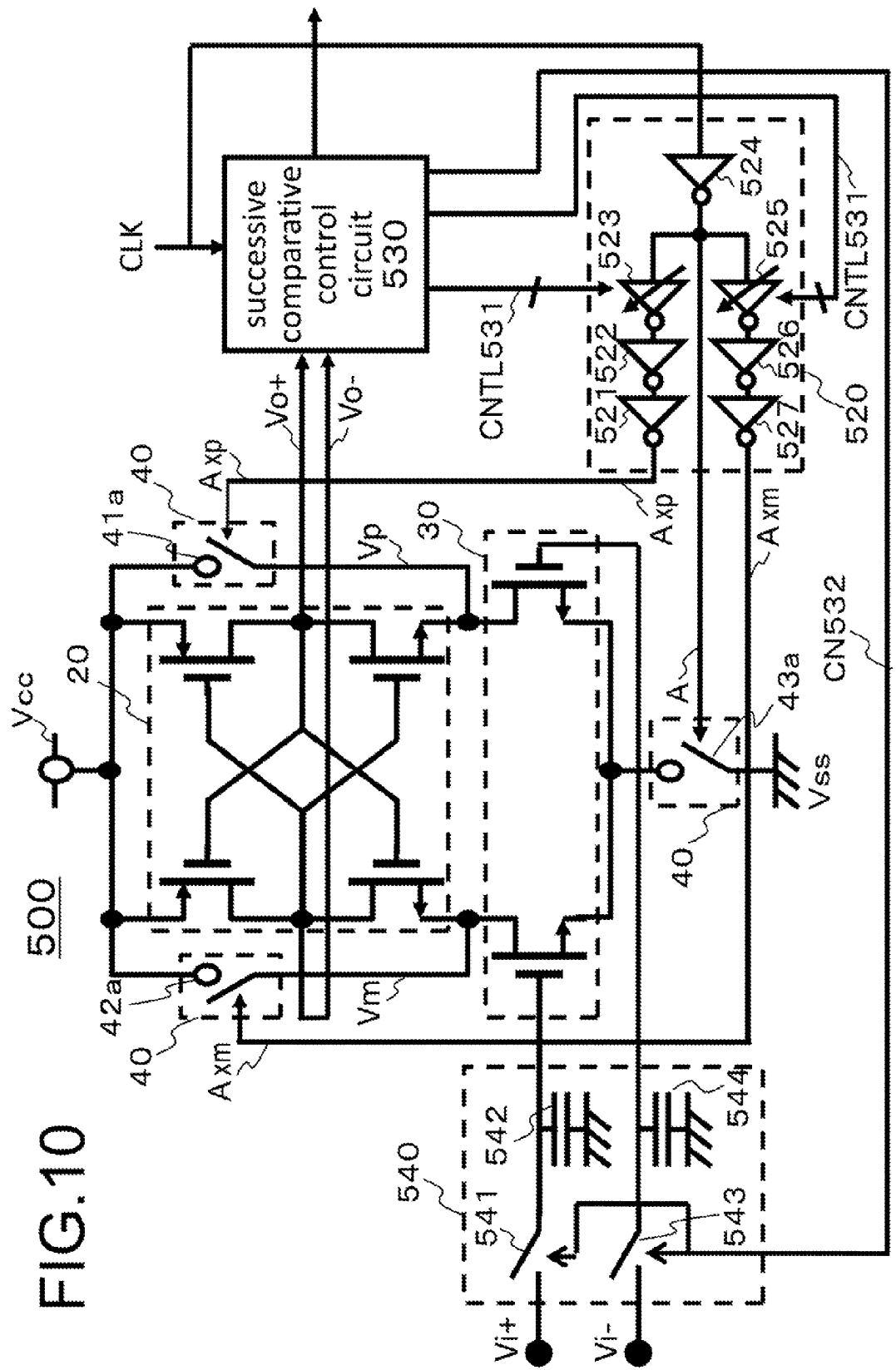
FIG. 10 illustrates an ADC (Analog Digital Converter) according to a sixth embodiment.

FIG. 10 illustrates an ADC (Analog Digital Converter) 500 according to the sixth embodiment. The ADC 500 according to the sixth embodiment includes the latch unit 20, input unit 30, and the comparative operation control circuit 40, of the comparison circuit 10 according to the first embodiment, and further includes a delay circuit 520, a successive comparative operation control circuit 530, and a sample-hold circuit 540.

The ADC 500 according to the sixth embodiment is a successive comparative type analog-to-digital conversion circuit using the latch unit 20, input unit 30, and comparative operation control circuit 40, described in the first embodiment.

Accordingly, detailed description will be omitted regarding the latch unit 20, input unit 30, and comparative operation control circuit 40, of the ADC 500 according to the sixth embodiment.

The input unit 30 receives a complementary input signal Vi, and generates an inversion complementary signal having inversion logic. The latch unit 20 receives and latches the inversion complementary signal thereof. The comparison control circuit 40 receives the signal from the successive comparative operation control circuit 530, and connects or disconnects the input unit 30 and the latch unit 20 to or from the high-potential power source Vcc according to the logic thereof. The latch unit 20 and the input unit 30 make up a comparator for comparing the potential of a signal Vi+ and the potential of a signal Vi− which make up the complementary input signal Vi.

Note that though the latch unit 20, the input unit 30, and the comparative operation control circuit 40 operate according to a signal CNTL531 output from the successive comparative operation control circuit 530, details regarding the operation thereof will be described with reference to FIG. 12.

The delay circuit 520 is configured of inverters 521, 522, 526, and 527, inverters 523 and 525 using variable signal delay time, and an inverter 524 which receives a signal CLK at the input terminal.

The inverter 524 receivers the signal CLK, and outputs an output signal A to a switch 43a included in the comparative operation control circuit 40 to connect or disconnect the ground potential and the input unit 30 according to the logic of the output signal A.

The inverters 523 and 525 receive the output signal A of the inverter 524 at the input terminals thereof. The inverter 522 receives the output signal of the inverter 523 at the input terminal thereof. The inverter 521 receives the output signal of the inverter 522 at the input terminal thereof. The inverter 522 outputs a signal Axp to one switch 41a of the comparative operation control circuit 40. Note that the one switch 41a connects or disconnects the input unit 30 and the latch unit 20 from the high-potential power source according to the logic of the signal Axp. With the inverter 523, signal delay time from the signal having been received at the input terminal until the output signal is output varies according to the signal CNTL531 made up of multiple digital signals. Examples of the inverter 523 will be shown in FIGS. 11A and 11B.

The inverter 526 receives the output signal of the inverter 525 at the input terminal thereof. The inverter 527 receives the output signal of the inverter 526 at the input terminal thereof. The inverter 527 outputs a signal Axm to the other switch 42a of the comparative operation control circuit 40. Note that the other switch 42a connects or disconnects the input unit 30 and the latch unit 20 from the high-potential power source according to the logic of the signal Axm. With the inverter 525, signal delay time from the signal having been received at the input terminal until the output signal is output varies according to the signal CNTL531 made up of multiple digital signals. Examples of the inverter 525 will be shown in FIGS. 11A and 11B.

Accordingly, with the binary numeral represented by the signal CNTL531, time difference can be set to between the output period of the signal Axm and the output period of the signal Axp.

The sample-hold circuit 540 includes a switch 541 for connecting or disconnecting an input terminal which receives one signal Vi+ making up the input signal Vin thereof, and a signal line to be connected to the input unit 30 according to the logic of the signal CLK, and a capacitance 542 to be connected to this signal line. Also, the sample-hold circuit 540 includes a switch 543 for connecting or disconnecting an input terminal which receives the other signal Vi− making up the input signal Vin thereof, and a signal line to be connected to the input unit 30 according to the logic of a control signal CN532 from the successive comparative operation control circuit 530, and a capacitance 544 to be connected to this signal line.

Accordingly, the sample-hold circuit 540 is a circuit for receiving the complementary input signal Vin, and sampling the voltage of one signal Vi+ making up the input signal Vin thereof, and the voltage of the complementary signal Vi− thereof.

The successive comparative operation control circuit 530 receives signals Vo+ and Vo− from the latch unit 20, and the signal CLK, outputs the signal CNTL531 to the delay circuit 520, and outputs the control signal CN532 to the sample-hold circuit 540. Note that the operation of the successive comparative operation control circuit 530, and the signal CNTL531 will be described in detail with reference to FIGS. 11 through 16. Also, the control signal CN532 will be described in detail with reference to FIG. 15.

Figure 11A:
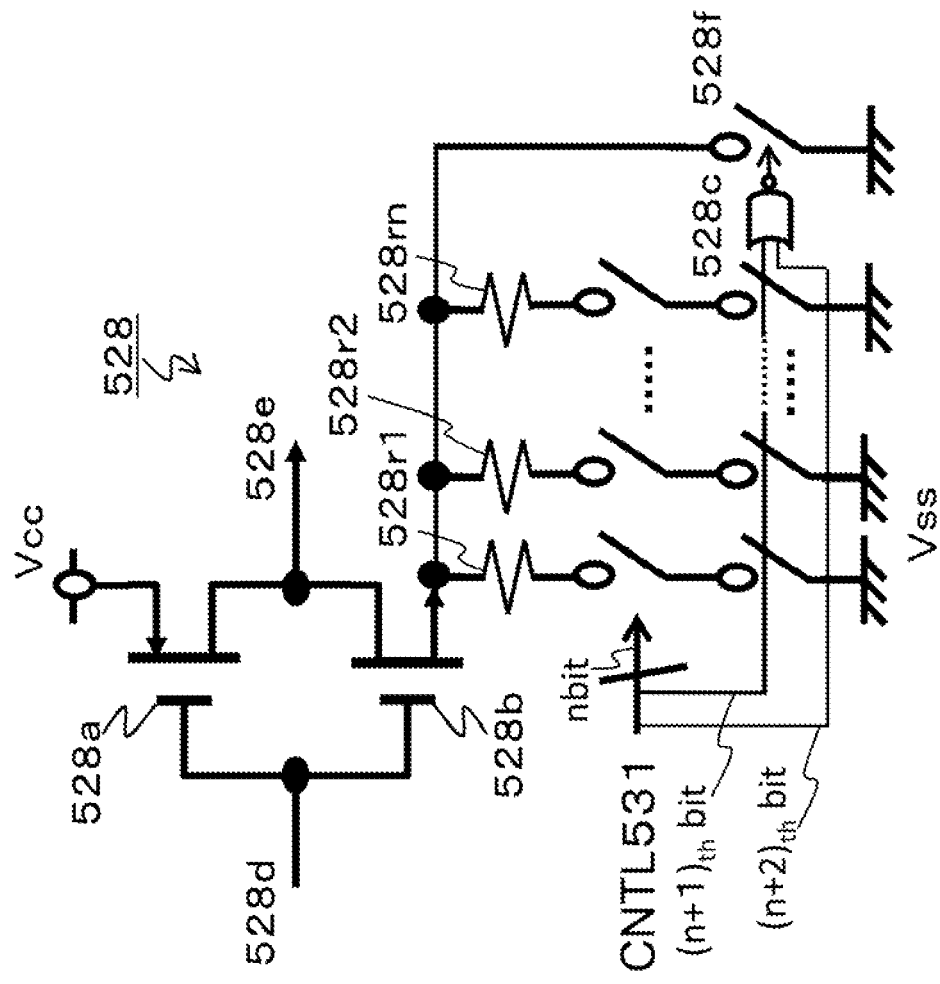

FIGS. 11A and 11B illustrate examples of the inverters 523 and 525 of the delay circuit 520. FIG. 11A illustrates an inverter 528 which sets delay time from input of an input signal until output of an output signal to be variable using multiple combination circuits made up of a resistor, and a switch for connecting or disconnecting the resistor thereof to or from the ground line. The inverter 528 is configured of n combination circuits from a combination circuit 528r1 to a combination circuit 528rn (n is a positive integer) made up of a P-type transistor 528a, an N-type transistor 528b, a resistor, and a switch, an NOR 528c, an input terminal 528d, and an output terminal 528e.

The P-type transistor 528a is a MOS transistor wherein the source thereof is connected to the high-potential power source Vcc, the drain thereof is connected to the output terminal 528e, and the gate thereof is connected to the input terminal 528d.

The P-type transistor 528b is a MOS transistor wherein the source thereof is connected to the n combination circuits from the combination circuit 528r1 to the combination circuit 528rn, the drain thereof is connected to the output terminal 528e, and the gate thereof is connected to the input terminal 528d.

The n combination circuits from the combination circuit 528r1 to the combination circuit 528rn are connected between the source of the N-type transistor 528b and the ground Vss in parallel. Each of the combination circuits is configured by a resistor, a first switch, and a second switch being connected serially, and one end of the resistor is connected to the source of the N-type transistor 528b, and the other end of the second switch is connected to the ground Vss.

If we say that the resistance value of the resistor of the combination circuit 528r1 is 1, the resistance value of the resistor of the combination circuit 528rn is the n'th power of 2. The signal CNTL531 is multiple signals representing n+2 binary codes, and signals representing the first bit to the n'th bit of the binary numeral that the signal CNTL531 represents are connected to the first switches from the combination circuit 528r1 to the combination circuit 528rn. The first switches from the combination circuit 528r1 to the combination circuit 528rn are connected when the signals of the signal CNTL531 are "1", and are disconnected when the signals of the signal CNTL531 have an inverse logic.

The signal corresponding to the n+1'th bit of the binary numeral that the signal CNTL531 represents is commonly connected to all the second switches from the combination circuit 528r1 to the combination circuit 528rn. If we say that the second switch of the inverter 528 operating as the inverter 523 operates to be connected when the logic of the signal thereof is "1", and operates to be disconnected when the logic is "0", the second switch of the inverter 528 operating as the inverter 525 operates to be connected when the logic of the signal thereof is "0", and operates to be disconnected when the logic is "1".

Also, the signal corresponding to the n+1'th bit of the binary numeral that the signal CNTL531 represents is connected to one input terminal of the NOR 528c. The NOR 528c inverts the logic of the signal thereof, and outputs the output signal thereof to the switch 528f. The switch 528f connects or disconnects the source of the N-type transistor 528b to or from the ground Vss according to the logic of the output signal from the NOR 528c.

The signal corresponding to the n+2'th bit of the binary numeral that the signal CNTL531 represents is connected to the other input terminal of the NOR 528c. The signal corresponding to the n+2'th bit of the signal CNTL531 is used when both of the signal Axp and the signal Axm are output without delay from the signal A.

Thus, with the inverter 528, operation that makes delay time from input of an input signal to output of an output signal variable according to the signal representing the n+1'th bit of the signal CNTL531, and operation that makes the delay time constant are switched. With the inverter 528, in the case of making the delay time variable, the magnitude of the delay time increases according to the magnitude of the binary numeral represented by from bit 1 to bit n of the signal CNTL531. This is because the greater the magnitude of the binary numeral represented by from bit 1 to bit n of the CNTL531 is, the smaller the electric current from the ground Vss flowing to the source of the N-type transistor 528b is.

FIG. 11B illustrates an inverter 529 which makes the delay time from input of an input signal to output of an output signal variable using multiple combination circuits made up of a resistor, and a switch for connecting or disconnecting the capacitance thereof to or from a ground line. The inverter 529 is configured of a P-type transistor 529a, an N-type transistor 529b, n combination circuits from a combination circuit 529c1 to a combination circuit 529cn (n is a positive integer) which are made up of capacitance and a switch, an input terminal 529d, a NOR 529f, and an output terminal 529e.

The P-type transistor 529a is a MOS transistor wherein the source thereof is connected to the high-potential power source Vcc, the drain thereof is connected to the output terminal 529e, and the gate thereof is connected to the input terminal 529d.

The N-type transistor 529b is a MOS transistor wherein the source thereof is connected to the ground Vss, the drain thereof is connected to the output terminal 529e, and the gate thereof is connected to the input terminal 528d.

The n combination circuits from the combination circuit 529c1 to the combination circuit 529cn (n is a positive integer) are connected between the output terminal 529e and the ground Vss in parallel. Each of the combination circuits is configured by capacitance, a first switch, and a second switch being serially connected, and one end of the capacitance is connected to the output terminal 529e, and the other end of the second switch is connected to the ground Vss.

If we say that the capacitance value of the capacitance of the combination circuit 529c1 is 1, the capacitance value of the capacitance of the combination circuit 529cn is the n'th power of 2. The signal CNTL531 is multiple signals representing binary numeral of n+2 bits, and signals representing the first bit to the n'th bit of the binary numeral that the signal CNTL531 represents are connected to the first switches from the combination circuit 529c1 to the combination circuit 529cn. The first switches from the combination circuit 529c1 to the combination circuit 529cn are connected when the signals of the signal CNTL531 are "1", and are disconnected when the signals of the signal CNTL531 have an inverse logic.

The signal corresponding to the n+1'th bit of the binary numeral that the signal CNTL531 represents is connected to one terminal of the NOR 529f, and the output of the NOR 529f is commonly connected to all the second switches from the combination circuit 529c1 to the combination circuit 529cn. If we say that the second switch of the inverter 529 operating as the inverter 523 operates to be connected when the logic of the signal thereof is "1", and operates to be disconnected when the logic is "0", the second switch of the inverter 529 operating as the inverter 525 operates to be connected when the logic of the signal thereof is "0", and operates to be disconnected when the logic is "1".

The signal corresponding to the n+2'th bit of the binary numeral that the signal CNTL531 represents is connected to the other input terminal of the NOR 529f. The signal corresponding to the n+2'th bit of the signal CNTL531 is used when both of the signal Axp and the signal Axm are output without delay from the signal A.

Thus, with the inverter 529, operation that makes delay time from input of an input signal to output of an output signal variable according to the signal representing the most significant bit of the signal CNTL531, and operation that makes the delay time constant are switched. With the inverter 529, in the case of making the delay time variable, the magnitude of the delay time increases according to the magnitude of the binary numeral represented by bit 1 to bit n of the signal CNTL531. This is because the greater the magnitude of the binary numeral represented by bit 1 to bit n of the CNTL531 is, the greater the capacitance value of the capacitance to be connected to the output terminal 529e of the N-type transistor is.

Figure 12A:
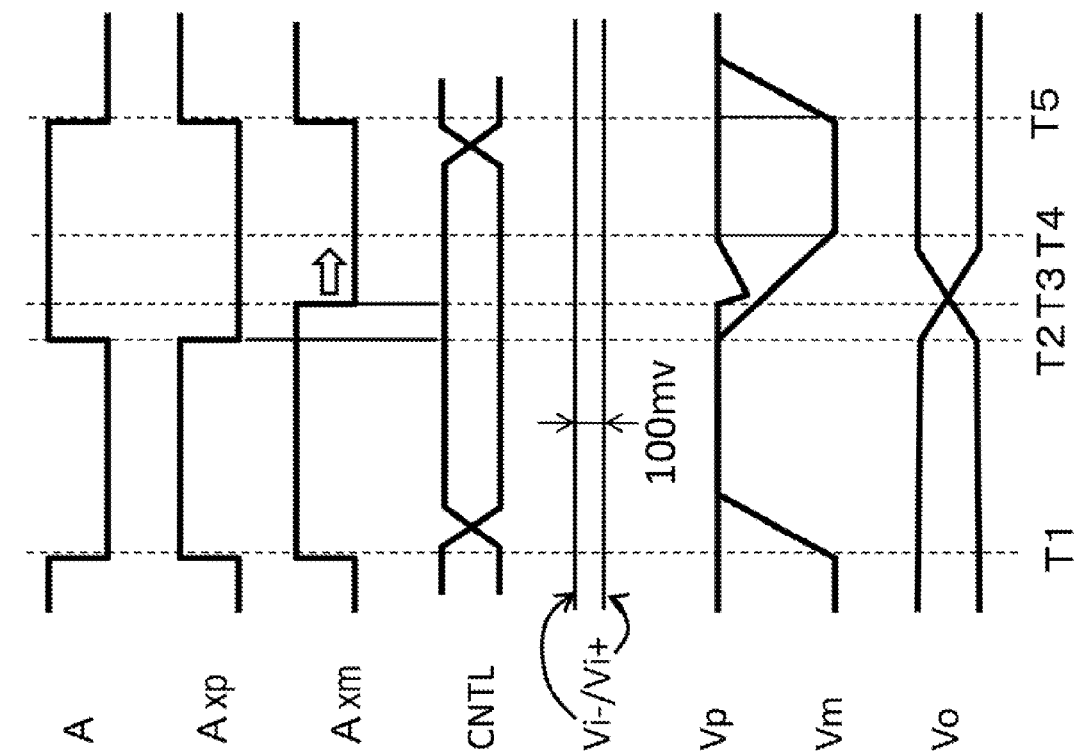
FIGS. 12A and 12B are diagrams for describing operation according to the sixth embodiment regarding a latch unit, an input unit, a comparative operation control circuit, and the delay circuit.
Figure 12B:
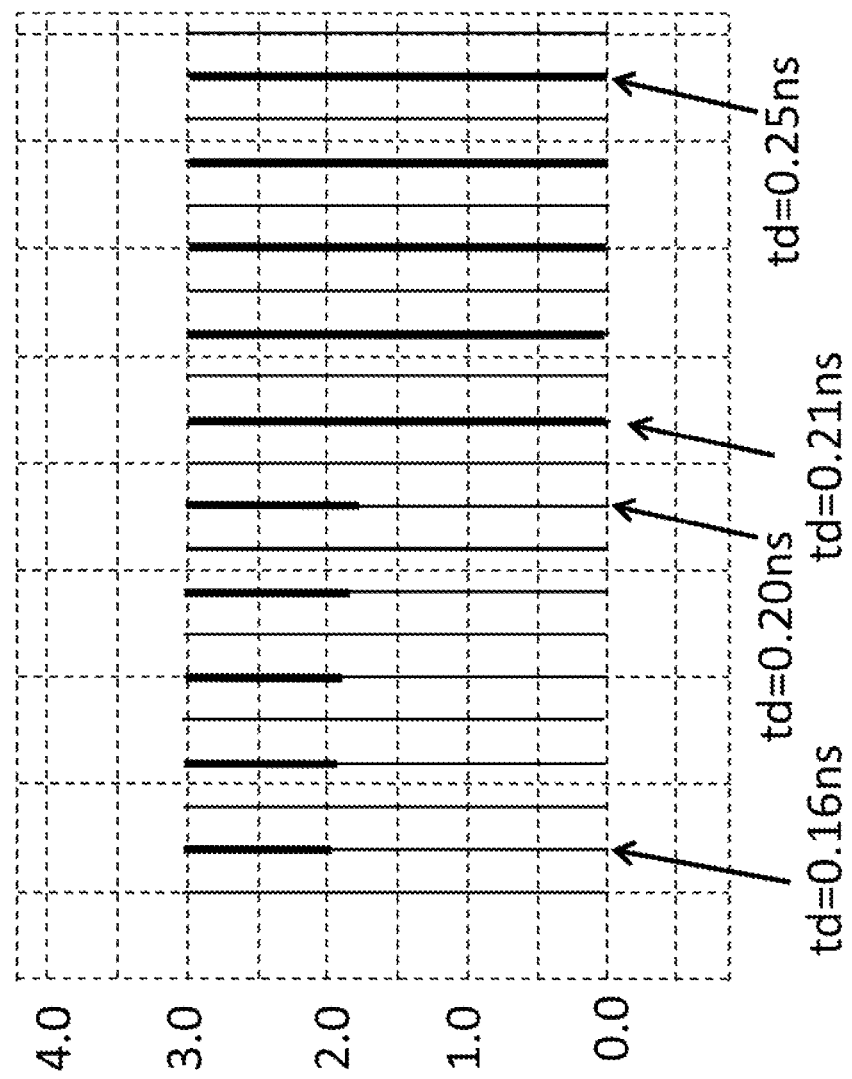

FIGS. 12A and 12B are diagrams for describing the operation according to the sixth embodiment regarding the latch unit 20, input unit 30, comparative operation control circuit 40, and delay circuit 520.

With the first embodiment, the latch unit 20, input unit 30, comparative operation control circuit 40, and delay circuit 520 make up a comparator which operates so as to compare the magnitude between the potential of the signal Vi+ and the potential of the signal Vi− making up the complementary input signal Vi input to the input unit 30.

However, with the sixth embodiment, operation for comparing the magnitude of the potential of an input signal with the first embodiment is a basic operation, and further, this basic operation is repeated while shifting the leading or trailing-edge period of the signals Axp and Axm, and accordingly, the latch unit 20, input unit 30, comparative operation control circuit 40, and delay circuit 520 operate as a circuit for detecting the complementary input signal input to the input unit 30, i.e., the potential difference of the complementary signal made up of the signal Vi+ and the signal Vi−.

FIG. 12A is a diagram illustrating the potential waveforms of the principal signals of the latch unit 20, input unit 30, comparative operation control circuit 40, and delay circuit 520, corresponding to the operation for shifting the trailing-edge period of the signals Axp and Axm.

The successive comparative operation control circuit 530 outputs the signal CNTL5312 having a logic representing time difference between the leading or trailing-edge periods of the signals Axp and Axm during point-in-time T1 through point-in-time T5 to cause the latch unit 20, input unit 30, comparative operation control circuit 40, and delay circuit 520 to execute one-time basic operation. Such as described in FIGS. 11A and 11B, whether the signal Axm or signal Axp is delayed is determined according to the logic of the most significant bit of the signal CNTL531. FIG. 12A illustrates an example wherein the signal Axm is delayed.

Thus, the delay circuit 520 delays and outputs the signal A and the signal A synchronized with the signal CLK, and also outputs the signal Axm according to the logic of the signal CNTL531. The leading edge of the signal A is point-in-time T2, and the trailing edges thereof are point-in-time T1 and point-in-time T5. The leading edges of the signal Axp are point-in-time T1 and point-in-time T5, and the trailing edges thereof are point-in-time T3. Also, the leading edge of the leading edges of the signal Axm are point-in-time T1 and point-in-time T5, and the trailing edge thereof is point-in-time T3. Here, time difference between the point-in-time T2 and point-in-time T3 indicates trailing-edge time difference between the signals Axp and Axm.

Note that FIG. 12A illustrates the operation of each circuit for one cycle of the signal CLK, and illustrates the operation of each circuit in the case that the trailing-edge time difference between the signals Axp and Axm represented by the signal CNTL is 0.21 ns. However, before the point-in-time T1, the successive comparative operation control circuit 530 increases the trailing-edge time difference between the signals Axp and Axm represented by the logic of the signal CNTL in increments of 0.01 ns for each two cycle.

The signal Vi to be input to the input unit 30 is a complementary signal, and in FIG. 12A, the difference between the signal Vi+ and signal Vi− making up the complementary input signal Vi is kept in 100 mv.

At the point-in-time T1, upon the logic of the signal A turning to "L", and the logics of the signals Axp and Axm turning to "H", the switch of the comparative operation control circuit 40 connects the latch unit 20 and the high-potential power source Vcc, and connects the input unit 30 and the ground Vss, and accordingly, the logics of the signals Vp and Vm latched by the latch unit 20 both turn to "H".

Subsequently, at the point-in-time T2, upon the logic of the signal A turning to "H", and the logic of the signal Axp turning to "L", the logic of the signal Vm begins to operate toward "L". On the other hand, at the point-in-time T3, the logic of the signal Axm also turns to "L", and the logic of the signal Vp also begins to operate toward "L". Here, the potential of the signal Vi− is lower than the potential of the signal Vi+, and accordingly, speed wherein the logic of the signal Vp proceeds to "L" is faster than speed wherein the logic of the signal Vm proceeds to "L". However, point-in-time when the logic of the signal Vp begins to proceed to "L" is T3 that is slower than T2, and accordingly, the potential of the signal Vm first exceeds the operation threshold of the latch unit 20.

As a result thereof, at point-in-time T4, according to the operation of the latch unit 20, the logic of the signal Vm turns to "L", and the logic of the signal Vp turns to "H". As a result thereof, the logic of an output signal Vo changes at the point-in-time T3.

Subsequently, at point-in-time T5, upon the logic of the signal A turning to "L", and the logics of the signals Axp and Axm turning to "H" again, the latch unit 20, input unit 30, comparative operation control circuit 40, and delay circuit 520 return to the state at the point-in-time again.

FIG. 12B is a diagram representing change in the signal Vm when repeating the operation from the point-in-time T1 to point-in-time T5 while changing trailing-edge time difference td between the signals Axp and Axm from 0.16 ns to 0.25 ns.

In FIG. 12B, the vertical axis represents potentials, and the horizontal axis indicates elapse of time. Thin solid lines indicate the trailing-edge point-in-time of the signal CLK. Also, heavy solid lines indicate change in the potential of the signal Vm.

For example, when the time difference td of the trailing edges of the signals Axp and Axm represented by the logic of the signal CNTL is 0.2 ns, this indicates that the potential of the signal Vm has changed between 3 V and 1.8 V.

Also, when the time difference td is 0.21 ns, this indicates that the potential of the signal Vm has changed between 3 V and 0 V.

In the event that the time difference td is equal to or smaller than 0.20 ns, this indicates that the logic of the signal Vm latched by the latch unit 20 is "H" after comparative operation. Also, upon the time difference td reaching equal to or greater than 0.21 ns, this indicates that the logic of the signal Vm latched by the latch unit 20 is "L" after comparative operation. That is to say, the logic of the signal Vm or signal Vp after latch changes with time difference td=0.21 ns as a border.

Thus, in the case that there is potential difference between the signal Vi− and signal Vi+, upon observing change in the logic of the signal Vm or signal Vp latched by the latch unit 20 while changing the time difference td of the trailing edges of the signals Axp and Axm represented by the logic of the signal CNTL, the time difference td to cause change in the logic of the signal Vm or signal Vp as to the above time difference td after comparative operation can be detected.

Therefore, it can be found that relationship of the potential difference between the signal Vi+ and signal Vi+ making up the input signal Vi, and the time difference td can be obtained beforehand.

Further, relationship of the logic of the signal CNTL, and the time difference td of the trailing edges of the signals Axp and Axm is uniquely determined such as described in FIGS. 11A and 11B, and accordingly, relationship of the potential difference between the signal Vi− and signal Vi+, and the logic of the signal CNTL is uniquely determined.

Figure 13:
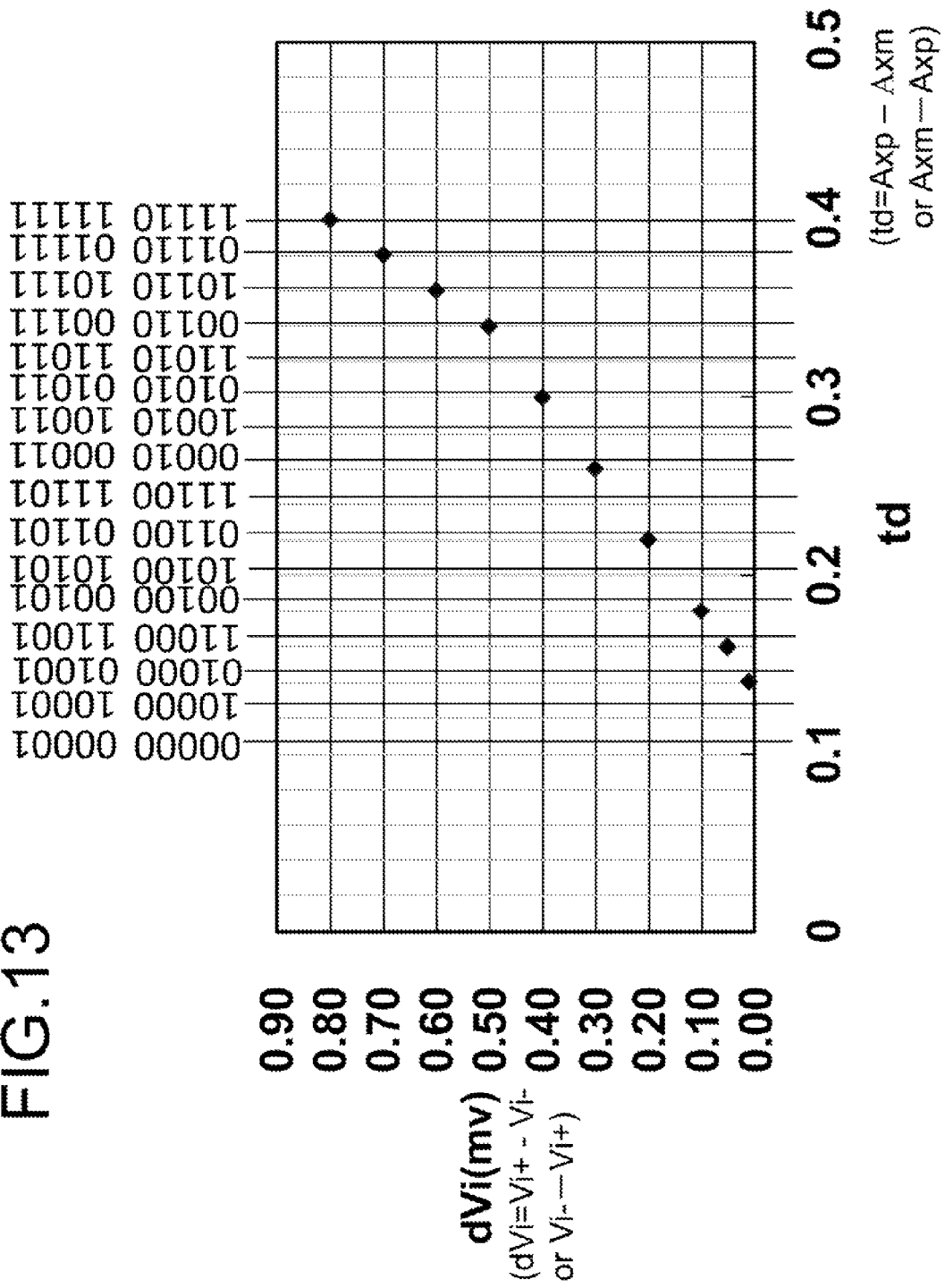
FIG. 13 is a diagram representing relationship of the logic of a signal, trailing time difference of signals, and potential difference between signals making up an input signal.

FIG. 13 is a diagram representing relationship of the logic of the signal CNTL, the time difference td of the trailing edges of the signal Axp and signal Axm, the potential difference between the signal Vi− and signal Vi+ making up the input signal Vi.

In FIG. 13, the horizontal axis on the lower side represents the time difference td, the vertical axis represents the potential difference between the signal Vi− and signal Vi+ making up the input signal Vi, and the horizontal axis on the upper side indicates the binary numeral that the signal CNTL 531 corresponding to the time difference td represents.

According to FIG. 13, the relationship of the potential difference between the signal Vi− and signal Vi+, and the time difference td of the trailing edges of the signals Axp and Axm used for changing the logic of the signal Vm or Vp indicates monotone increase. In more detail, for example, if we represent this relationship such as (potential difference, td), relationship of (0.01, 0.15), (0.05, 0.17), (0.1, 0.2), (0.2, 0.23), (0.3, 0.27), (0.4, 0.3), (0.5, 0.33), (0.6, 0.37), (0.7, 0.39), and (0.8, 0.41) is shown. Note that relationship of "the time difference td" and "the potential difference between the signal Vi− and signal Vi+" can be obtained by circuit simulation based on the circuit diagram of the latch unit 20, input unit 30, comparative operation control circuit 40, and delay circuit 520 shown in FIG. 10.

The binary numerals shown in the upper portion of the drawing are disposed in the positions corresponding to "the time difference td of the trailing edges of the signals Axp and Axm" obtained when the signal CNTL531 representing the binary numerals thereof is input. The upper stage of the binary numerals shown in the upper portion of the drawing indicates binary numerals used for delaying only the trailing-edge period of the signal Axm with the trailing-edge period of the signal Axp being fixed as to the trailing-edge period of the signal A. On the other hand, the binary numerals on the lower stage indicate binary numerals used for delaying only the trailing-edge period of the signal Axp with the trailing-edge period of the signal Axm being fixed as to the trailing-edge period of the signal A.

If we describe the correspondence as (binary, tpd), for example, this yields correspondences of (00000, 0.12 ns), (00001, 0.12 ns), (10000, 0.14 ns), (10001, 0.14 ns), (01000, 0.16 ns), (01001, 0.16 ns), (11000, 0.18 ns), (11001, 0.18 ns), (00100, 0.20 ns), (00101, 0.20 ns), (10100, 0.22 ns), (10101, 0.22 ns), (01100, 0.24 ns), (01101, 0.24 ns), (11100, 0.26 ns), (11101, 0.26 ns), (00010, 0.28 ns), (00011, 0.28 ns), (10010, 0.30 ns), (10011, 0.30 ns), (01010, 0.32 ns), (01011, 0.32 ns), (11010, 0.34 ns), (11011, 0.34 ns), (00110, 0.36 ns), (00111, 0.36 ns), (10110, 0.38 ns), (10111, 0.38 ns), (01110, 0.40 ns), (01111, 0.40 ns), (11110, 0.42 ns), and (11111, 0.42 ns).

Note that the above correspondences can be obtained by executing circuit simulation regarding the inverters 528 and 529 shown in FIGS. 11A and 11B.

Figure 14:
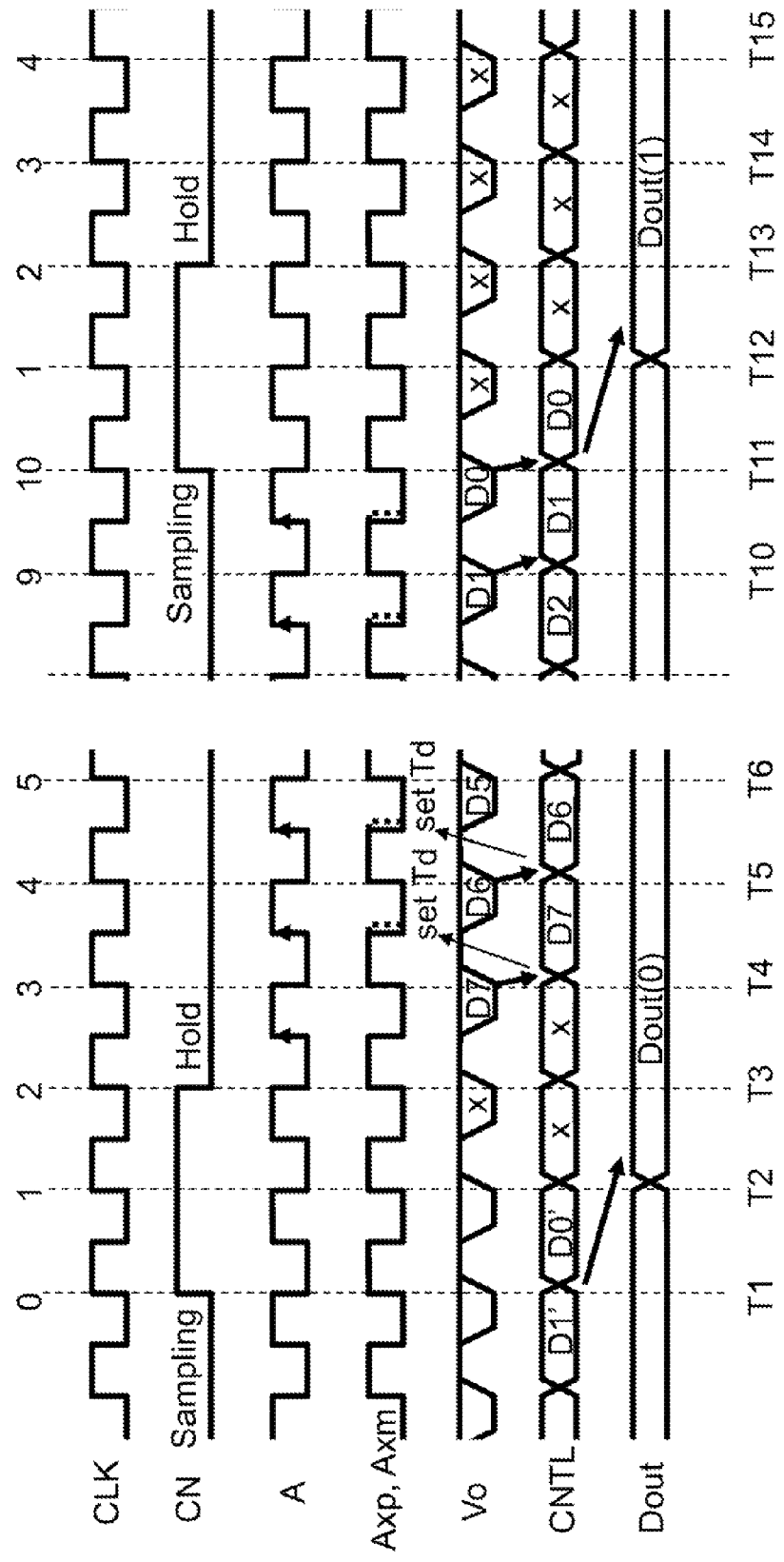
FIG. 14 illustrates operation waves when detecting potential difference of complementary signals made up of signals according to the ADC circuit according to the sixth embodiment.

FIG. 14 illustrates an operation waveform when detecting the potential difference between the complementary signal made up of the signal Vi+ and signal Vi− by the ADC circuit 500 according to the sixth embodiment.

The signal CLK is a clock signal which repeats logic "H" and "L" in a constant cycle. The control signal CN532 is a control signal to be output from the successive comparative operation control circuit 530. When the logic of the control signal CN532 of the sample-hold circuit 540 is "H", i.e., during from the point-in-time T1 to the point-in-time T3, when the switches 541 and 543 connect the input terminal and the capacitances 542 and 544, sample the potentials of the signal Vi+ and signal Vi−, and the logic of the control signal CNT532 is "L", i.e., during from the point-in-time T3 to the point-in-time T8, and during from the point-in-time T10 to the point-in-time T12, the potentials of the signal Vi+ and signal Vi− are held.

The signal A is a logic inversion signal of the signal CLK synchronized with the signal CLK, to be output from the inverter 524 which received the signal CLK. The signal Axp is output from the inverter 524 which received the signal CLK to the switch 41a of the comparative control circuit 40 via the inverters 523, 522, and 521. The signal Axm is output from the inverter 524 which received the signal CLK to the switch 42a of the comparative control circuit 40 via the inverters 525, 526, and 527.

If we say that signals making up the complementary signal Vo are one signal Vo+ and the other signal Vo−, these signals have the same voltage when the signal A falls. On the other hand, when the signal A rises, the latch unit 20 latches the logic of the signal Vm and the logic of the signal Vp, and outputs these to the successive comparative operation control circuit 530 as signals Vo+ and Vo−.

The signal CNTL531 is output from the successive comparative operation control circuit 530 to the inverter 523 or inverter 525 in sync with the signal CLK (i.e., from the input signal Vi having been sampled and held until point-in-time T12 from point-in-time T3 for each point-in-time). The signal CNTL531 represents a binary numeral determining td=|Axp−Axm|. Accordingly, the latch unit 20, input unit 30, comparative operation control circuit 40, and delay circuit 520 executes comparison between the potential of the signal Vi+ and the potential of the signal Vi− using td=|Axp−Axm| controlled by the successive comparative operation control circuit 530. Note that description will be made regarding a method for detecting and digitizing difference between the potential of the signal Vi+ and the potential of the signal Vi− according to the control of the successive comparative operation control circuit 530, and control thereof, with reference to the flowchart in FIG. 15.

After the operations of a series of the latch unit 20, input unit 30, comparative operation control circuit 40, and delay circuit 520, a digital signal Dout representing the difference between the potential of the signal Vi+ and the potential of the signal Vi− detected by the successive comparative operation control circuit 530 is output by the successive comparative operation control circuit 530 at the point-in-time T2 and point-in-time T9.

Figure 15:
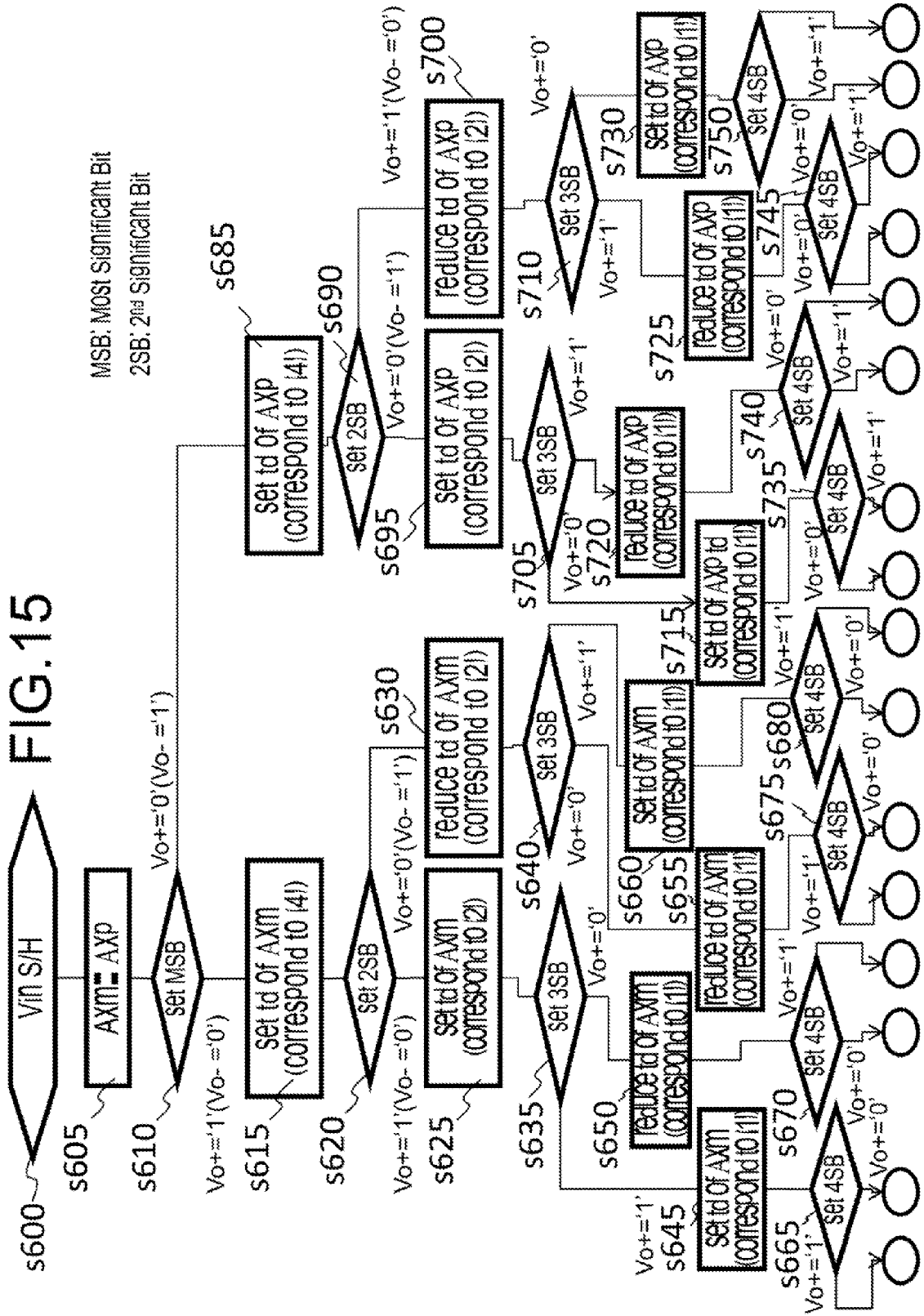
FIG. 15 is a flowchart for describing the control of a calculation executed by a successive comparative operation control circuit, and a detection method of difference input potentials executed by the control thereof.

FIG. 15 is a flowchart for describing the control of td=|Axp−Axm| executed by the successive comparative operation control circuit 530, and a method for detecting the difference between the potential of the signal Vi+ and the potential of the signal Vi− executed by the control thereof.

s600: The successive comparative operation control circuit 530 outputs a control signal 532 to the sample-hold circuit 540, and samples and holds the input signal Vi. Next, the flow proceeds to s605.

s605: The successive comparative operation control circuit 530 outputs the signal CNTL531 to the delay circuit 520, and sets td=|Axp−Axm|=0. That is to say, delays of the signals Axp and Axm from the signal A are 0 ns. Next, the flow proceeds to s610.

s610: The delay circuit 520 executes signal output operation for receiving the signal CLK, and outputting the signal A, signal Axp, and signal Axm. Subsequently, the successive comparative operation control circuit 530 receives the signal Vo+ and signal Vo− output from the latch unit 20, and when the logic of the signal Vo+ is "H", determines that the potential of the signal Vi+ is higher than the potential of the signal Vi−, sets the most significant bit to "1", and the flow proceeds to s615. On the other hand, when the logic of the signal Vo+ is "L", the successive comparative operation control circuit 530 determines that the potential of the signal Vi+ is lower than the potential of the signal Vi−, sets the most significant bit to "0", and the flow proceeds to s685.

s615: The successive comparative operation control circuit 530 outputs the signal CNTL531 to the delay circuit 520, sets delay of the signal Axp from the signal A to 0 ns, sets delay of the signal Axm from the signal A to 0.3 ns, and sets td=|Axp−Axm|=0.3 ns. Next, the flow proceeds to s620.

s620: The delay circuit 520 executes signal output operation similar to s610. Next, the successive comparative operation control circuit 530 determines that the potential of the signal Vi+ is higher than the potential +0.4 V of the signal Vi− when the logic of the signal Vo+ is "H", sets the second bit to "1", and the flow proceeds to s625. On the other hand, the successive comparative operation control circuit 530 determines that the potential of the signal Vi+ is lower than the potential +0.4 V of the signal Vi− when the logic of the signal Vo+ is "L", sets the second bit to "0", and the flow proceeds to s630.

s625: The successive comparative operation control circuit 530 outputs the signal CNTL531 to the delay circuit 520, sets delay of the signal Axp from the signal A to 0 ns, sets delay of the signal Axm from the signal A to 0.36 ns, and sets td=|Axp−Axm|=0.36 ns. Next, the flow proceeds to s635.

s635: The delay circuit 520 executes signal output operation similar to s610. Next, the successive comparative operation control circuit 530 determines that the potential of the signal Vi+ is higher than the potential +0.6 V of the signal Vi− when the logic of the signal Vo+ is "H", sets the third bit to "1", and the flow proceeds to s645. On the other hand, the successive comparative operation control circuit 530 determines that the potential of the signal Vi+ is lower than the potential +0.6 V of the signal Vi− when the logic of the signal Vo+ is "L", sets the third bit to "0", and the flow proceeds to s650.

s645: The successive comparative operation control circuit 530 outputs the signal CNTL531 to the delay circuit 520, sets delay of the signal Axp from the signal A to 0 ns, sets delay of the signal Axm from the signal A to 0.38 ns, and sets td=|Axp−Axm|=0.38 ns. Next, the flow proceeds to s665.

s665: The delay circuit 520 executes signal output operation similar to s610. Next, the successive comparative operation control circuit 530 determines that the potential of the signal Vi+ is higher than the potential +0.7 V of the signal Vi− when the logic of the signal Vo+ is "H", sets the fourth bit to "1", and outputs the digital signal Dout representing a binary numeral (1111). On the other hand, the successive comparative operation control circuit 530 determines that the potential of the signal Vi+ is lower than the potential +0.7 V of the signal Vi− when the logic of the signal Vo+ is "L", sets the fourth bit to "0", and outputs the digital signal Dout representing a binary numeral (1110).

s650: The successive comparative operation control circuit 530 outputs the signal CNTL531 to the delay circuit 520, sets delay of the signal Axp from the signal A to 0 ns, sets delay of the signal Axm from the signal A to 0.34 ns, and sets td=|Axp−Axm|=0.34 ns. Next, the flow proceeds to s670.

s670: The delay circuit 520 executes signal output operation similar to s610. Next, the successive comparative operation control circuit 530 determines that the potential of the signal Vi+ is higher than the potential +0.5 V of the signal Vi− when the logic of the signal Vo+ is "H", sets the fourth bit to "1", and outputs the digital signal Dout representing a binary numeral (1101). On the other hand, the successive comparative operation control circuit 530 determines that the potential of the signal Vi+ is lower than the potential +0.5 V of the signal Vi− when the logic of the signal Vo+ is "L", sets the fourth bit to "0", and outputs the digital signal Dout representing a binary numeral (1100).

s630: The successive comparative operation control circuit 530 outputs the signal CNTL531 to the delay circuit 520, sets delay of the signal Axp from the signal A to 0 ns, sets delay of the signal Axm from the signal A to 0.22 ns, and sets td=|Axp−Axm|=0.22 ns. Next, the flow proceeds to s640.

s640: The delay circuit 520 executes signal output operation similar to s610. Next, the successive comparative operation control circuit 530 determines that the potential of the signal Vi+ is higher than the potential +0.2 V of the signal Vi− when the logic of the signal Vo+ is "H", sets the third bit to "1", and the flow proceeds to s660. On the other hand, the successive comparative operation control circuit 530 determines that the potential of the signal Vi+ is lower than the potential +0.2 V of the signal Vi− when the logic of the signal Vo+ is "L", sets the third bit to "0", and the flow proceeds to s655.

s660: The successive comparative operation control circuit 530 outputs the signal CNTL531 to the delay circuit 520, sets delay of the signal Axp from the signal A to 0 ns, sets delay of the signal Axm from the signal A to 0.26 ns, and sets td=|Axp−Axm|=0.26 ns. Next, the flow proceeds to s680.

s680: The delay circuit 520 executes signal output operation similar to s610. Next, the successive comparative operation control circuit 530 determines that the potential of the signal Vi+ is higher than the potential +0.3 V of the signal Vi− when the logic of the signal Vo+ is "H", sets the fourth bit to "1", and outputs the digital signal Dout representing a binary numeral (1011). On the other hand, the successive comparative operation control circuit 530 determines that the potential of the signal Vi+ is lower than the potential +0.3 V of the signal Vi− when the logic of the signal Vo+ is "L", sets the fourth bit to "0", and outputs the digital signal Dout representing a binary numeral (1010).

s655: The successive comparative operation control circuit 530 outputs the signal CNTL531 to the delay circuit 520, sets delay of the signal Axp from the signal A to 0 ns, sets delay of the signal Axm from the signal A to 0.18 ns, and sets td=|Axp−Axm|=0.18 ns. Next, the flow proceeds to s675.

s675: The delay circuit 520 executes signal output operation similar to s610. Next, the successive comparative operation control circuit 530 determines that the potential of the signal Vi+ is higher than the potential +0.1 V of the signal Vi− when the logic of the signal Vo+ is "H", sets the fourth bit to "1", and outputs the digital signal Dout representing a binary numeral (1001). On the other hand, the successive comparative operation control circuit 530 determines that the potential of the signal Vi+ is lower than the potential +0.1 V of the signal Vi− when the logic of the signal Vo+ is "L", sets the fourth bit to "0", and outputs the digital signal Dout representing a binary numeral (1000).

s685: The successive comparative operation control circuit 530 executes the same operation as with s615, and sets delay of the signal Axp from the signal A to 0.3 ns. Next, the flow proceeds to s690.

s690: The successive comparative operation control circuit 530 and the delay circuit 520 execute the same operation as with s620, the successive comparative operation control circuit 530 determines that the potential of the signal Vi− is higher than the potential +0.4 V of the signal Vi+ when the logic of the signal Vo+ is "L", sets the second bit to "0", and the flow proceeds to s695. On the other hand, the successive comparative operation control circuit 530 determines that the potential of the signal Vi− is lower than the potential +0.4 V of the signal Vi+ when the logic of the signal Vo+ is "H", sets the second bit to "1", and the flow proceeds to s700.

s695: The successive comparative operation control circuit 530 executes the same operation as with s625, and sets delay of the signal Axp from the signal A to 0.36 ns. Next, the flow proceeds to s705.

s705: The successive comparative operation control circuit 530 and the delay circuit 520 execute the same operation as with s635, the successive comparative operation control circuit 530 determines that the potential of the signal Vi− is higher than the potential +0.6 V of the signal Vi+ when the logic of the signal Vo+ is "L", sets the third bit to "0", and the flow proceeds to s715. On the other hand, the successive comparative operation control circuit 530 determines that the potential of the signal Vi− is lower than the potential +0.6 V of the signal Vi+ when the logic of the signal Vo+ is "H", sets the third bit to "1", and the flow proceeds to s720.

s715: The successive comparative operation control circuit 530 executes the same operation as with s645, and sets delay of the signal Axm from the signal A to 0.38 ns. Next, the flow proceeds to s735.

s735: The successive comparative operation control circuit 530 and the delay circuit 520 execute the same operation as with s665, the successive comparative operation control circuit 530 determines that the potential of the signal Vi− is higher than the potential +0.7 V of the signal Vi+ when the logic of the signal Vo+ is "L", sets the fourth bit to "0", and outputs the digital signal Dout representing a binary numeral (0000). On the other hand, the successive comparative operation control circuit 530 determines that the potential of the signal Vi− is lower than the potential +0.7 V of the signal Vi+ when the logic of the signal Vo+ is "H", sets the fourth bit to "1", and outputs the digital signal Dout representing a binary numeral (0001).

s720: The successive comparative operation control circuit 530 executes the same operation as with s650, and sets delay of the signal Axp from the signal A to 0.34 ns. Next, the flow proceeds to s740.

s740: The successive comparative operation control circuit 530 and the delay circuit 520 execute the same operation as with s670, the successive comparative operation control circuit 530 determines that the potential of the signal Vi− is higher than the potential +0.5 V of the signal Vi+ when the logic of the signal Vo+ is "L", sets the fourth bit to "0", and outputs the digital signal Dout representing a binary numeral (0010). On the other hand, the successive comparative operation control circuit 530 determines that the potential of the signal Vi− is lower than the potential +0.5 V of the signal Vi+ when the logic of the signal Vo+ is "H", sets the fourth bit to "1", and outputs the digital signal Dout representing a binary numeral (0011).

s700: The successive comparative operation control circuit 530 executes the same operation as with s630, and sets delay of the signal Axp from the signal A to 0.22 ns. Next, the flow proceeds to s710.

s710: The successive comparative operation control circuit 530 and the delay circuit 520 execute the same operation as with s660, the successive comparative operation control circuit 530 determines that the potential of the signal Vi− is higher than the potential +0.2 V of the signal Vi+ when the logic of the signal Vo+ is "L", sets the third bit to "0", and the flow proceeds to s730. On the other hand, the successive comparative operation control circuit 530 determines that the potential of the signal Vi− is lower than the potential +0.2 V of the signal Vi+ when the logic of the signal Vo+ is "H", sets the third bit to "1", and the flow proceeds to s725.

s730: The successive comparative operation control circuit 530 executes the same operation as with s660, and sets delay of the signal Axp from the signal A to 0.26 ns. Next, the flow proceeds to s750.

s750: The successive comparative operation control circuit 530 and the delay circuit 520 execute the same operation as with s680, the successive comparative operation control circuit 530 determines that the potential of the signal Vi− is higher than the potential +0.3 V of the signal Vi+ when the logic of the signal Vo+ is "L", sets the fourth bit to "0", and outputs the digital signal Dout representing a binary numeral (0100). On the other hand, the successive comparative operation control circuit 530 determines that the potential of the signal Vi− is lower than the potential +0.3 V of the signal Vi+ when the logic of the signal Vo+ is "H", sets the fourth bit to "1", and outputs the digital signal Dout representing a binary numeral (0101).

s725: The successive comparative operation control circuit 530 executes the same operation as with s675, and sets delay of the signal Axp from the signal A to 0.18 ns. Next, the flow proceeds to s745.

s745: The successive comparative operation control circuit 530 and the delay circuit 520 execute the same operation as with s645, the successive comparative operation control circuit 530 determines that the potential of the signal Vi– is higher than the potential +0.1 V of the signal Vi+ when the logic of the signal Vo+ is "L", sets the fourth bit to "0", and outputs the digital signal Dout representing a binary numeral (0110). On the other hand, the successive comparative operation control circuit 530 determines that the potential of the signal Vi– is lower than the potential +0.1 V of the signal Vi+ when the logic of the signal Vo+ is "H", sets the fourth bit to "1", and outputs the digital signal Dout representing a binary numeral (0111).

FIGS. 16A and 16B are tables for describing a method for deriving relationship between the binary numeral that the signal CNTL531 represents, and the binary numeral that the digital signal Dout to be output by the analog-to-digital conversion by the ADC 500 represents in the case that there is no linearity with correlation with difference between the potential of the signal Vi– and the potential of the signal Vi+.

FIG. 16A is a table indicating the signal CNTL531, correlation with the difference between the potential of the signal Vi– and the potential of the signal Vi+, and relationship between the signal CNTL531 and the binary numeral that the digital signal Dout represents.

With the table shown in FIG. 16A, a first column indicates binary numerals that the signal CNTL531 represents, a second column indicates time difference td between the trailing edge of the signal Axp and the trailing edge of the signal Axm, a third column indicates difference ΔVi between the potential of the signal Vi– and the potential of the signal Vi+, and a fourth column indicates binary numeral codes (binary numerals) that the signal Dout represents, i.e., indicates results obtained by converting the analog value indicating the difference ΔVi between the potential of the signal Vi– and the potential of the signal Vi+ into a digital value by the ADC 500.

Therefore, such as the following, in the case that there is no linearity with correlation between the binary numeral that the signal CNTL531 represents, and the difference between the potential of the signal Vi– and the potential of the signal Vi+, analog-to-digital conversion is executed.

First, with regard to the inverter circuit shown in FIGS. 11A and 11B, according to circuit simulation, the td in the second column is obtained while changing the binary numeral represented by the signal CNTL531 in the first column from (11110) to (00000), and further from (00001) to (11111).

Next, circuit simulation is executed such as shown in FIGS. 12A and 12B, and when the input signal Vi is input so as to obtain the ΔVi in the third column, tPD is obtained whereby the logics of the signals Vm and Vp are inverted, and such as shown in FIG. 13, correlation data of the difference between the potential of the signal Vi– and the potential of the signal Vi+, and the binary numeral represented by the signal CNTL531 is obtained.

Next, such as the table in FIG. 16A, the signal CNTL531 corresponding to an equal interval point of the difference value between the potential of the signal Vi– and the potential of the signal Vi+ is obtained form the table such as 0.1, 0.2, and so on through 0.8.

Next, in accordance with the flowchart in FIG. 15, analog-to-digital conversion is executed using the signal CNTL531 corresponding to the equal interval point to obtain the digital value represented by the signal Dout shown in the fourth column, i.e., binary numeral.

FIG. 16B is a table indicating correlation between the signal CNTL531, and the difference between the potential of the signal Vi– and the potential of the signal Vi+, and relationship between the signal CNTL531 and the binary numerals that the digital signal Dout represents.

With the table shown in FIG. 16B, a first column indicates the difference ΔVi between the potential of the signal Vi– and the potential of the signal Vi+, a second column indicates time difference td between the trailing edge of the signal Axp and the trailing edge of the signal Axm, a third column indicates the binary numerals represented by the signal CNTL531, and a fourth column indicates binary codes (binary numerals) that the signal Dout represents, i.e., indicates results obtained by converting the analog value indicating the difference ΔVi between the potential of the signal Vi– and the potential of the signal Vi+ into a digital value by the ADC 500.

Therefore, such as the following, in the case that there is no linearity with correlation between the binary numeral that the signal CNTL531 represents, and the difference between the potential of the signal Vi– and the potential of the signal Vi+, analog-to-digital conversion is executed.

First, with regard to the inverter circuit shown in FIGS. 11A and 11B, according to the same method as with the description in FIG. 16A, correlation data between the difference between the potential of the signal Vi– and the potential of the signal Vi+, and the binary numeral represented with the signal CNTL531 is obtained.

Next, in accordance with the flowchart in FIG. 15, three times of additions or deletions are changed using the signal CNTL531, and the last signal CNTL531 is stored.

Next, the binary numeral of the signal Dout corresponding to the last signal CNTL531 is determined using the table in FIG. 16B.

Thus, as in FIG. 13, even in the event that correlation between the signal CNTL531, and the difference between the potential of the signal Vi– and the potential of the signal Vi+ has no proportionality relation, analog-to-digital conversion can be executed with the successive comparative operation in FIG. 15.

Thus, the ADC 500 according to the sixth embodiment is a successive comparative type analog-to-digital conversion device including a comparator including an input unit (input unit 30) for receiving a complementary input signal to generate an inversion complementary signal having the inversion logic of the complementary input signal, and a latch unit (latch unit 20) for latching the inversion complementary signal; a comparative operation control circuit 40 including a first switch (switch 41a) for connecting or disconnecting the latch unit and the input unit to or from a high-potential power source according to the logic of a first signal (signal Axp or signal Axm), and a second switch (switch 42a) for connecting or disconnecting the latch unit and the input unit to or from the high-potential power source according to the logic of a second signal (signal Axp or signal Axm); a delay circuit 520 for outputting the first signal (signal Axp or signal Axm), and the second signal (signal Axp or signal Axm); and a successive operation control circuit for outputting a control signal for controlling the period of logic change of the first signal for controlling disconnection of the first switch (switch 41a), and the period of logic change of the second signal for controlling disconnection of the second switch (switch 42a) based on the logic of a signal latched by the latch unit.

With a common successive comparative type analog-to-digital conversion device, in order to convert potential difference between the potential of the signal Vi+ and the potential of the signal Vi− making up the complementary input signal Vi, the difference between the potential of the signal Vi+ and the potential of the signal Vi− has to be determined according to a series of operation for comparing both potentials while changing the degree of potential increase/decrease as to one of the potential of the sampled signal Vi+, and the potential of the signal Vi−.

When executing increase/decrease in potential, a method has to be used wherein electric charge secured at the time of sampling of a signal is stored. Therefore, with a common successive comparative type analog-to-digital conversion device, one electrode of capacitance is connected to the node in which the electric charge secured at the time of sampling of a signal is sealed, and voltage applied to the other electrode is changed, thereby changing the degree of increase/decrease in potential.

Thus, with a common successive comparative type analog-to-digital conversion device, capacitance to be connected to the node in which the electric charge secured at the time of sampling of a signal is sealed results in increase in circuit area.

However, with the ADC 500 according to the sixth embodiment, the same effects as with a case where increase/decrease in potential is added to one of the potential of the signal Vi+ and the potential of the signal Vi− with potential comparative operation are created by providing difference between the disconnection period of the first switch to be connected to the drain of an NMOS transistor which receives the signal Vi+ of the input unit 30, and the disconnection period of the second switch to be connected to the drain of an NMOS transistor which receives the signal Vi− of the input unit 30.

Thus, capacitance to be connected to the node in which the electric charge secured at the time of sampling of a signal is sealed can be eliminated from the ADC 500 according to the sixth embodiment. Accordingly, the circuit area of the ADC 500 according to the sixth embodiment can be reduced as compared to a common successive comparative type analog-to-digital circuit.

The ADC 500 according to the sixth embodiment is further an analog-to-digital conversion device including a circuit for sampling and holding one signal and the other signal of the complementary input signal.

The delay circuit 520 of the ADC 500 according to the sixth embodiment is an analog-to-digital conversion device including a first circuit for outputting the first signal, and a second circuit for outputting the second signal, the first circuit and the second circuit include an inverter circuit, and the inverter circuit includes a logic inversion circuit for inverting the logic of a signal to be input, and a circuit for adding load capacitance to the output signal line of the logic inversion circuit according to the binary numeral represented by the control signal.

The delay circuit 520 of the ADC 500 according to the sixth embodiment is an analog-to-digital conversion device including a first circuit for outputting the first signal, and a second circuit for outputting the second signal, the first circuit and the second circuit include an inverter circuit, and the inverter circuit includes a logic inversion circuit for inverting the logic of a signal to be input, and a circuit for making resistance between the logic inversion circuit and a ground power source line variable according to the binary numeral represented by the control signal.

Seventh Embodiment

With the sixth embodiment, the switches 41*a* and 42*a* of the comparative operation control circuit 40 have been single switches. However, the switches 41*a* and 42*a* of an ADC 600 according to the seventh embodiment include multiple switches.

Figure 17:
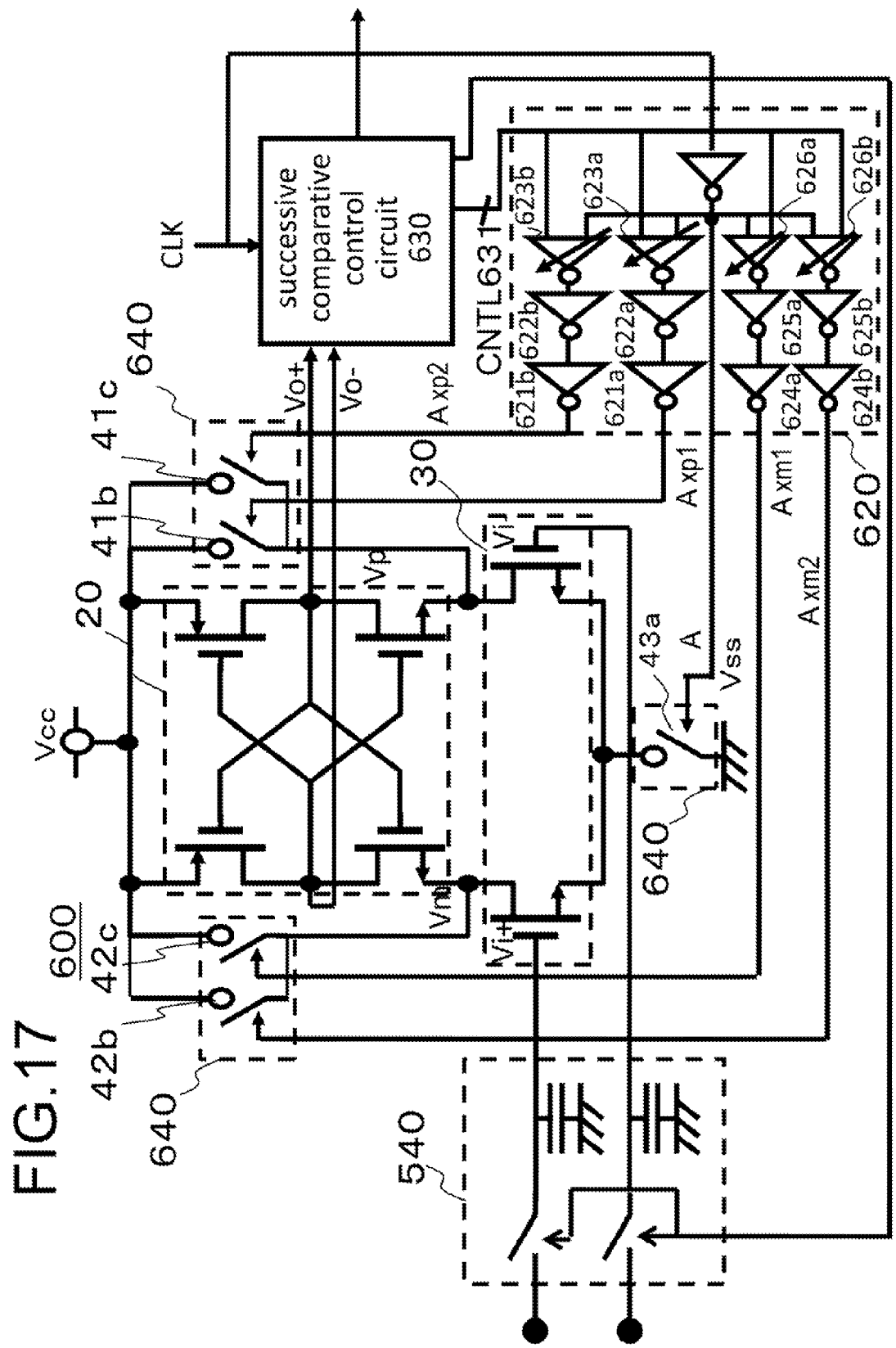
FIG. 17 illustrates an ADC according to a seventh embodiment.

FIG. 17 illustrates the ADC 600 according to the seventh embodiment. The ADC 600 according to the seventh embodiment includes a latch unit 20, an input unit 30, a comparative operation control circuit 640, a delay circuit 620, a successive comparative operation control circuit 630, and a sample-hold circuit 540.

The latch unit 20, input unit 30, and sample-hold circuit 540 are the same circuits described in the sixth embodiment, and description regarding the configuration and operation thereof will be omitted.

The successive comparative operation control circuit 630 causes the latch unit 20, input unit 30, comparative operation control circuit 640, and delay circuit 620 to execute operation shown in the flowchart in FIG. 15 for comparing the potential of the signal Vi+ and the potential of the signal Vi− making up the complementary input signal Vi in sync with the signal CLK. As described later, in order to execute selection of one of signals Axp1 and Axp2, and selection of one of signals Axm1 and Axm2, to be output from the delay circuit 620, the number of bits of the binary numeral represented by a signal CNTL631 that the successive comparative operation control circuit 630 outputs is greater than the number of bits of the signal CNTL531 according to the sixth embodiment by one bit.

The delay circuit 620 includes inverters 621*a*, 622*a*, and 623*a* which output the signal Axp1, inverters 621*b*, 622*b*, and 623*b* which output the signal Axp2, inverters 624*a*, 625*a*, and 626*a* which output the signal Axm1, and inverters 624*b*, 625*b*, and 626*b* which output the signal Axm2. Here, time difference between the logic trailing edge of the signal A and the trailing edge of the signal Axp1, and time difference between the logic trailing edge of the signal A and the trailing edge of the signal Axp2 are changed according to the binary numeral represented by the signal CNTL631.

Also, time difference between the logic trailing edge of the signal A and the trailing edge of the signal Axm1, and time difference between the logic trailing edge of the signal A and the trailing edge of the signal Axm2 are changed according to the binary numeral represented by the signal CNTL631.

The comparative operation control circuit 640 includes switches 41*b* and 41*c* for connecting or disconnecting the latch unit 20 and the input unit 30 to or from the high-potential power source Vcc according to the logics of the signals Axp1 and Axp2, switches 42*b* and 42*c* for connecting or disconnecting the latch unit 20 and the input unit 30 to or from the high-potential power source Vcc according to the logics of the signals Axm1 and Axm2, and a switch 43*a* for connecting or disconnecting the input unit 30 to or from the ground power source Vss according to the logic of the signal A.

Note that, with the above configuration, the number of switches used for connecting or disconnecting the high-potential power source Vcc to or from the source of the N-type transistor of which the gate is connected to the signal Vi− has been two, and the number of switches used for connecting or disconnecting the high-potential power source Vcc to or from the source of the N-type transistor of which the gate is connected to the signal Vi+ has been two, but each of these is not restricted to two, and rather may be multiple of two or more. In this case, the signal Axpn (n is a positive integer equal to or greater than 2), and the signal Axmn (n is a positive integer equal to or greater than 2), to be connected to each of the switches are each independent, and the trailing-edge period of the logic of each signal is also set independently.

Thus, the disconnecting periods of the switches 41b, 41c, 42b, and 42c are adjusted by the comparative operation control circuit 640, whereby the lowering speeds of the potentials of the signals Vm and Vp between the latch unit 20 and the input unit 30 can be adjusted at the time of comparing the potentials of the signals Vi+ and Vi−. Thus, the difference between the potential of the signal Vi+ and the potential of the signal Vi−, and correlation between the trailing-edge period of the signal A, and the trailing-edge periods of the signals Axp1 and Axp2, shown in FIG. 13 can be adjusted. Note that it goes without saying that even when there are multiple switches, multiple signals Axp, and multiple signals Axm, the disconnecting period of each switch can be adjusted.

Thus, the ADC 600 according to the seventh embodiment is a successive comparative analog-to-digital conversion device including a comparator including an input unit (input unit 30) for receiving a complementary input signal to generate a inversion complementary signal having the inversion logic of the complementary input signal, and a latch unit (latch unit 20) for latching the inversion complementary signal; a comparative operation control circuit 640 including multiple first switches (switches 41b and 41c) for connecting or disconnecting the latch unit and the input unit to or from the high-potential power source according to the logic of each of multiple first signals (signals Axp or signals Axm), and multiple second switches (switches 42b and 42c) for connecting or disconnecting the latch unit and the input unit to or from the high-potential power source according to the logic of each of multiple second signals (signals Axp or signals Axm); a delay circuit 520 for outputting each of the first signals (signals Axp or signals Axm), and each of the second signals (signals Axp or signals Axm); and a successive operation control circuit for outputting a control signal which controls the period of logic change of each of the first signals for controlling disconnection of each of the multiple first switches (switches 41a), and the period of logic change of each of the second signals for controlling disconnection of each of the multiple second switches (switches 42a).

Eighth Embodiment

With the sixth embodiment, the signals Axp and Axm are output from an inverter for corrugating disposed on the subsequent stage of an inverter for generating signal delay at the delay circuit 520. On the other hand, with the eighth embodiment, the signals Axp and Axm are output from an inverter for generating signal delay at a delay circuit 720.

Figure 18:
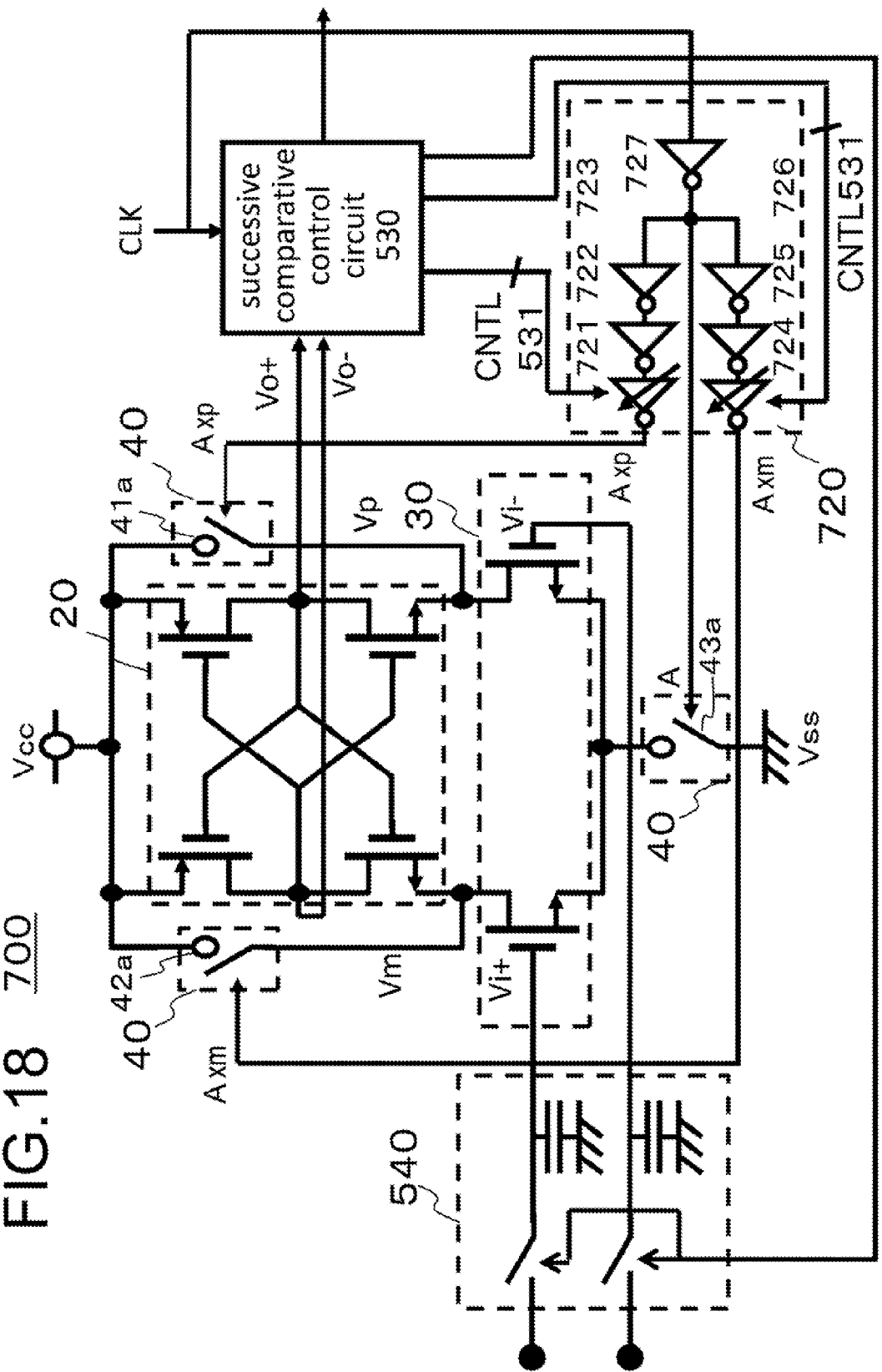
FIG. 18 illustrates an ADC circuit according to an eighth embodiment.

FIG. 18 illustrates an ADC circuit 700 according to the eighth embodiment. The ADC 600 according to the seventh embodiment includes a latch unit 20, an input unit 30, a comparative operation control circuit 40, a delay circuit 720, a successive comparative operation control circuit 530, and a sample-hold circuit 540.

The latch unit 20, input unit 30, comparative operation control circuit 40, delay circuit 720, successive comparative operation control circuit 530, and sample-hold circuit 540 are the same circuits as described with the sixth embodiment, and description regarding configuration and operation thereof will be omitted.

The delay circuit 720 includes inverters 721, 722, 723, 724, 725, 726, and 727.

The inverter 727 receives the signal CLK and outputs the inversion signal thereof. The inverters 723 and 726 receive the signal to be output from the inverter 727, and output the inversion signal thereof. The inverters 722 and 725 receive the output signals from the inverters 723 and 726 and output the inversion signals thereof, respectively. The inverters 721 and 724 receive the signals to be output from the inverters 722 and 725 and output the inversion signals thereof as the signals Axp and Axm.

With the inverters 721 and 724, delay time from input of the input signal to output of the output signal varies according to the signal CNTL531.

Thus, with the delay circuit 720, time difference from the trailing edge of the signal A to the trailing edge of the signal Axp, and time difference from the trailing edge of the signal A to the trailing edge of the signal Axm are the same as with the delay circuit 520. However, with the delay circuit 720, the period of potential change at the time of the trailing edges of the logics of the signals Axp and Axm becomes long. This is because the signals output from the inverters 721 and 725 become the signals Axp and Axm as is without passing through an inverter for corrugating, and accordingly, the potential changes of the signals Axp and Axm become moderate.

Thus, time from start of disconnecting operation to end thereof between the high-potential power source Vcc, and the latch unit 20 and the input unit 30 by the switch 41a of the comparative operation control circuit 40 is longer than time required for disconnecting operation by the switch 41a at the ADC 500.

As a result thereof, the falling speeds of the potentials of the signals Vm and Vp between the latch unit 20 and the input unit 30 changes at the time of comparing the potentials of the signals Vi+ and Vi− as compared to the case of the ADC 500 according to the first embodiment.

Thus, the difference between the potential of the signal Vi+ and the potential of the signal Vi−, and correlation between the trailing-edge period of the signal A and the trailing-edge periods of the signals Axm1 and Axm2 and the signals Axp1 and Axp2, shown in FIG. 13, can be adjusted.

Thus, the ADC 700 according to the eighth embodiment is a successive comparative type analog-to-digital conversion device including a comparator including an input unit (input unit 30) for receiving a complementary input signal to generate a inversion complementary signal having the inversion logic of the complementary input signal, and a latch unit (latch unit 20) for latching the inversion complementary signal; a comparative operation control circuit 40 including a first switch (switch 41a) for connecting or disconnecting the latch unit and the input unit to or from a high-potential power source according to the logic of a first signal (signal Axp or signal Axm), and a second switch (switch 42a) for connecting or disconnecting the latch unit and the input unit to or from the high-potential power source according to the logic of a second signal (signal Axp or signal Axm); a delay circuit 520 including a first inverter (inverter 721) for outputting the first signal (signal Axp or signal Axm), and a second inverter (inverter 724) for outputting the second signal (signal Axp or signal Axm); and a successive operation control circuit for outputting a control signal for controlling the period of logic change of the first signal for controlling disconnection of the first switch (switch 41a), and the period of logic change of the second signal for controlling disconnection of the second switch (switch 42a) based on the logic of a signal latched by the latch unit.

The first inverter and the second inverter according to the eighth embodiment include a logic inversion circuit for inverting the logic of an input signal, and a circuit for adding load capacitance to an output signal line of the logic inversion circuit according to the binary numeral represented by the control signal.

The first inverter and the second inverter according to the eighth embodiment include a logic inversion circuit for inverting the logic of an input signal, and a circuit for varying resistance between the logic inversion circuit and the ground power source line according to the binary numeral represented by the control signal.

Ninth Embodiment

With the sixth embodiment, the signals Axp and Axm are output from an inverter for corrugating disposed on the subsequent stage of an inverter for generating signal delay at the delay circuit 520. On the other hand, with the ninth embodiment, the signals Axp and Axm are output from an inverter for generating signal delay at a delay circuit 820.

Figure 19:
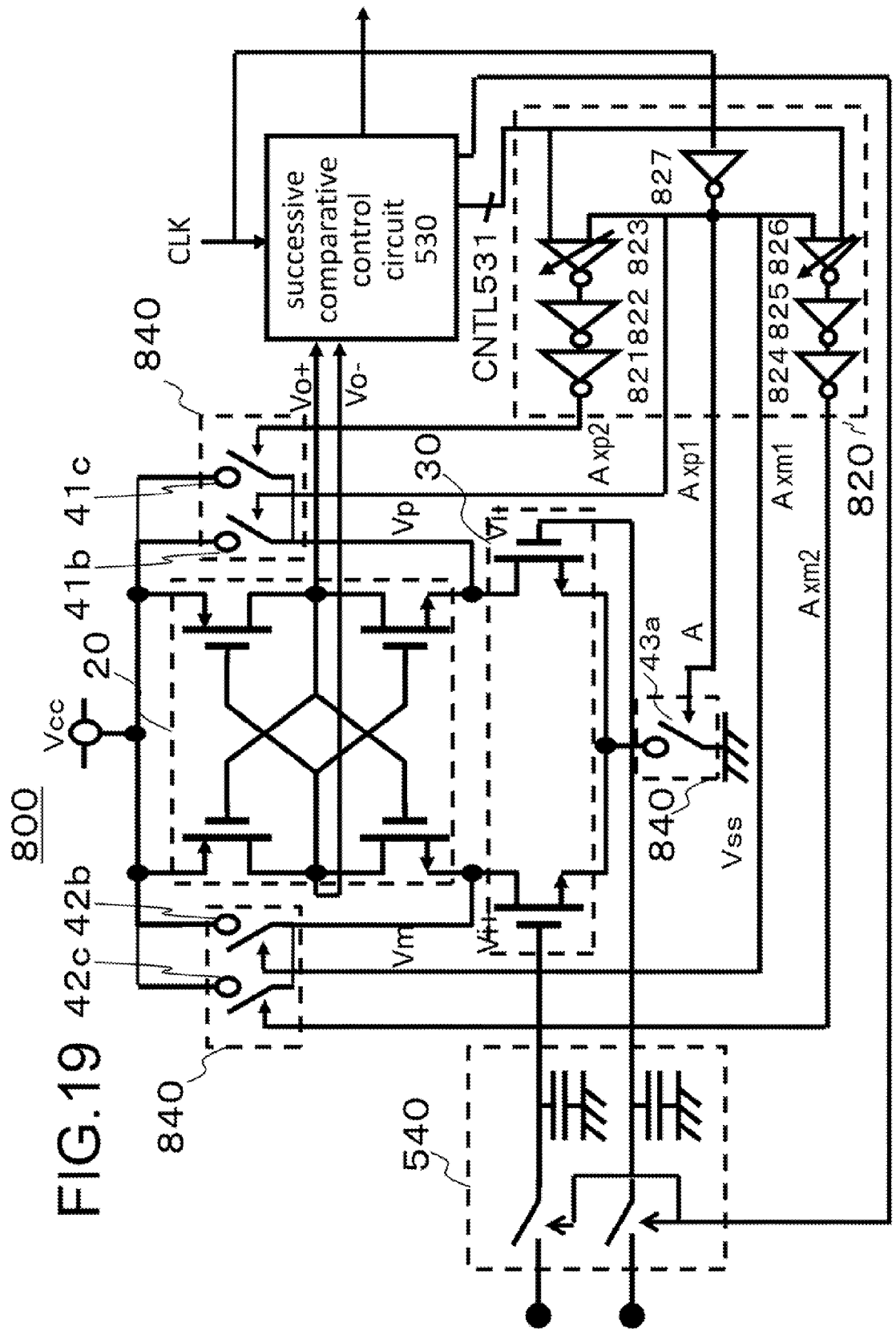
FIG. 19 illustrates an ADC circuit according to a ninth embodiment.

FIG. 19 illustrates an ADC circuit 800 according to the ninth embodiment. The ADC 800 according to the ninth embodiment includes a latch unit 20, an input unit 30, a comparative operation control circuit 40, a comparative operation control circuit 840, a delay circuit 820, a successive comparative operation control circuit 530, and a sample-hold circuit 540.

The latch unit 20, input unit 30, successive comparative operation control circuit 530, and sample-hold circuit 540 are the same circuits as described with the sixth embodiment, and description regarding configuration and operation thereof will be omitted.

The delay circuit 820 includes inverters 821, 822, 823, 824, 825, 826, and 827. The inverter 827 receives the signal CLK and outputs the inversion signal thereof to the inverters 823 and 826. The inverter 827 outputs the signal A, signal Axp1, and signal Axm1. The inverters 823 and 826 receive the output signal from the inverter 827 and output the inversion signal thereof to the inverters 822 and 825. The inverters 822 and 825 receive the output signals from the inverters 823 and 826 and output the inversion signal thereof to the inverters 821 and 824. The inverter 821 outputs the signal Axp2 to the comparative operation control circuit 840, and the inverter 824 outputs the signal Axm2 to the comparative operation control circuit 840.

The comparative operation control circuit 840 includes switches 41*b* and 41*c* for connecting or disconnecting the latch unit 20 and the input unit 30 to or from the high-potential power source Vcc according to the logics of the signals Axp1 and Axp2, switches 42*b* and 42*c* for connecting or disconnecting the latch unit 20 and the input unit 30 to or from the high-potential power source Vcc according to the logics of the signals Axm1 and Axm2, and a switch 43*a* for connecting or disconnecting the input unit 30 to or from the ground power source Vss according to the logic of the signal A.

Thus, disconnection between the latch unit 20 and input unit 30, and the high-potential power source Vcc by the switches 41*b* and 42*b*, and connection between the input unit 30 and the ground Vss by the switch 43*a* are simultaneously executed by the delay circuit 820. Also, after delay time according to the binary numeral represented by the signal CNTL531 of the successive comparative operation circuit 530 by the delay circuit 820, disconnection between the latch unit 20 and input unit 30, and the high-potential power source Vcc by the switches 41*c* and 42*c* is executed.

Thus, the disconnection periods of the switches 41*c* and 42*c* are adjusted by the delay circuit 820, and thus, when comparing the potentials of the signals Vi+ and Vi−, the falling speed of the potentials of the signals Vm and Vp between the latch unit 20 and the input unit 30 can be adjusted. Thus, the difference between the potential of the signal Vi+ and the potential of the signal Vi−, and correlation between the trailing-edge period of the signal A, and the trailing-edge periods of the signals Axm1 and Axm2 and the signals Axp1 and Axp2, shown in FIG. 13 can be adjusted.

Thus, the ADC 800 according to the ninth embodiment is a successive comparative analog-to-digital conversion device including a comparator including an input unit (input unit 30) for receiving a complementary input signal to generate a inversion complementary signal having the inversion logic of the complementary input signal, and a latch unit (latch unit 20) for latching the inversion complementary signal; a comparative operation control circuit 840 including a first switch (switch 41*c*) for connecting or disconnecting the latch unit and the input unit to or from a high-potential power source according to the logic of a first signal (signal Axp2 or signal Axm2), a second switch (switch 42*c*) for connecting or disconnecting the latch unit and the input unit to or from the high-potential power source according to the logic of a second signal (signal Axp2 or signal Axm2), and a third switch (switch 41*b*) and a fourth switch (switch 42*b*) for connecting or disconnecting the latch unit and the input unit to or from the high-potential power source according to the logic of a third signal (signal Axp1 or signal Axm1); a delay circuit 820 for outputting the first signal (signal Axp2 or signal Axm2), the second signal (signal Axp2 or signal Axm2), and the third signal (signal Axp1 or signal Axm1); and a successive operation control circuit 530 for outputting a control signal for controlling the period of logic change of the first signal for controlling disconnection of the first switch (switch 41*c*), and the period of logic change of the second signal for controlling disconnection of the second switch (switch 42*c*) based on the logic of a signal latched by the latch unit.

Tenth Embodiment

With the sixth embodiment, the sample-hold circuit 540 samples and holds the potential of the signal Vi+ and the potential of the signal Vi− making up the input signal Vin. On the other hand, an ADC 900 according to the tenth embodiment includes no sample-hold circuit 540. The reason thereof is because with the tenth embodiment, sample-hold of the potential of the input signal Vi is executed at a circuit for inputting the input signal Vi to the ADC 900 illustrated by the tenth embodiment.

Figure 20:
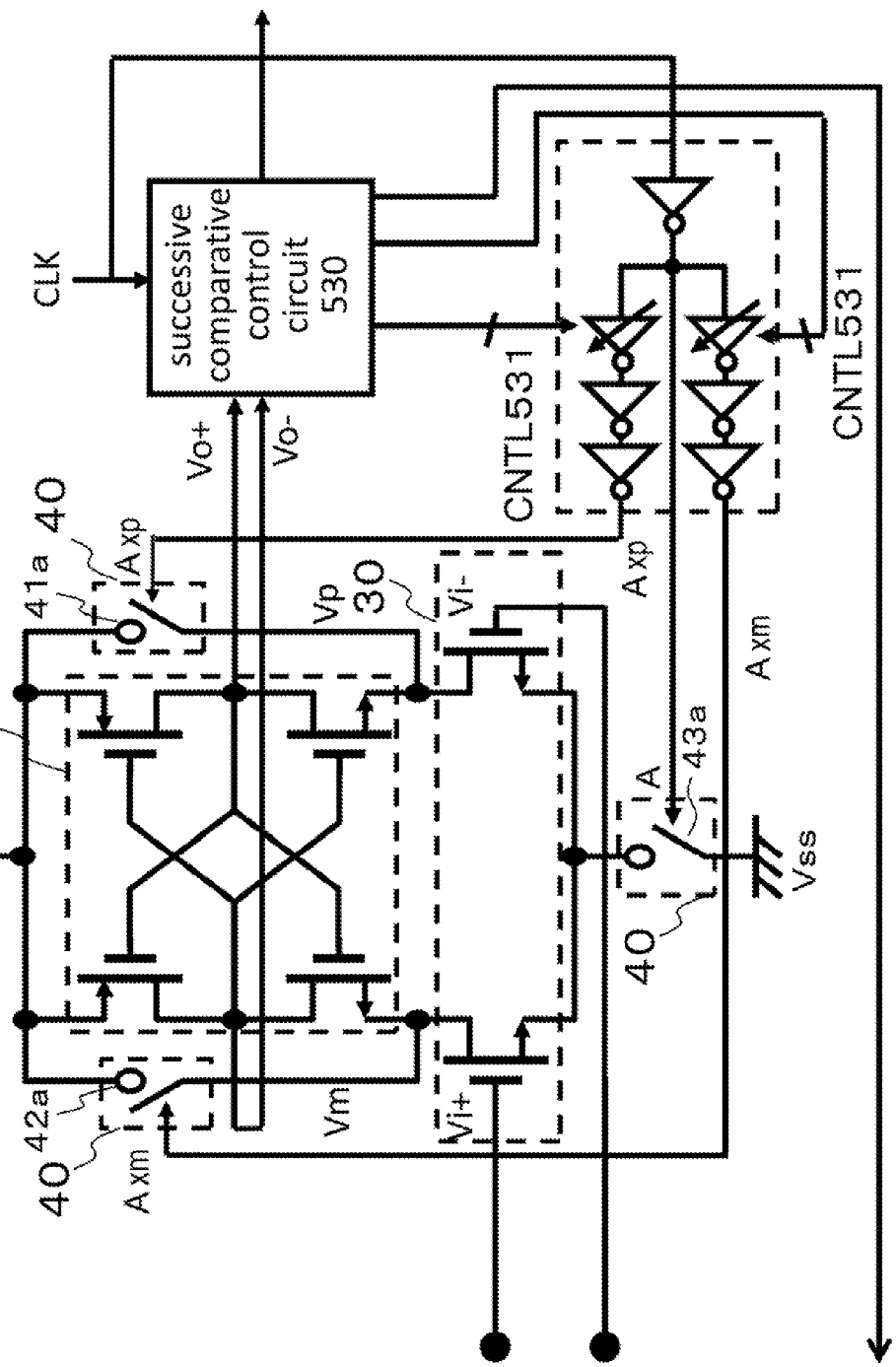
FIG. 20 is a diagram illustrating an ADC according to a tenth embodiment.

FIG. 20 is a diagram illustrating the ADC 900 according to the tenth embodiment. The ADC 900 includes a latch unit 20, an input unit 30, a comparative operation control circuit 40, a delay circuit 520, and a successive comparative operation control circuit 530. Accordingly, the ADC 900 differs from the ADC 500 in that the sample-hold circuit 540 is not included.

Thus, the ADC 900 includes no sample-hold circuit 540, whereby the area occupied with circuits can be reduced as compared to the ADC 500 according to the sixth embodiment.

Thus, the ADC 900 according to the tenth embodiment is a successive comparative type analog-to-digital conversion device including a comparator including an input unit (input unit 30) for receiving a complementary input signal to generate a inversion complementary signal having the inversion logic of the complementary input signal, and a latch unit (latch unit 20) for latching the inversion complementary signal; a comparative operation control circuit 40 including a first switch (switch 41*a*) for connecting or disconnecting the latch unit and the input unit to or from a high-potential power source according to the logic of a first signal (signal Axp or signal Axm), and a second switch (switch 42*a*) for connecting or disconnecting the latch unit and the input unit to or from the high-potential power source according to the logic of a second signal (signal Axp or signal Axm); a delay circuit 520 for outputting the first signal (signal Axp or signal Axm) and the second signal (signal Axp or signal Axm); and a successive operation control circuit for outputting a control signal for controlling the period of logic change of the first signal for controlling disconnection of the first switch (switch 41a), and the period of logic change of the second signal for controlling disconnection of the second switch (switch 42a) based on the logic of a signal latched by the latch unit.

Eleventh Embodiment

Figure 21:
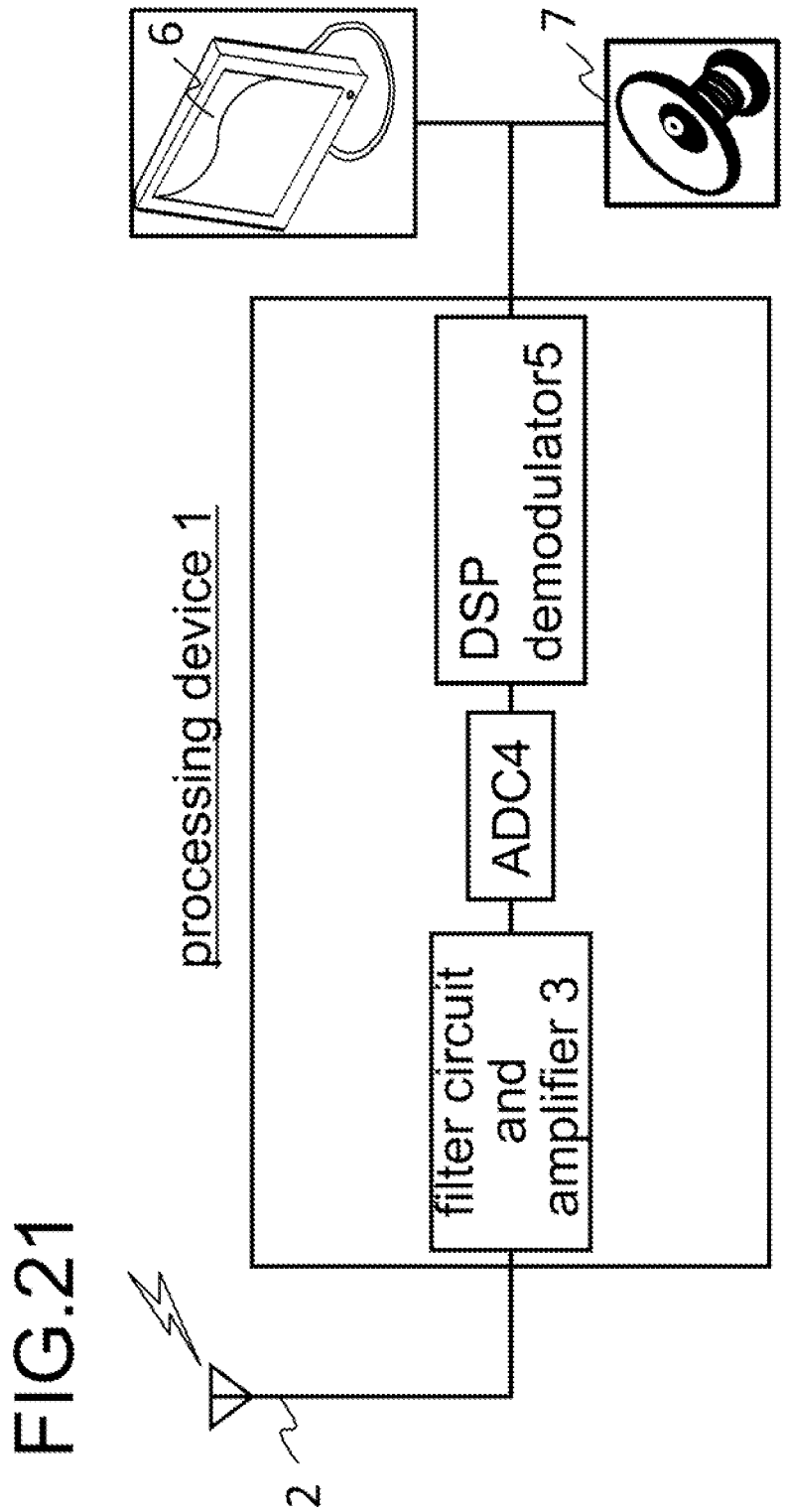
FIG. 21 is a diagram illustrating a reception device using the ADCs illustrated by the sixth through tenth embodiments.

FIG. 21 is a diagram illustrating a signal processing device 1 (receiver 1) using the ADC illustrated by the sixth embodiment through tenth embodiment. The signal processing device 1 is a device which includes an antenna 2, a filter circuit and amplifier 3, an ADC 4, and a DSP demodulator 5, and outputs a signal for propagating audio data or image data before modulation which is available at a display device 6, audio generating device 7, or the like.

The signal processing device 1 is a device for restoring the modulated signal received by the antenna 2 into the original signal. The filter circuit and amplifier 3 is a circuit for amplifying the modulated signal by attenuating noise thereof. The ADC circuit 4 is a circuit for converting the input modulated signal into a digital signal. Note that the ADC circuit 4 is the ADC circuit according to the sixth through tenth embodiments. The DSP demodulator 5 receives the signal digitized by the ADC circuit 4, restores the signal before modulation, and outputs this to the display device 6 or audio generating device 7. Here, the signal before modulation means a signal relating to image data for the display device 6, a signal relating to audio for the audio generating device 7, or the like.

Thus, with the ADC 4, when executing successive comparative operation to detect the difference between the potential of the signal Vi+ and the potential of the signal Vi− making up the input signal Vi, a comparative operation control circuit is used, whereby the number of elements making up the circuits can be reduced. Accordingly, with the whole receiver 1, the circuit area of the ADC 4 can be reduced, and accordingly, the circuit area of the whole receiver 1 can be reduced.

Thus, the signal processing device according to the eleventh embodiment is a receiver (receiver 1) including a filter circuit (filter circuit and amplifier 3) for attenuating noise from an analog reception signal; an amplifier (filter circuit and amplifier 3) for amplifying the analog reception signal of which the noise is attenuated; an analog-tot-digital circuit according to one of the sixth through tenth embodiments for converting the analog reception signal of which the noise is attenuated into a digital signal; a DSP demodulator (DSP demodulator 5) for restoring the signal before modulation from the reception signal of which the noise is attenuated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. An analog-to-digital conversion device comprising:
    a comparator including an input circuit for receiving a complementary input signal to generate an inversion complementary signal having the inversion logic of the complementary input signal, and a latch circuit for latching the inversion complementary signal;
    a comparative operation control circuit including a first switch for connecting or disconnecting the latch circuit and the input circuit to or from a high-potential power source according to the logic of a first signal, and a second switch for connecting or disconnecting the latch circuit and the input circuit to or from a high-potential power source according to the logic of a second signal;
    a delay circuit for outputting the first signal and the second signal;
    a successive operation control circuit for outputting a control signal for controlling the period of logic change of the first signal for controlling disconnection of the first switch, and the period of logic change of the second signal for controlling disconnection of the second switch, based on the logic of a signal latched by the latch circuit.

2. The analog-to-digital conversion device according to claim 1, further comprising:
    a circuit for sampling and holding one signal and the other signal of the complementary input signal.

3. The analog-to-digital conversion device according to claim 1, wherein the delay circuit comprises:
    a first circuit for outputting the first signal;
    a second circuit for outputting the second signal; wherein the first circuit and the second circuit include an inverter circuit; and
    wherein the inverter circuit includes a logic inversion circuit for inverting the logic of an input signal, and a circuit for adding load capacitance to an output signal line of the logic inversion circuit according to the binary numeral represented by the control signal.

4. The analog-to-digital conversion device according to claim 1, wherein the delay circuit comprises:
    a first circuit for outputting the first signal;
    a second circuit for outputting the second signal; wherein the first circuit and the second circuit include an inverter circuit; and
    wherein the inverter circuit includes a logic inversion circuit for inverting the logic of an input signal, and a circuit for making resistance between the logic inversion circuit and a ground power source line variable according to the binary numeral represented by the control signal.

5. An analog-to-digital conversion device comprising:
    a comparator including an input circuit for receiving a complementary input signal to generate an inversion complementary signal having the inversion logic of the complementary input signal, and a latch circuit for latching the inversion complementary signal;
    a comparative operation control circuit including a plurality of first switches for connecting or disconnecting the latch circuit and the input circuit to or from a high-potential power source according to the logic of each of a plurality of first signals, and a plurality of second switches for connecting or disconnecting the latch circuit and the input circuit to or from a high-potential power source according to the logic of each of a plurality of second signals;
    a delay circuit for outputting each of the first signals and each of the second signals;
    a successive operation control circuit for outputting a control signal for controlling the period of logic change of each of the first signals for controlling disconnection of each of the plurality of first switches, and the period of logic change of each of the second signals for controlling disconnection of each of the plurality of second switches, based on the logic of a signal latched by the latch circuit.

6. An analog-to-digital conversion device comprising:
a comparator including an input circuit for receiving a complementary input signal to generate an inversion complementary signal having the inversion logic of the complementary input signal, and a latch circuit for latching the inversion complementary signal;
a comparative operation control circuit including a first switch for connecting or disconnecting the latch circuit and the input circuit to or from a high-potential power source according to the logic of a first signal, and a second switch for connecting or disconnecting the latch circuit and the input circuit to or from a high-potential power source according to the logic of a second signal;
a delay circuit including a first inverter for outputting the first signal, and a second inverter for outputting the second signal;
a successive operation control circuit for outputting a control signal for controlling the period of logic change of the first signal for controlling disconnection of the first switch, and the period of logic change of the second signal for controlling disconnection of the second switch, based on the logic of a signal latched by the latch circuit.

7. The analog-to-digital conversion device according to claim 6, wherein the first inverter and the second inverter comprises:
a logic inversion circuit for inverting the logic of an input signal;
a circuit for adding load capacitance to an output signal line of the logic inversion circuit according to the binary numeral represented by the control signal.

8. The analog-to-digital conversion device according to claim 6, wherein the first inverter and the second inverter comprises:
a logic inversion circuit for inverting the logic of an input signal;
a circuit for making resistance between the logic inversion circuit and a ground power source line variable according to the binary numeral represented by the control signal.

9. An analog-to-digital conversion device comprising:
a comparator including an input circuit for receiving a complementary input signal to generate an inversion complementary signal having the inversion logic of the complementary input signal, and a latch circuit for latching the inversion complementary signal;
a comparative operation control circuit including a first switch for connecting or disconnecting the latch circuit and the input circuit to or from a high-potential power source according to the logic of a first signal, a second switch for connecting or disconnecting the latch circuit and the input circuit to or from a high-potential power source according to the logic of a second signal, and third and fourth switches for connecting or disconnecting the latch circuit and the input circuit to or from a high-potential power source according to the logic of a third signal;
a delay circuit for outputting the first signal, the second signal, and the third signal;
a successive operation control circuit for outputting a control signal for controlling the period of logic change of the first signal for controlling disconnection of the first switch, and the period of logic change of the second signal for controlling disconnection of the second switch, based on the logic of a signal latched by the latch circuit.

10. A signal processing device comprising:
a filter circuit for attenuating noise from an analog reception signal;
an amplifier for amplifying the analog reception signal of which the noise is attenuated;
a DSP demodulator for demodulating a signal before modulation from the reception signal of which the noise is attenuated;
an analog-to-digital circuit for converting the analog reception signal of which the noise is attenuated into a digital signal; wherein An analog-to-digital conversion device comprises:
a comparator including an input circuit for receiving a complementary input signal to generate an inversion complementary signal having the inversion logic of the complementary input signal, and a latch circuit for latching the inversion complementary signal;
a comparative operation control circuit including a first switch for connecting or disconnecting the latch circuit and the input circuit to or from a high-potential power source according to the logic of a first signal, and a second switch for connecting or disconnecting the latch circuit and the input circuit to or from a high-potential power source according to the logic of a second signal;
a delay circuit for outputting the first signal and the second signal;
a successive operation control circuit for outputting a control signal for controlling the period of logic change of the first signal for controlling disconnection of the first switch, and the period of logic change of the second signal for controlling disconnection of the second switch, based on the logic of a signal latched by the latch circuit.

\* \* \* \* \*